US011380629B2

(12) United States Patent
Zhang et al.

(10) Patent No.: US 11,380,629 B2
(45) Date of Patent: Jul. 5, 2022

(54) METHODS FOR FORMING THREE-DIMENSIONAL MEMORY DEVICES WITH SUPPORTING STRUCTURE FOR STAIRCASE REGION

(71) Applicant: YANGTZE MEMORY TECHNOLOGIES CO., LTD., Wuhan (CN)

(72) Inventors: Kun Zhang, Wuhan (CN); Linchun Wu, Wuhan (CN); Zhong Zhang, Wuhan (CN); Wenxi Zhou, Wuhan (CN); Zongliang Huo, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 17/085,406

(22) Filed: Oct. 30, 2020

(65) Prior Publication Data

US 2022/0037267 A1 Feb. 3, 2022

Related U.S. Application Data

(63) Continuation of application No. PCT/CN2020/106426, filed on Jul. 31, 2020.

(51) Int. Cl.
*H01L 25/065* (2006.01)
*H01L 23/00* (2006.01)
(Continued)

(52) U.S. Cl.
CPC ............ *H01L 23/562* (2013.01); *H01L 24/08* (2013.01); *H01L 24/80* (2013.01);
(Continued)

(58) Field of Classification Search
CPC ..... H01L 24/08; H01L 24/80; H01L 25/0657; H01L 25/18; H01L 25/50;
(Continued)

(56) References Cited

U.S. PATENT DOCUMENTS 10,014,316 B2 7/2018 Yu et al.
10,283,493 B1 5/2019 Nishida
(Continued)

FOREIGN PATENT DOCUMENTS

CN 110088905 A 8/2019
CN 110121779 A 8/2019
(Continued)

OTHER PUBLICATIONS

International Search Report issued in corresponding International Application No. PCT/CN2020/106425, dated Apr. 27, 2021, 5 pages.
(Continued)

*Primary Examiner* — Thanh Y. Tran
(74) *Attorney, Agent, or Firm* — Bayes PLLC

(57) ABSTRACT

Embodiments of 3D memory devices and methods for forming the same are disclosed. In an example, a method for forming a 3D memory device is disclosed. A peripheral circuit is formed on a first substrate. A first semiconductor layer is formed on a second substrate. A supporting structure and a second semiconductor layer coplanar with the supporting structure are formed on the first semiconductor layer. A memory stack is formed above the supporting structure and the second semiconductor layer. The memory stack has a staircase region overlapping the supporting structure. A channel structure extending vertically through the memory stack and the second semiconductor layer into the first semiconductor layer is formed. The first substrate and the second substrate are bonded in a face-to-face manner.

20 Claims, 26 Drawing Sheets

(51) Int. Cl.
*H01L 25/18* (2006.01)
*H01L 25/00* (2006.01)
*H01L 27/11556* (2017.01)
*H01L 27/11582* (2017.01)

(52) U.S. Cl.
CPC .......... *H01L 25/0657* (2013.01); *H01L 25/18* (2013.01); *H01L 25/50* (2013.01); *H01L 27/11556* (2013.01); *H01L 27/11582* (2013.01); *H01L 2224/08145* (2013.01); *H01L 2224/80895* (2013.01); *H01L 2224/80896* (2013.01); *H01L 2924/1431* (2013.01); *H01L 2924/14511* (2013.01)

(58) Field of Classification Search
CPC ......... H01L 27/11556; H01L 27/11582; H01L 2224/08145; H01L 2224/80895; H01L 2924/1431; H01L 27/11573; H01L 27/11575; H01L 27/1157; H01L 2224/80896
See application file for complete search history.

(56) References Cited

U.S. PATENT DOCUMENTS

| | | |
|---|---|---|
| 2016/0093637 A1 | 3/2016 | Lee et al. |
| 2018/0374866 A1 | 12/2018 | Makala et al. |
| 2020/0043944 A1 | 2/2020 | Fukuzumi et al. |
| 2020/0091064 A1 | 3/2020 | Iwasaki et al. |
| 2020/0219895 A1 | 7/2020 | Mushiga et al. |
| 2020/0235090 A1 | 7/2020 | Chowdhury et al. |
| 2021/0313281 A1* | 10/2021 | Kaminaga .......... H01L 27/11556 |
| 2021/0375828 A1* | 12/2021 | Zhang ..................... H01L 25/18 |
| 2021/0375900 A1* | 12/2021 | Zhang ............... H01L 27/11526 |
| 2021/0375912 A1* | 12/2021 | Zhang ............... H01L 27/11575 |
| 2021/0375915 A1* | 12/2021 | Zhang ............... H01L 27/11526 |

FOREIGN PATENT DOCUMENTS

| | | |
|---|---|---|
| CN | 110140213 A | 8/2019 |
| CN | 110785851 A | 2/2020 |
| CN | 111370416 A | 7/2020 |
| CN | 111370423 A | 7/2020 |
| TW | 202023029 A | 6/2020 |

OTHER PUBLICATIONS

International Search Report issued in corresponding International Application No. PCT/CN2020/106426, dated Apr. 27, 2021, 5 pages.

* cited by examiner

103

METHODS FOR FORMING THREE-DIMENSIONAL MEMORY DEVICES WITH SUPPORTING STRUCTURE FOR STAIRCASE REGION

CROSS-REFERENCE TO RELATED APPLICATIONS

This application is a continuation of International Application No. PCT/CN2020/106426, filed on Jul. 31, 2020, entitled "METHODS FOR FORMING THREE-DIMENSIONAL MEMORY DEVICES WITH SUPPORTING STRUCTURE FOR STAIRCASE REGION," which is hereby incorporated by reference in its entirety. This application is also related to U.S. application Ser. No. 17/085,305 filed on Oct. 30, 2020, entitled "THREE-DIMENSIONAL MEMORY DEVICES WITH SUPPORTING STRUCTURE FOR STAIRCASE REGION," which is hereby incorporated by reference in its entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices and methods for forming the same are disclosed herein.

In one example, a method for forming a 3D memory device is disclosed. A first semiconductor layer, a first block layer, and a sacrificial layer are sequentially formed on a substrate. A block plug extending vertically through the sacrificial layer and the first block layer is formed to divide the sacrificial layer into a supporting portion and a sacrificial portion. A dielectric stack is formed above the sacrificial layer and has a staircase region, such that the supporting portion of the sacrificial layer is below and overlaps the staircase region of the dielectric stack. A channel structure extending vertically through the dielectric stack, the sacrificial portion of the sacrificial layer, and the first block layer, into the first semiconductor layer is formed. An opening extending vertically through the dielectric stack is formed to expose part of the sacrificial portion of the sacrificial layer. The sacrificial portion of the sacrificial layer is replaced with a second semiconductor layer coplanar with the supporting portion of the sacrificial layer through the opening.

In another example, a method for forming a 3D memory device is disclosed. A first semiconductor layer, a first block layer, and a sacrificial layer are sequentially formed on a substrate. Part of the first block layer and the sacrificial layer is replaced with a supporting structure. A dielectric stack is formed above the supporting structure and a remainder of the sacrificial layer and has a staircase region, such that the supporting structure overlaps the staircase region of the dielectric stack. A channel structure extending vertically through the dielectric stack, the remainder of the sacrificial layer, and the first block layer, into the first semiconductor layer is formed. An opening extending vertically through the dielectric stack is formed to expose part of the remainder of the sacrificial layer. The remainder of the sacrificial layer is replaced with a second semiconductor layer coplanar with the supporting structure through the opening.

In still another example, a method for forming a 3D memory device is disclosed. A peripheral circuit is formed on a first substrate. A first semiconductor layer is formed on a second substrate. A supporting structure and a second semiconductor layer coplanar with the supporting structure are formed on the first semiconductor layer. A memory stack is formed above the supporting structure and the second semiconductor layer. The memory stack has a staircase region overlapping the supporting structure. A channel structure extending vertically through the memory stack and the second semiconductor layer into the first semiconductor layer is formed. The first substrate and the second substrate are bonded in a face-to-face manner.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
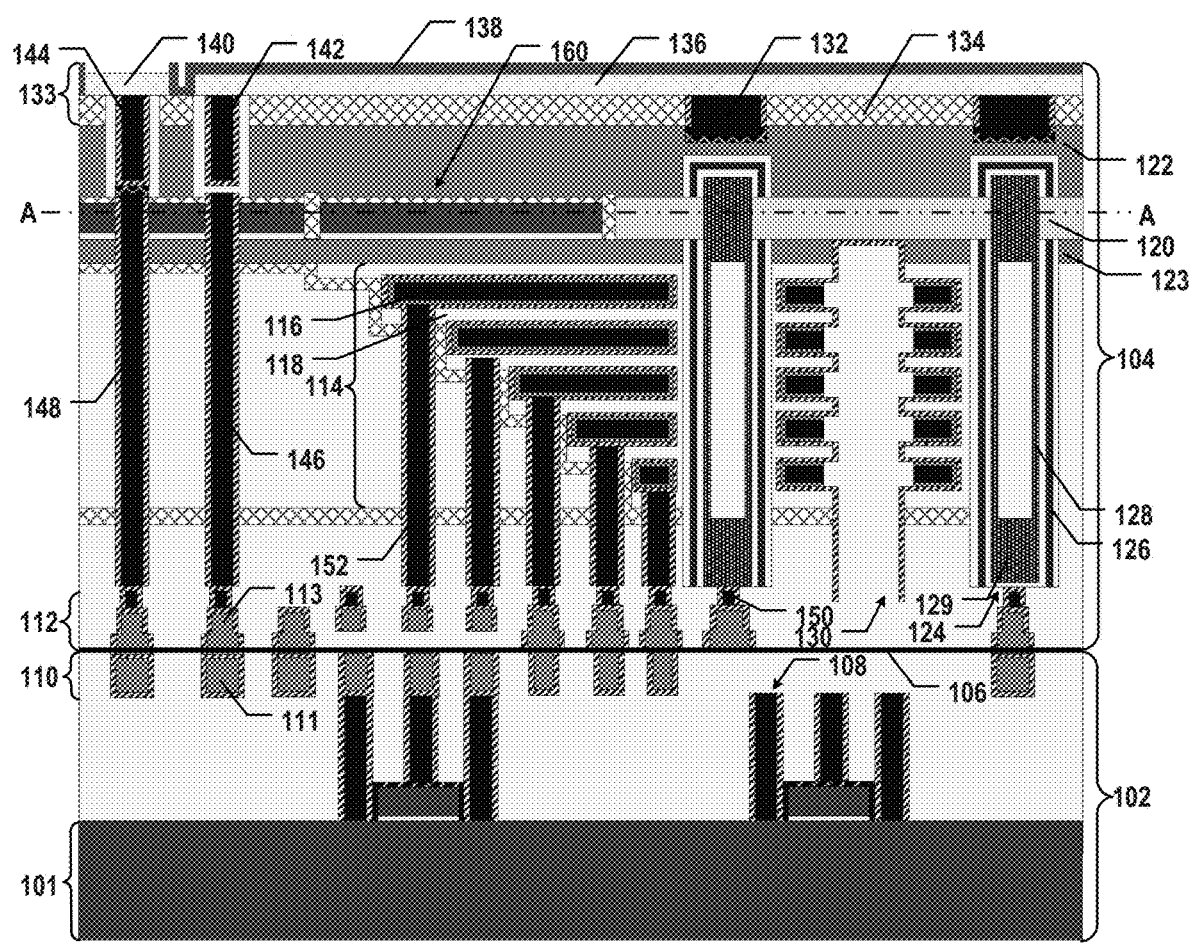
FIGS. 1A-1D illustrate side views of cross-sections of exemplary 3D memory devices with supporting structures for staircase regions, according to various embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or vertical interconnect access (via) contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D memory devices, such as 3D NAND memory devices, slit structures (e.g., gate line slits (GLSs)) are used for providing electrical connections to the source of the memory array, such as array common source (ACS), from the front side of the devices. The front side source contacts in slit structures, however, can affect the electrical performance of the 3D memory devices by introducing both leakage current and parasitic capacitance between the word lines and the source contacts, even with the presence of spacers in between. The formation of the spacers also complicates the fabrication process. Besides affecting the electrical performance, the slit structures usually include wall-shaped polysilicon and/or metal fillings, which can introduce local stress to cause wafer bow or warp, thereby reducing the production yield.

Moreover, in some 3D NAND memory devices, semiconductor plugs are selectively grown to surround the sidewalls of channel structures, e.g., known as sidewall selective epitaxial growth (SEG). Compared with another type of semiconductor plugs that are formed at the lower end of the channel structures, e.g., bottom SEG, the formation of sidewall SEG avoids the etching of the memory film and semiconductor channel at the bottom surface of channel holes (also known as "SONO" punch), thereby increasing the process window, in particular when fabricating 3D NAND memory devices with advanced technologies, such as having 96 or more levels with a multi-deck architecture.

Sidewall SEGs are usually formed by replacing a sacrificial layer between the substrate and stack structure with the sidewall SEGs, which involves multiple deposition and etching processes through the slit openings. However, in fabricating the sidewall SEGs, since the sacrificial layer is a continuous layer extending across both core array region and staircase region of the stack structure, once the sacrificial layer is removed through the slit openings from the core array region, parts of the dummy channel structures abutting the sacrificial layer in the staircase region become exposed in the resulting recess. When later removing parts of the memory films (e.g., having silicon oxide and silicon nitride) abutting the recess to expose the semiconductor channels, the dummy channel structures (also having dielectrics) may be cut off as well, thereby causing the collapse of the stack structure in the staircase region.

Various embodiments in accordance with the present disclosure provide 3D memory devices with supporting structures for staircase regions. By replacing part of the sacrificial layer with a supporting structure overlapping the staircase region, when removing the sacrificial layer to form the sidewall SEGs, the supporting structure and the dummy channel structures in the staircase region can be sustained to support the stack structure (e.g., dielectric stack), thereby avoiding the collapse and increasing the yield. The supporting structures can have various designs as long as at least part of the supporting structure in contact with the sacrificial layer includes a material other than the material of the sacrificial layer to stop the etching into the staircase region when removing the sacrificial layer.

FIG. 1A illustrates a side view of a cross-section of an exemplary 3D memory device 100 with a supporting structure for staircase region, according to some embodiments of the present disclosure. In some embodiments, 3D memory device 100 is a bonded chip including a first semiconductor structure 102 and a second semiconductor structure 104 stacked over first semiconductor structure 102. First and second semiconductor structures 102 and 104 are jointed at a bonding interface 106 therebetween, according to some embodiments. As shown in FIG. 1A, first semiconductor structure 102 can include a substrate 101, which can include silicon (e.g., single crystalline silicon, c-Si), silicon germanium (SiGe), gallium arsenide (GaAs), germanium (Ge), silicon on insulator (SOI), or any other suitable materials.

First semiconductor structure 102 of 3D memory device 100 can include peripheral circuits 108 on substrate 101. It is noted that x-, y-, and z-axes are included in FIG. 1A to illustrate the spatial relationships of the components in 3D memory device 100. Substrate 101 includes two lateral surfaces extending laterally in the x-y plane: a front surface on the front side of the wafer, and a back surface on the backside opposite to the front side of the wafer. The x- and y-directions are two orthogonal directions in the wafer plane: x-direction is the word line direction, and the y-direction is the bit line direction. The z-axis is perpendicular to both the x- and y-axes. As used herein, whether one component (e.g., a layer or a device) is "on," "above," or "below" another component (e.g., a layer or a device) of a semiconductor device (e.g., 3D memory device 100) is determined relative to the substrate of the semiconductor device (e.g., substrate 101) in the z-direction (the vertical direction perpendicular to the x-y plane) when the substrate is positioned in the lowest plane of the semiconductor device in the z-direction. The same notion for describing spatial relationships is applied throughout the present disclosure.

In some embodiments, peripheral circuit 108 is configured to control and sense the 3D memory device 100. Peripheral circuit 108 can be any suitable digital, analog, and/or mixed-signal control and sensing circuits used for facilitating the operation of 3D memory device 100 including, but not limited to, a page buffer, a decoder (e.g., a row decoder and a column decoder), a sense amplifier, a driver (e.g., a word line driver), a charge pump, a current or voltage reference, or any active or passive components of the circuit (e.g., transistors, diodes, resistors, or capacitors). Peripheral circuits 108 can include transistors formed "on" substrate 101, in which the entirety or part of the transistors are formed in substrate 101 (e.g., below the top surface of substrate 101) and/or directly on substrate 101. Isolation regions (e.g., shallow trench isolations (STIs)) and doped regions (e.g., source regions and drain regions of the transistors) can be formed in substrate 101 as well. The transistors are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, 2 nm, etc.), according to some embodiments. It is understood that in some embodiments, peripheral circuit 108 may further include any other circuits compatible with the advanced logic processes including logic circuits, such as processors and programmable logic devices (PLDs), or memory circuits, such as static random-access memory (SRAM).

In some embodiments, first semiconductor structure 102 of 3D memory device 100 further includes an interconnect layer (not shown) above peripheral circuits 108 to transfer electrical signals to and from peripheral circuits 108. The interconnect layer can include a plurality of interconnects (also referred to herein as "contacts"), including lateral interconnect lines and vertical interconnect access (VIA) contacts. As used herein, the term "interconnects" can broadly include any suitable types of interconnects, such as middle-end-of-line (MEOL) interconnects and back-end-of-line (BEOL) interconnects. The interconnect layer can further include one or more interlayer dielectric (ILD) layers (also known as "intermetal dielectric (IMD) layers") in which the interconnect lines and VIA contacts can form. That is, the interconnect layer can include interconnect lines and VIA contacts in multiple ILD layers. The interconnect lines and VIA contacts in the interconnect layer can include conductive materials including, but not limited to, tungsten (W), cobalt (Co), copper (Cu), aluminum (Al), silicides, or any combination thereof. The ILD layers in the interconnect layer can include dielectric materials including, but not limited to, silicon oxide, silicon nitride, silicon oxynitride, low dielectric constant (low-k) dielectrics, or any combination thereof.

As shown in FIG. 1A, first semiconductor structure 102 of 3D memory device 100 can further include a bonding layer 110 at bonding interface 106 and above the interconnect layer and peripheral circuits 108. Bonding layer 110 can include a plurality of bonding contacts 111 and surrounding dielectrics electrically isolating bonding contacts 111. Bonding contacts 111 can include conductive materials including, but not limited to, W, Co, Cu, Al, silicides, or any combination thereof. The remaining area of bonding layer 110 (e.g., the surrounding dielectrics) can be formed with dielectrics including, but not limited to, silicon oxide, silicon nitride, silicon oxynitride, low dielectric constant (low-k) dielectrics, or any combination thereof. Bonding contacts 111 and the surrounding dielectrics in bonding layer 110 can be used for hybrid bonding.

Similarly, as shown in FIG. 1A, second semiconductor structure 104 of 3D memory device 100 can also include a bonding layer 112 at bonding interface 106 and above bonding layer 110 of first semiconductor structure 102. Bonding layer 112 can include a plurality of bonding contacts 113 and surrounding dielectrics electrically isolating bonding contacts 113. Bonding contacts 113 can include conductive materials including, but not limited to, W, Co, Cu, Al, silicides, or any combination thereof. The remaining area of bonding layer 112 (e.g., the surrounding dielectrics) can be formed with dielectrics including, but not limited to, silicon oxide, silicon nitride, silicon oxynitride, low-k dielectrics, or any combination thereof. Bonding contacts 113 and the surrounding dielectrics in bonding layer 112 can be used for hybrid bonding. Bonding contacts 113 are in contact with bonding contacts 111 at bonding interface 106, according to some embodiments.

As described below in detail, second semiconductor structure 104 can be bonded on top of first semiconductor structure 102 in a face-to-face manner at bonding interface 106. In some embodiments, bonding interface 106 is disposed between bonding layers 110 and 112 as a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some embodiments, bonding interface 106 is the place at which bonding layers 112 and 110 are met and bonded. In practice, bonding interface 106 can be a layer with a certain thickness that includes the top surface of bonding layer 110 of first semiconductor structure 102 and the bottom surface of bonding layer 112 of second semiconductor structure 104.

In some embodiments, second semiconductor structure 104 of 3D memory device 100 further includes an interconnect layer (not shown) above bonding layer 112 to transfer electrical signals. The interconnect layer can include a plurality of interconnects, such as MEOL interconnects and BEOL interconnects. The interconnect layer can further include one or more ILD layers in which the interconnect lines and VIA contacts can form. The interconnect lines and VIA contacts in the interconnect layer can include conductive materials including, but not limited to W, Co, Cu, Al, silicides, or any combination thereof. The ILD layers in the interconnect layer can include dielectric materials including, but not limited to, silicon oxide, silicon nitride, silicon oxynitride, low-k dielectrics, or any combination thereof.

In some embodiments, 3D memory device 100 is a NAND Flash memory device in which memory cells are provided in the form of an array of NAND memory strings. As shown in FIG. 1A, second semiconductor structure 104 of 3D memory device 100 can include an array of channel structures 124 functioning as the array of NAND memory strings. As shown in FIG. 1A, each channel structure 124 can extend vertically through a plurality of pairs each including a conductive layer 116 and a dielectric layer 118. The interleaved conductive layers 116 and dielectric layers 118 are part of a memory stack 114. The number of the pairs of conductive layers 116 and dielectric layers 118 in memory stack 114 (e.g., 32, 64, 96, 128, 160, 192, 224, 256, or more) determines the number of memory cells in 3D memory device 100. It is understood that in some embodiments, memory stack 114 may have a multi-deck architecture (not shown), which includes a plurality of memory decks stacked over one another. The numbers of the pairs of conductive layers 116 and dielectric layers 118 in each memory deck can be the same or different.

Memory stack 114 can include a plurality of interleaved conductive layers 116 and dielectric layers 118. Conductive layers 116 and dielectric layers 118 in memory stack 114 can alternate in the vertical direction. In other words, except the ones at the top or bottom of memory stack 114, each conductive layer 116 can be adjoined by two dielectric layers 118 on both sides, and each dielectric layer 118 can be adjoined by two conductive layers 116 on both sides. Conductive layers 116 can include conductive materials including, but not limited to, W, Co, Cu, Al, polysilicon, doped silicon, silicides, or any combination thereof. Each conductive layer 116 can include a gate electrode (gate line) surrounded by an adhesive layer and a gate dielectric layer. The gate electrode of conductive layer 116 can extend laterally as a word line, ending at one or more staircase structures of memory stack 114. Dielectric layers 118 can include dielectric materials including, but not limited to, silicon oxide, silicon nitride, silicon oxynitride, or any combination thereof.

Figure 2A:
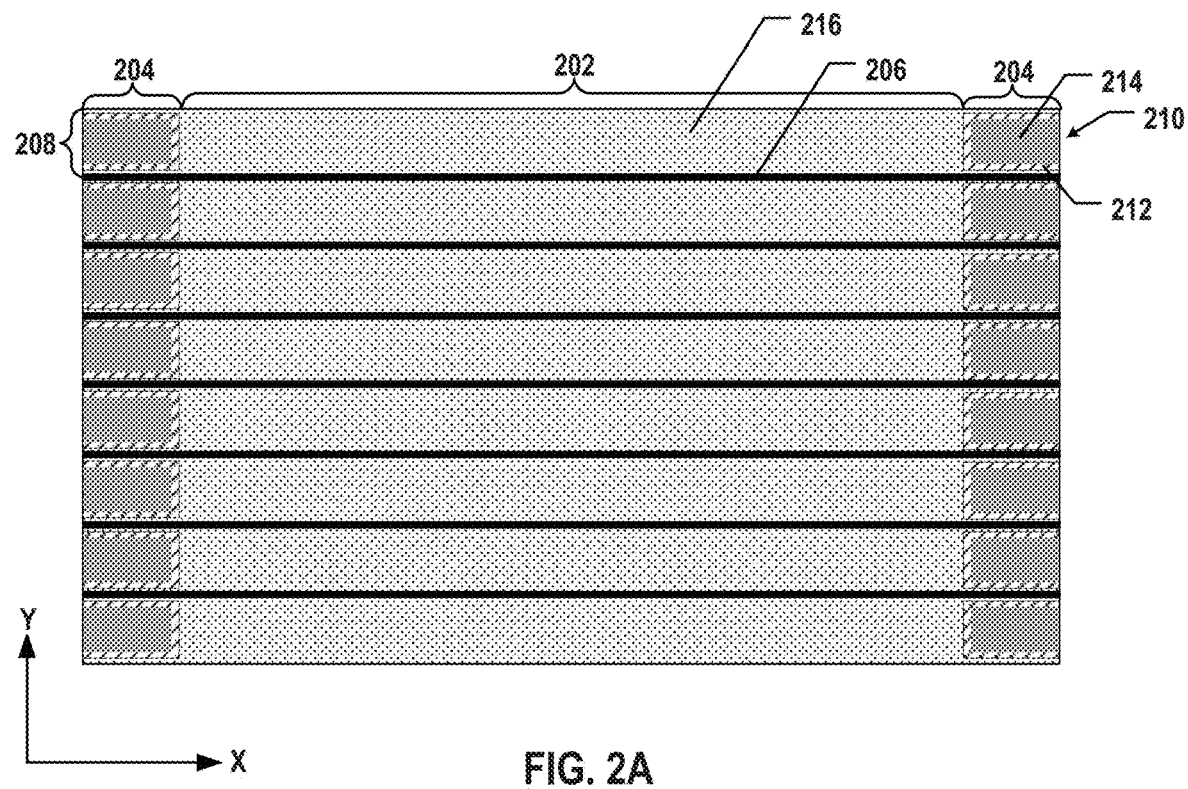
FIG. 2A illustrates a plan view of a cross-section of an exemplary 3D memory device with a supporting structure for side staircase region, according to some embodiments of the present disclosure.
Figure 2B:
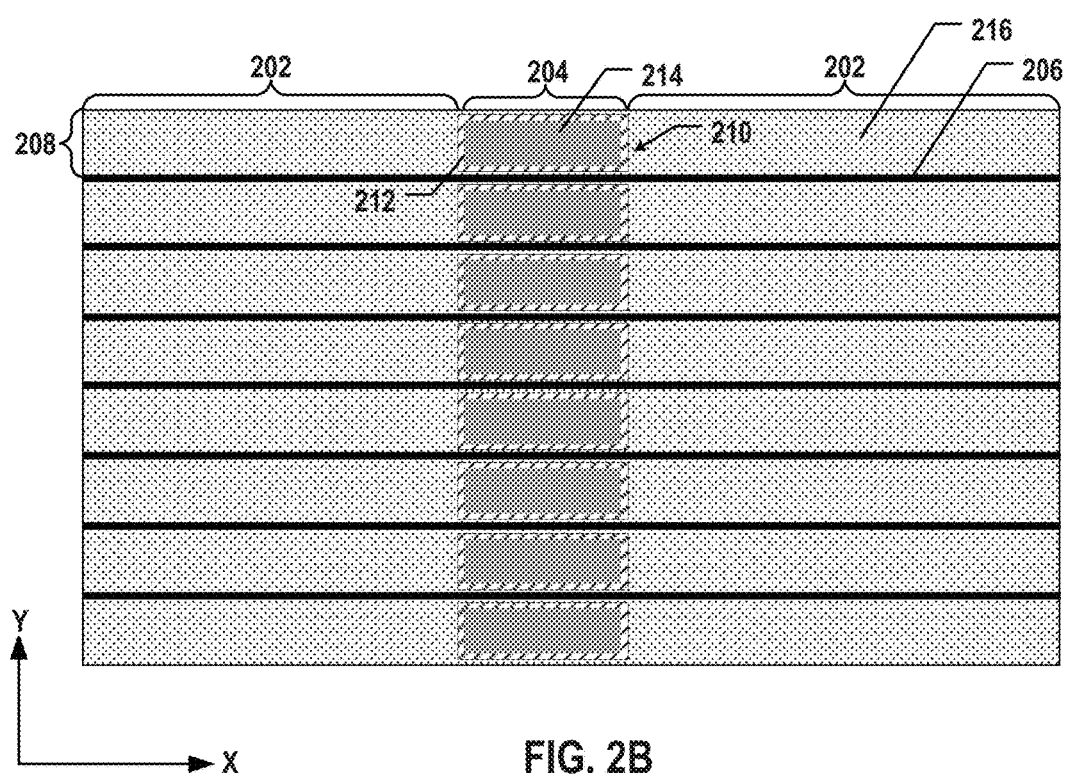
FIG. 2B illustrates a plan view of a cross-section of an exemplary 3D memory device with a supporting structure for center staircase region, according to some embodiments of the present disclosure.

In some embodiments, memory stack 114 includes a core array region and a staircase region in the plan view. As shown in FIGS. 2A and 2B, a memory stack (e.g., memory stack 114 in FIG. 1A) can include a core array region 202 and a staircase region 204 in the plan view. FIG. 2A may illustrate an example of a plan view of the cross-section in the AA plane of 3D memory device 100 in FIG. 1A, according to some embodiments. In FIG. 2A, core array region 202, i.e., center core array region, is in the center of the memory stack, and two staircase regions 204, i.e., side staircase regions, are at the edges of the memory stack in the x-direction (e.g., the word line direction), according to some embodiments. FIG. 2B may illustrate another example of a plan view of the cross-section in the AA plane of 3D memory device 100 in FIG. 1A, according to some embodiments. In FIG. 2B, staircase region 204, i.e., center staircase region, is in the center of the memory stack, and two core array regions 202, i.e., side core array regions, are at the edges of the memory stack in the x-direction (e.g., the word line direction), according to some embodiments. Channel structures, as described below in detail, can be formed in core array region 202 of the memory stack, while dummy channel structures, formed for mechanical support and load balance, can be formed in staircase region 204 of the memory stack. In the y-direction (e.g., the bit line direction), parallel insulating structures 206 (corresponding to insulating structures 130 in FIG. 1A) each extends laterally in the x-direction to separate core array region 202 and staircase region 204 into multiple blocks 208, according to some embodiments.

Referring back to FIG. 1A, second semiconductor structure 104 of 3D memory device 100 can also include a first semiconductor layer 120 and a supporting structure 160 above memory stack 114. First semiconductor layer 120 and supporting structure 160 are coplanar, i.e., in the same plane above memory stack 114, according to some embodiments. For example, compared with some known 3D memory devices, part of first semiconductor layer 120 may be replaced with supporting structure 160 for the staircase region of memory stack 114. In some embodiments, first semiconductor layer 120 overlaps the core array region of memory stack 114, and supporting structure 160 overlaps the staircase region of memory stack 114. That is, supporting structure 160 can cover at least part of the staircase region of memory stack 114 to provide support for the staircase region, and first semiconductor layer 120 can occupy the remaining area in the same plane. In some embodiments, first semiconductor layer 120 covers at least part of the core array region of the memory stack 114 in which channel structures 124 are formed. As shown in FIGS. 2A and 2B, supporting structure 210 (corresponding to supporting structure 160 in FIG. 1A) is aligned with staircase region 204 in the x-direction (e.g., the word line direction), and semiconductor layer 216 (corresponding to first semiconductor layer 120 in FIG. 1A) is aligned with core array region 202 in the x-direction.

Referring back to FIG. 1A, first semiconductor layer 120 includes a doped semiconductor material, such as N-typed doped silicon, according to some embodiments. First semiconductor layer 120 can be an N-type doped semiconductor layer, e.g., a silicon layer doped with N-type dopant(s), such as phosphorus (P) or arsenic (As). In some embodiments, first semiconductor layer 120 includes polysilicon, for example, N-type doped polysilicon, according to some embodiments. In some embodiments, first semiconductor layer 120 includes an N-well. That is, first semiconductor layer 120 can be a region in a P-type substrate that is doped with N-type dopant(s), such as P or As.

In some embodiments, part of supporting structure 160 in contact with first semiconductor layer 120 includes a material other than the material of first semiconductor layer 120. For example, the part of supporting structure 160 may include silicon oxide, different from polysilicon in first semiconductor layer 120. As shown in FIGS. 2A and 2B, in some embodiments, supporting structure 210 (corresponding to supporting structure 160 in FIG. 1A) includes a ring structure 212 in contact with semiconductor layer 216 (corresponding to first semiconductor layer 120 in FIG. 1A) and a core structure 214 surrounded by ring structure 212 in the plan view. Ring structure 212 and semiconductor layer 216 can have different materials, such as silicon oxide and polysilicon, respectively. It is understood that in some examples, such as FIG. 2A, ring structure 212 may not fully surround core structure 214 as one side of supporting structure 210 is at one edge of the memory stack in the x-direction (e.g., the word line direction) without contacting semiconductor layer 216.

Figure 3:
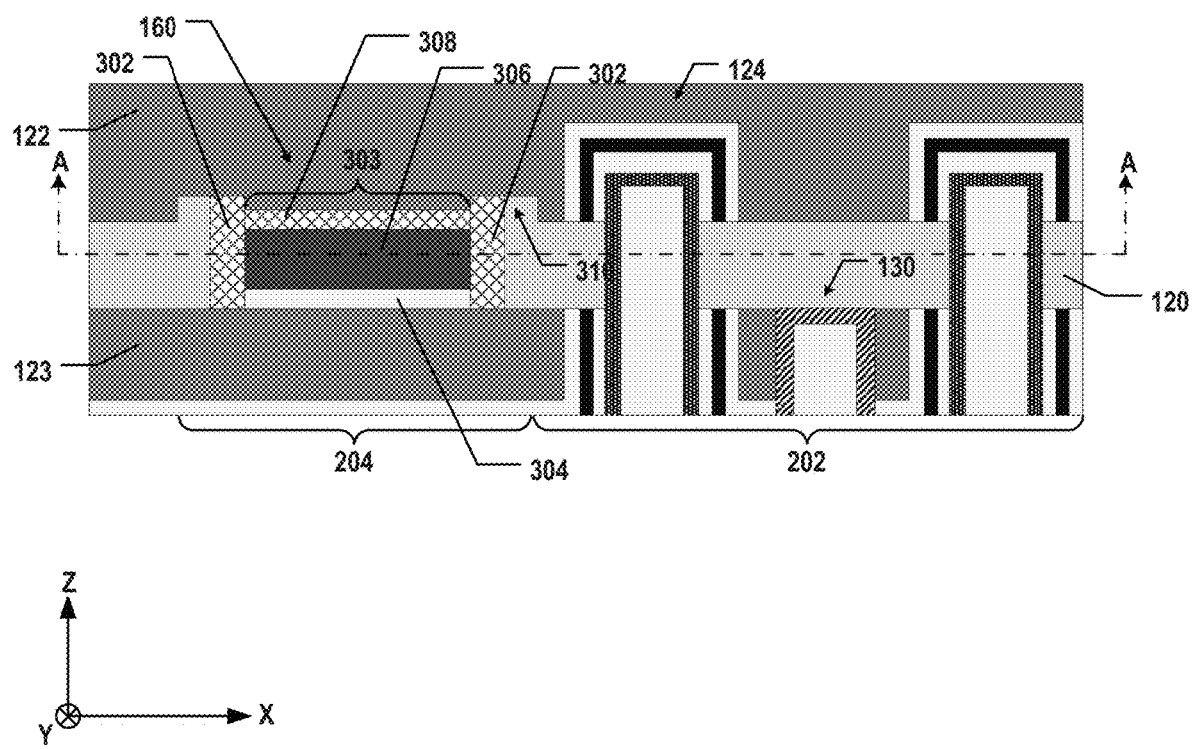
FIG. 3 illustrates an enlarged view of an exemplary supporting structure for staircase region in FIGS. 1A-1D, according to various embodiments of the present disclosure.

The remainder of supporting structure 160 can include a polysilicon layer or a silicon nitride layer. In some embodiments, the remainder of supporting structure 160 further includes a silicon oxide layer vertically between the polysilicon or silicon nitride layer and a second semiconductor layer 122. FIG. 3 illustrates an enlarged view of exemplary supporting structure 160 for staircase region in FIG. 1A, according to various embodiments of the present disclosure. As shown in FIG. 3, in some embodiments, supporting structure 160 includes a ring structure 302 (corresponding to ring structure 212 in FIGS. 2A and 2B) and a core structure 303 (e.g., the remainder of supporting structure 160, corresponding to core structure 214 in FIGS. 2A and 2B) surrounded by ring structure 302 in the x-direction (e.g., the word line direction). As described above with respect to FIG. 2A, it is understood that in some examples, ring structure 302 may not fully surround core structure 303 as one side of supporting structure 160 may be at the edge of the memory stack without contacting first semiconductor layer 120 in the x-direction.

In some embodiments, ring structure 302 of supporting structure 160 includes silicon oxide, or any other materials other than polysilicon. In some embodiments, core structure 303 of supporting structure 160 includes a plurality of layers stacked in the vertical direction, including a middle layer 306. Middle layer 306 can be a polysilicon layer or a silicon nitride layer. As described below in detail, middle layer 306 can be part of the sacrificial layer that is replaced by first semiconductor layer 120 and thus, have the same material as the sacrificial layer, such as polysilicon, silicon nitride, carbon, or any other suitable materials. In some embodiments, to protect middle layer 306 when replacing the sacrificial layer with first semiconductor layer 120, ring structure 302 and middle layer 306 of core structure 303 (i.e., part of the sacrificial layer) have different materials, such as silicon oxide and polysilicon or silicon nitride, respectively. In some embodiments, core structure 303 of supporting structure 160 also includes a top layer 308 vertically between middle layer 306 and second semiconductor layer 122. Top layer 308 can include the same material as ring structure 302, such as silicon oxide. It is understood that in some examples, top layer 308 can include any suitable materials other than the material of middle layer 306. Ring structure 302 can extend vertically to be connected to top layer 308 of core structure 303 to avoid the exposure of middle layer 306 contacting first semiconductor layer 120. In some embodiments, as shown in FIG. 3, ring structure 302 extends vertically further into a dent 310 in second semiconductor layer 122 to ensure a full connection with top layer 308 of core structure 303 to completely separate middle layer 306 of core structure 303 and first semiconductor layer 120. Thus, the depth of ring structure 302 (i.e., part of supporting structure 160 in contact with first semiconductor layer 120) is greater than the depth of core structure 303 (i.e., the remainder of supporting structure 160) in the z-direction, according to some embodiments.

In some embodiments, core structure 303 of supporting structure 160 further includes a bottom layer 304 vertically between middle layer 306 and a third semiconductor layer 123. As described below in detail, bottom layer 304 can be part of the etch stop layer vertically between third semiconductor layer 123 and the sacrificial layer during the fabrication processes and thus, have a different material from the sacrificial layer, such as silicon oxide, silicon oxynitride, or any other suitable materials. As shown in FIG. 3, middle layer 306 of supporting structure 160 is enclosed by ring structure 302 and top and bottom layers 306 and 304 of supporting structure 160, according to some embodiments. It is understood that in some examples, core structure 303 of supporting structure 160 may not include bottom layer 304 as no etch stop layer is used above the sacrificial layer during the fabrication processes.

Referring back to FIG. 1A, second semiconductor structure 104 of 3D memory device 100 can also include second semiconductor layer 122 above and in contact with first semiconductor layer 120 and supporting structure 160. In some embodiments, second semiconductor structure 104 of 3D memory device 100 can further include third semiconductor layer 123 below and in contact with first semiconductor layer 120 and supporting structure 160. Third semiconductor layer 123 can be disposed vertically between memory stack 114 and first semiconductor layer 120 and supporting structure 160 (e.g., between memory stack 114 and the same plane that contains first semiconductor layer 120 and supporting structure 160). First semiconductor layer 120 is vertically between second and third semiconductor layers 122 and 123, according to some embodiments. In some embodiments, each of second and third semiconductor layers 122 and 123 is an N-type doped semiconductor layer, e.g., a silicon layer doped with N-type dopant(s), such as P or As. In those cases, first, second, and third semiconductor layers 120, 122, and 123 may be viewed collectively as an N-type doped semiconductor layer above memory stack 114. Different from first semiconductor layer 120, each of second and third semiconductor layers 122 and 123 can overlap both the core array region and the staircase region of memory stack 114 as supporting structure 160 does not extend vertically into second and third semiconductor layers 122 and 123. It is understood that in some examples, third semiconductor layer 123 may be omitted in second semiconductor structure 104 of 3D memory device 100. That is, 3D memory device 100 can include a three-semiconductor layer structure, as shown in FIG. 1A (e.g., including first, second, and third semiconductor layers 120, 122, and 123) or a two-semiconductor layer structure (not shown, e.g., including first and second semiconductor layers 120 and 122).

In some embodiments, each channel structure 124 includes a channel hole filled with a semiconductor layer (e.g., as a semiconductor channel 128) and a composite dielectric layer (e.g., as a memory film 126). In some embodiments, semiconductor channel 128 includes silicon, such as amorphous silicon, polysilicon, or single crystalline silicon. In some embodiments, memory film 126 is a composite layer including a tunneling layer, a storage layer (also known as a "charge trap layer"), and a blocking layer. The remaining space of channel structure 124 can be partially or fully filled with a capping layer including dielectric materials, such as silicon oxide, and/or an air gap. Channel structure 124 can have a cylinder shape (e.g., a pillar shape). The capping layer, semiconductor channel 128, the tunneling layer, storage layer, and blocking layer of memory film 126 are arranged radially from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high-k dielectrics, or any combination thereof. In one example, memory film 126 can include a composite layer of silicon oxide/silicon oxynitride/silicon oxide (ONO).

In some embodiments, channel structure 124 further includes a channel plug 129 in the bottom portion (e.g., at the lower end) of channel structure 124. As used herein, the "upper end" of a component (e.g., channel structure 124) is the end farther away from substrate 101 in the z-direction, and the "lower end" of the component (e.g., channel structure 124) is the end closer to substrate 101 in the z-direction when substrate 101 is positioned in the lowest plane of 3D memory device 100. Channel plug 129 can include semiconductor materials (e.g., polysilicon). In some embodiments, channel plug 129 functions as the drain of the NAND memory string.

As shown in FIG. 1A, each channel structure 124 can extend vertically through interleaved conductive layers 116 and dielectric layers 118 of the core array region of memory stack 114 and first semiconductor layer 120 and third semiconductor layer 123. In some embodiments, first semiconductor layer 120 surrounds part of channel structure 124 and is in contact with semiconductor channel 128 including polysilicon. That is, memory film 126 is disconnected at part of channel structure 124 that abuts first semiconductor layer 120, exposing semiconductor channel 128 to be in contact with the surrounding first semiconductor layer 120, according to some embodiments. As a result, first semiconductor layer 120 surrounding and in contact with semiconductor channel 128 can work as a "sidewall SEG" of channel structure 124 to replace the "bottom SEG" as described above, which can mitigate issues such as overlay control, epitaxial layer formation, and SONO punch.

In some embodiments, each channel structure 124 can extend vertically further into second semiconductor layer 122. That is, each channel structure 124 extends vertically through the core array region of memory stack 114 into the N-type doped semiconductor layer (including first, second, and third semiconductor layers 120, 122, and 123), according to some embodiments. As shown in FIG. 1A, the top portion (e.g., the upper end) of channel structures 124 is in second semiconductor layer 122, according to some embodiments. In some embodiments, each of first, second, and third semiconductor layers 120, 122, and 123 is an N-type doped semiconductor layer, e.g., an N-well, to enable gate-induce-drain-leakage (GIDL)-assisted body biasing for erase operations. The GIDL around the source select gate of the NAND memory string can generate hole current into the NAND memory string to raise the body potential for erase operations.

As shown in FIG. 1A, second semiconductor structure 104 of 3D memory device 100 can further include insulating structures 130 each extending vertically through interleaved conductive layers 116 and dielectric layers 118 of memory stack 114. Different from channel structure 124 that extends further through first semiconductor layer 120, insulating structures 130 stops at first semiconductor layer 120. That is, the top surface of insulating structure 130 can be flush with the bottom surface of first semiconductor layer 120. It is understood that in some examples, insulating structure 130 may stop at third semiconductor layer 123 or second semiconductor layer 122. Each insulating structure 130 can also extend laterally to separate channel structures 124 into a plurality of blocks (e.g., as shown in FIGS. 2A and 2B). That is, memory stack 114 can be divided into a plurality of memory blocks by insulating structures 130, such that the array of channel structures 124 can be separated into each memory block. In some embodiments, each insulating structure 130 includes an opening (e.g., a slit) filled with one or more dielectric materials, including, but not limited to, silicon oxide, silicon nitride, silicon oxynitride, or any combination thereof. In one example, each insulating structure 130 may be filled with silicon oxide.

In some embodiments, 3D memory device 100 includes a backside source contact 132 above memory stack 114 and in contact with second semiconductor layer 122, as shown in FIG. 1A. Source contact 132 and memory stack 114 (and insulating structure 130 therethrough) can be disposed on opposites sides of second semiconductor layer 122 (a thinned substrate) and thus, viewed as a "backside" source contact. In some embodiments, source contact 132 extends further into second semiconductor layer 122 and is electrically connected to first semiconductor layer 120 and semiconductor channel 128 of channel structure 124 through second semiconductor layer 122. It is understood that the depth that source contact 132 extends into second semiconductor layer 122 may vary in different examples. In some embodiments in which second semiconductor layer 122 includes an N-well, source contact 132 is also referred to herein as an "N-well pick up." In some embodiments, source contacts 132 include a VIA contact. In some embodiments, source contacts 132 include a wall-shaped contact extending laterally. Source contact 132 can include one or more conductive layers, such as a metal layer (e.g., W, Co, Cu, or Al) or a silicide layer surrounded by an adhesive layer (e.g., titanium nitride (TiN)).

As shown in FIG. 1A, 3D memory device 100 can further include a BEOL interconnect layer 133 above and in contact with source contact 132 for pad-out, e.g., transferring electrical signals between 3D memory device 100 and external circuits. In some embodiments, interconnect layer 133 includes one or more ILD layers 134 on second semiconductor layer 122 and a redistribution layer 136 on ILD layers 134. The upper end of source contact 132 is flush with the top surface of ILD layers 134 and the bottom surface of redistribution layer 136, and source contact 132 extends vertically through ILD layers 134 into second semiconductor layer 122, according to some embodiments. ILD layers 134 in interconnect layer 133 can include dielectric materials including, but not limited to, silicon oxide, silicon nitride, silicon oxynitride, low-k dielectrics, or any combination thereof. Redistribution layer 136 in interconnect layer 133 can include conductive materials including, but not limited to W, Co, Cu, Al, silicides, or any combination thereof. In one example, redistribution layer 136 includes Al. In some embodiments, interconnect layer 133 further includes a passivation layer 138 as the outmost layer for passivation and protection of 3D memory device 100. Part of redistribution layer 136 can be exposed from passivation layer 138 as contact pads 140. That is, interconnect layer 133 of 3D memory device 100 can also include contact pads 140 for wire bonding and/or bonding with an interposer.

In some embodiments, second semiconductor structure 104 of 3D memory device 100 further includes contacts 142 and 144 through second semiconductor layer 122. As second semiconductor layer 122 can be a thinned substrate, for example, an N-well of a P-type silicon substrate, contacts 142 and 144 are through silicon contacts (TSCs), according to some embodiments. In some embodiments, contact 142 extends through second semiconductor layer 122 and ILD layers 134 to be in contact with redistribution layer 136, such that first semiconductor layer 120 is electrically connected to contact 142 through second semiconductor layer 122, source contact 132, and redistribution layer 136 of interconnect layer 133. In some embodiments, contact 144 extends through second semiconductor layer 122 and ILD layers 134 to be in contact with contact pad 140. Contacts 142 and 144 each can include one or more conductive layers, such as a metal layer (e.g., W, Co, Cu, or Al) or a silicide layer surrounded by an adhesive layer (e.g., TiN). In some embodiments, at least contact 144 further includes a spacer (e.g., a dielectric layer) to electrically insulate contact 144 from second semiconductor layer 122.

In some embodiments, 3D memory device 100 further includes peripheral contacts 146 and 148 each extending vertically to second semiconductor layer 122 (e.g., an N-well of a P-type silicon substrate) outside of memory stack 114. Each peripheral contact 146 or 148 can have a depth greater than the depth of memory stack 114 to extend vertically from bonding layer 112 to second semiconductor layer 122 in a peripheral region that is outside of memory stack 114. In some embodiments, peripheral contact 146 is below and in contact with contact 142, such that first semiconductor layer 120 is electrically connected to peripheral circuit 108 in first semiconductor structure 102 through at least second semiconductor layer 122, source contact 132, interconnect layer 133, contact 142, and peripheral contact 146. In some embodiments, peripheral contact 148 is below and in contact with contact 144, such that peripheral circuit 108 in first semiconductor structure 102 is electrically connected to contact pad 140 for pad-out through at least contact 144 and peripheral contact 148. Peripheral contacts 146 and 148 each can include one or more conductive layers, such as a metal layer (e.g., W, Co, Cu, or Al) or a silicide layer surrounded by an adhesive layer (e.g., TiN).

As shown in FIG. 1A, 3D memory device 100 also includes a variety of local contacts (also known as "C1") as part of the interconnect structure, which are in contact with a structure in memory stack 114 directly. In some embodiments, the local contacts include channel local contacts 150 each below and in contact with the lower end of a respective channel structure 124. Each channel local contact 150 can be electrically connected to a bit line contact (not shown) for bit line fan-out. In some embodiments, the local contacts further include word line local contacts 152 each below and in contact with a respective conductive layer 116 (including a word line) in the staircase region of memory stack 114 for word line fan-out. Local contacts, such as channel local contacts 150 and word line local contacts 152, can be electrically connected to peripheral circuits 108 of first semiconductor structure 102 through at least bonding layers 112 and 110. Local contacts, such as channel local contacts 150 and word line local contacts 152, each can include one or more conductive layers, such as a metal layer (e.g., W, Co, Cu, or Al) or a silicide layer surrounded by an adhesive layer (e.g., TiN).

Figure 1B:
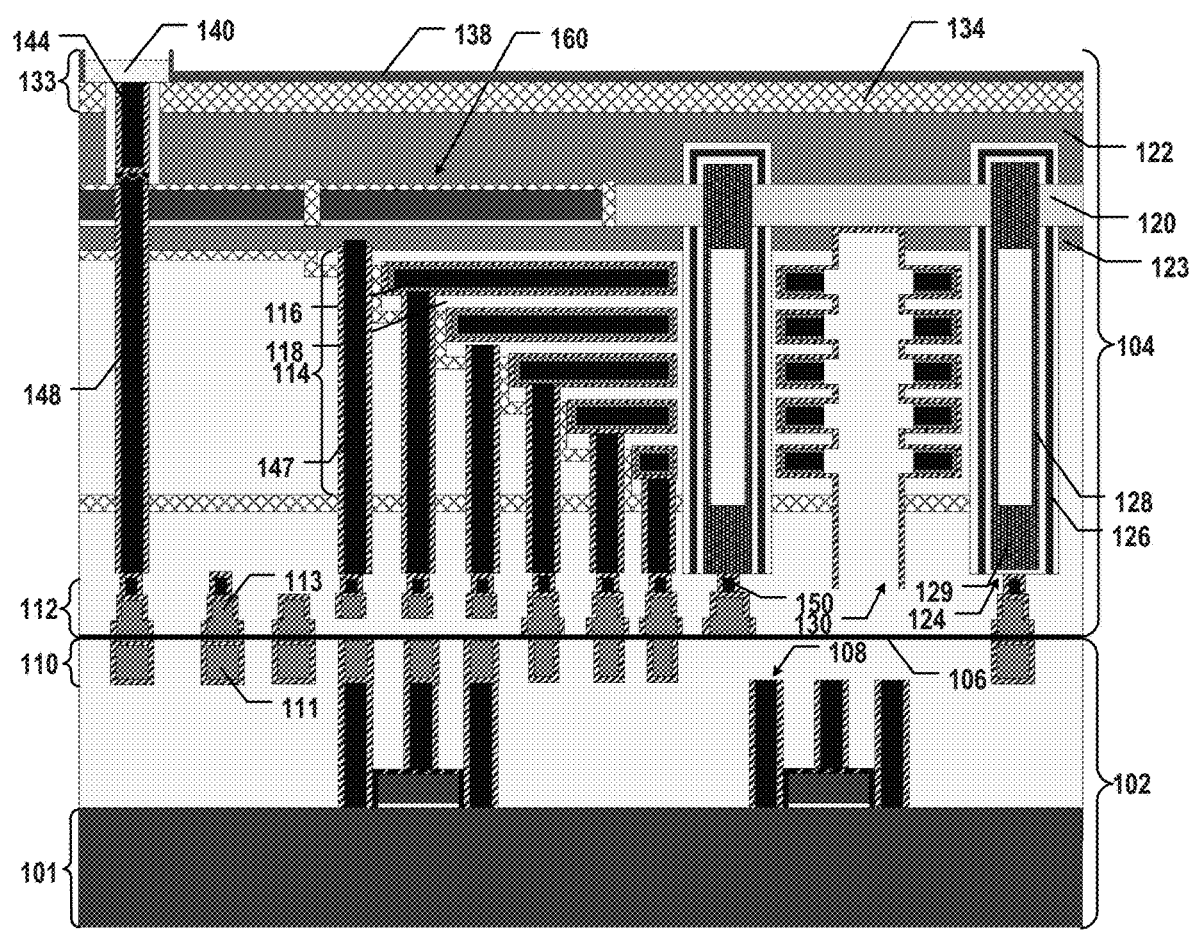
Figure 1B:
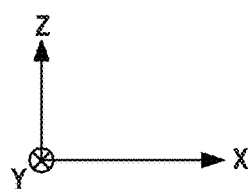

FIG. 1B illustrates a side view of a cross-section of another exemplary 3D memory device 103 with supporting structure 160 for staircase region, according to some embodiments of the present disclosure. 3D memory device 103 is similar to 3D memory device 100 except that backside source contact 132 in 3D memory device 100 is replaced by a front side source contact 147 in 3D memory device 103, according to some embodiments. As shown in FIG. 1B, source contact 147 can be disposed below first semiconductor layer 120 and in contact with third semiconductor layer 123. That is, source contact 147 and memory stack 114 (and insulating structure 130 therethrough) can be disposed on the same side, e.g., the front side, of second semiconductor layer 122 (e.g., a thinned substrate). It is understood that the details of other same structures in both 3D memory devices 103 and 100 are not repeated for ease of description.

Figure 1C:
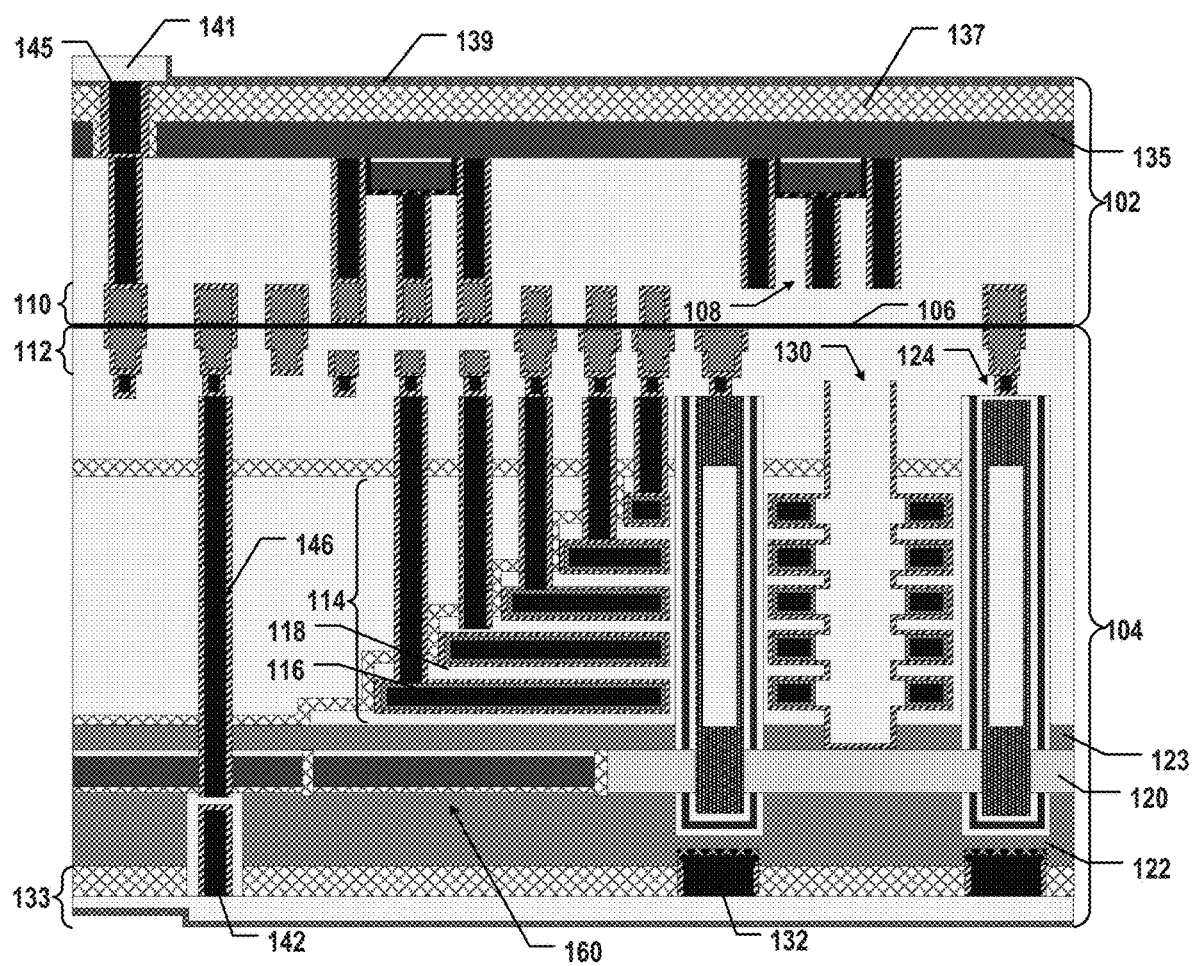

FIG. 1C illustrates a side view of a cross-section of still another exemplary 3D memory device 105 with supporting structure 160 for staircase region, according to some embodiments of the present disclosure, according to some embodiments of the present disclosure. Similar to 3D memory device 100 described above in FIG. 1A, 3D memory device 103 represents an example of a bonded 3D memory device in which first semiconductor structure 102 including peripheral circuits 108 and second semiconductor structure 104 including memory stack 114 and channel structures 124 are formed separately and bonded in a face-to-face manner at a bonding interface 106. Different from 3D memory device 100 described above in FIG. 1A in which first semiconductor structure 102 including peripheral circuits 108 is below second semiconductor structure 104 including memory stack 114 and channel structures 124, 3D memory device 105 in FIG. 1C includes second semiconductor structure 104 disposed above first semiconductor structure 102. It is understood that the details of other same structures in both 3D memory devices 105 and 100 are not repeated for ease of description.

As shown in FIG. 1C, second semiconductor structure 104 includes memory stack 114 including interleaved conductive layers 116 and dielectric layers 118, according to some embodiments. Memory stack 114 can have a core array region (e.g., 202 in FIGS. 2A and 2B) and a staircase region (e.g., 204 in FIGS. 2A and 2B) in the plan view. In some embodiments, second semiconductor structure 104 also includes first semiconductor layer 120 below and overlapping the core array region of memory stack 114, and supporting structure 160 coplanar with first semiconductor layer 120 and below and overlapping the staircase region of memory stack 114. In some embodiments, second semiconductor structure 104 further includes second semiconductor layer 122 below and in contact with first semiconductor layer 120 and supporting structure 160. Each of first and second semiconductor layers 120 and 122 can include N-type doped silicon. For example, first semiconductor layer 120 may include N-type doped polysilicon. As shown in FIG. 1C, second semiconductor structure 104 of 3D memory device 105 can further include channel structures 124 each extending vertically through the core array region of memory stack 114 and first semiconductor layer 120 into second semiconductor layer 122. In some embodiments, second semiconductor structure 104 further includes third semiconductor layer 123 vertically between memory stack 114 and first semiconductor layer 120 and supporting structure 160.

In some embodiments, part of supporting structure 160 (e.g., ring structure 302 in FIG. 3) in contact with first semiconductor layer 120 includes a material other than the material of first semiconductor layer 120. For example, the part of supporting structure 160 may include silicon oxide. The remainder of supporting structure 160 (e.g., core structure 303 in FIG. 3) may include a polysilicon layer or a silicon nitride layer (e.g., middle layer 306 in FIG. 3). In some embodiments, the remainder of supporting structure 160 also includes a silicon oxide layer (e.g., top layer 308 in FIG. 3) vertically between the polysilicon or silicon nitride layer and second semiconductor layer 122.

As shown in FIG. 1C, second semiconductor structure 104 of 3D memory device 105 can further include backside source contact 132 below first semiconductor layer 120 and in contact with second semiconductor layer 122. In some embodiments, second semiconductor structure 104 further includes interconnect layer 133 below and in contact with source contact 132 for electrically connecting source contact 132 to peripheral circuits 108 through contact 142 and peripheral contact 146.

As shown in FIG. 1C, first semiconductor structure 102 of 3D memory device 105 can include peripheral circuits 108 above memory stack 114 in second semiconductor structure 104, and a fourth semiconductor layer 135 (e.g., a thinned substrate 101) above peripheral circuits 108. In some embodiments, first semiconductor structure 102 also includes an ILD layer 137 on fourth semiconductor layer 135 and a passivation layer 139 on ILD layer 137 for insulation and protection. First semiconductor structure 102 can further include a contact pad 141 above fourth semiconductor layer 135 and ILD layer 137 for pad-out, e.g., transferring electrical signals between 3D memory device 105 and external circuits. In some embodiments, first semiconductor structure 102 further includes a contact 145 (e.g., a TSC) through fourth semiconductor layer 135 and ILD layer 137 and in contact with contact pad 141.

Figure 1D:
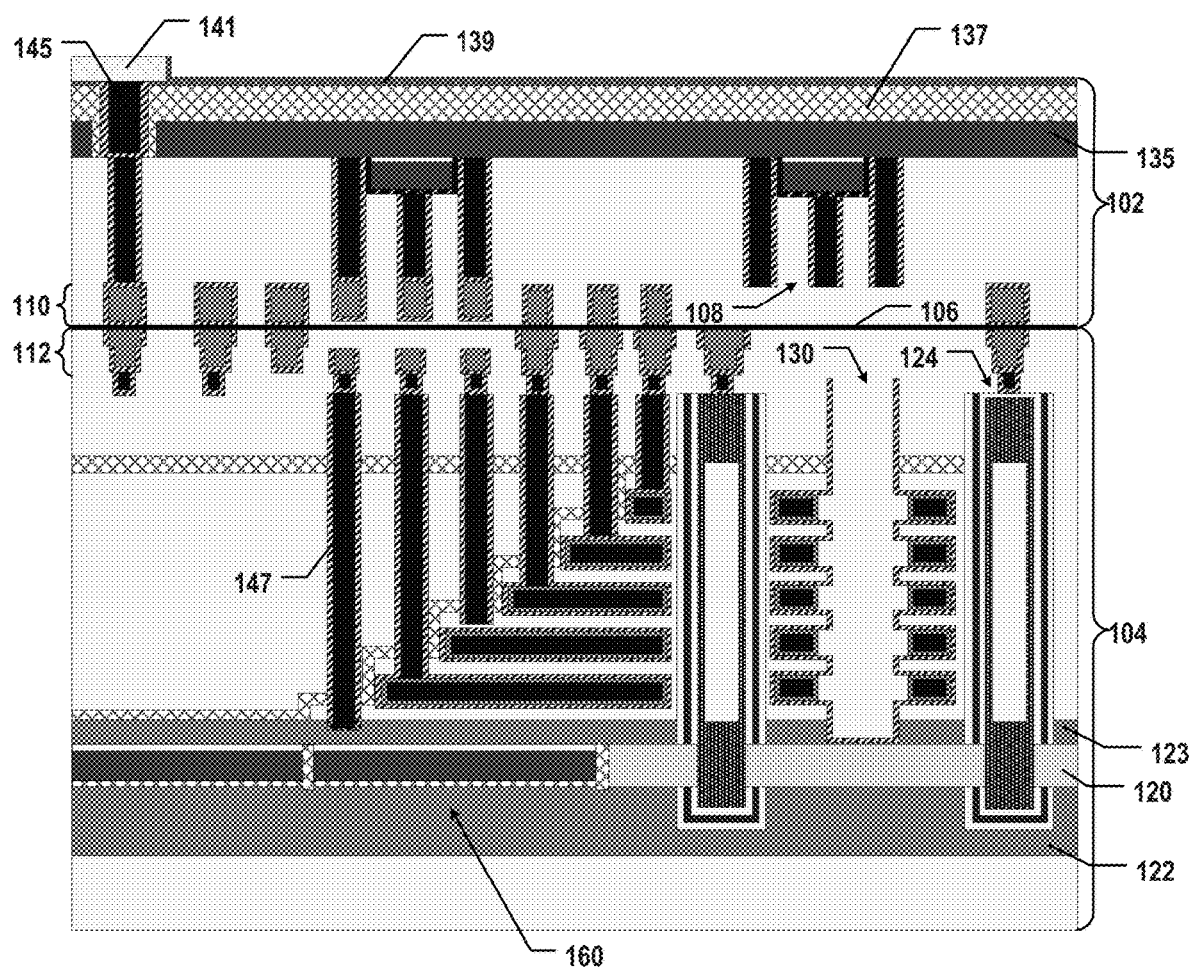

FIG. 1D illustrates a side view of a cross-section of yet another exemplary 3D memory device 107 with supporting structure 160 for staircase region, according to some embodiments of the present disclosure. 3D memory device 107 is similar to 3D memory device 105 except that backside source contact 132 in 3D memory device 105 is replaced by front side source contact 147 in 3D memory device 107, according to some embodiments. As shown in FIG. 1D, source contact 147 can be disposed above first semiconductor layer 120 and in contact with third semiconductor layer 123. That is, source contact 147 and memory stack 114 (and insulating structure 130 therethrough) can be disposed on the same side, e.g., the front side, of second semiconductor layer 122. It is understood that the details of other same structures in both 3D memory devices 107 and 105 are not repeated for ease of description.

FIGS. 4A-4D illustrate side views of cross-sections of exemplary 3D memory devices 400, 403, 405, and 407 with another supporting structure 460 for staircase region, according to various embodiments of the present disclosure. 3D memory devices 400, 403, 405, and 407 in FIGS. 4A-4D are similar to 3D memory devices 100, 103, 105, and 107 in FIGS. 1A-1D, respectively, except for the different structures of supporting structure 460 and supporting structure 160 described below in detail. It is understood that the details of other same structures in 3D memory devices 100, 103, 105, 107, 400, 403, 405, and 407 are not repeated for ease of description.

Figure 4A:
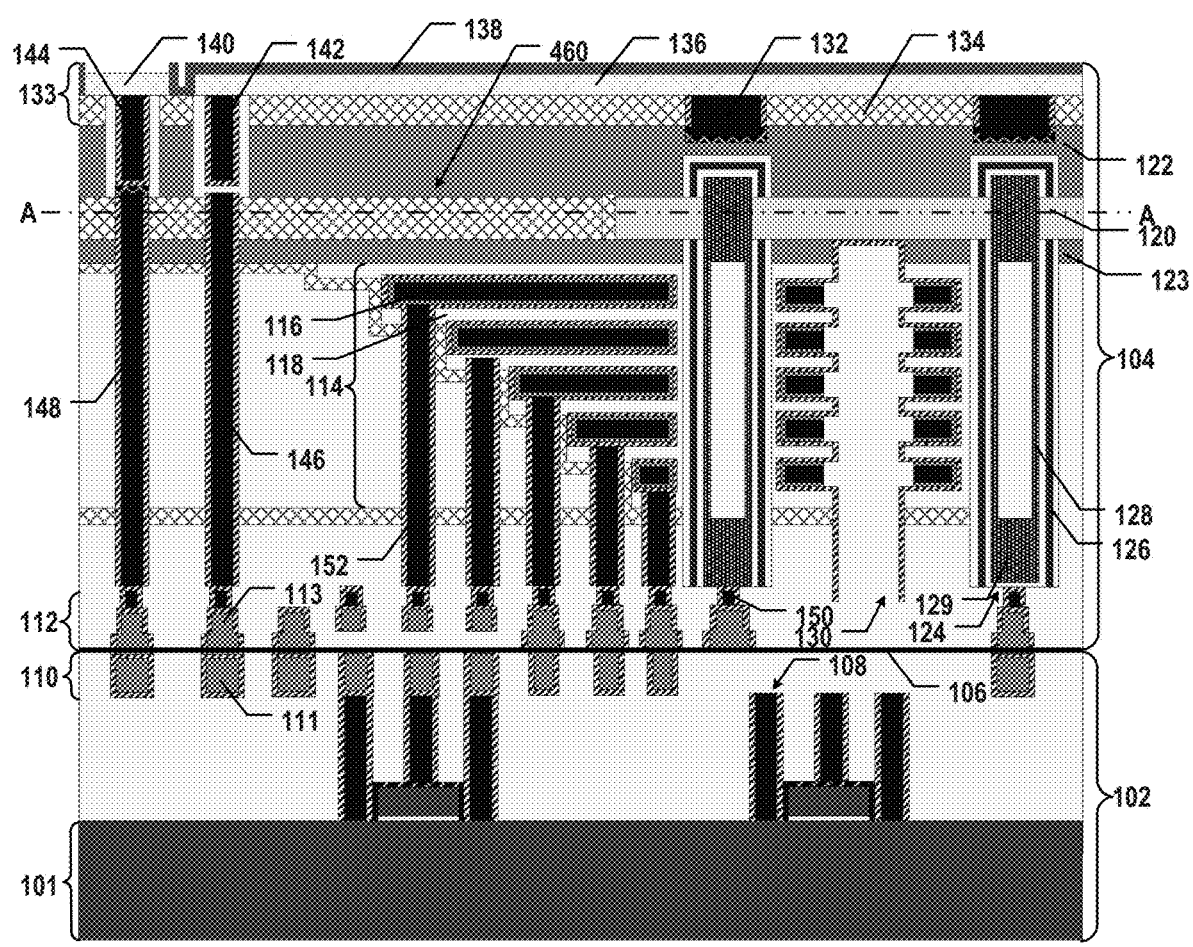
FIGS. 4A-4D illustrate side views of cross-sections of exemplary 3D memory devices with another supporting structure for staircase region, according to various embodiments of the present disclosure.
Figure 4B:
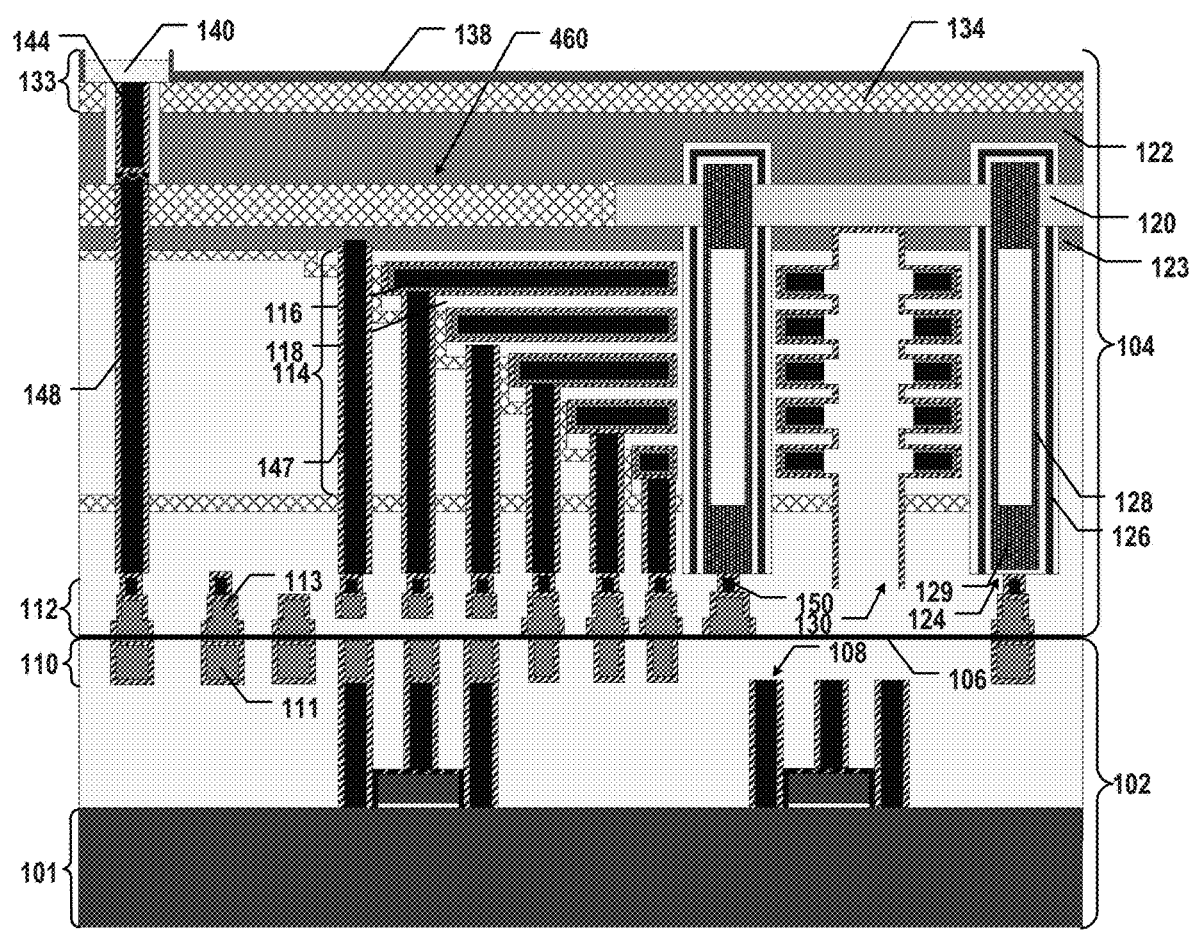
Figure 4B:
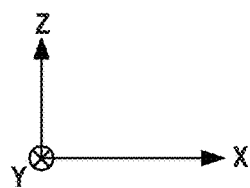
Figure 4C:
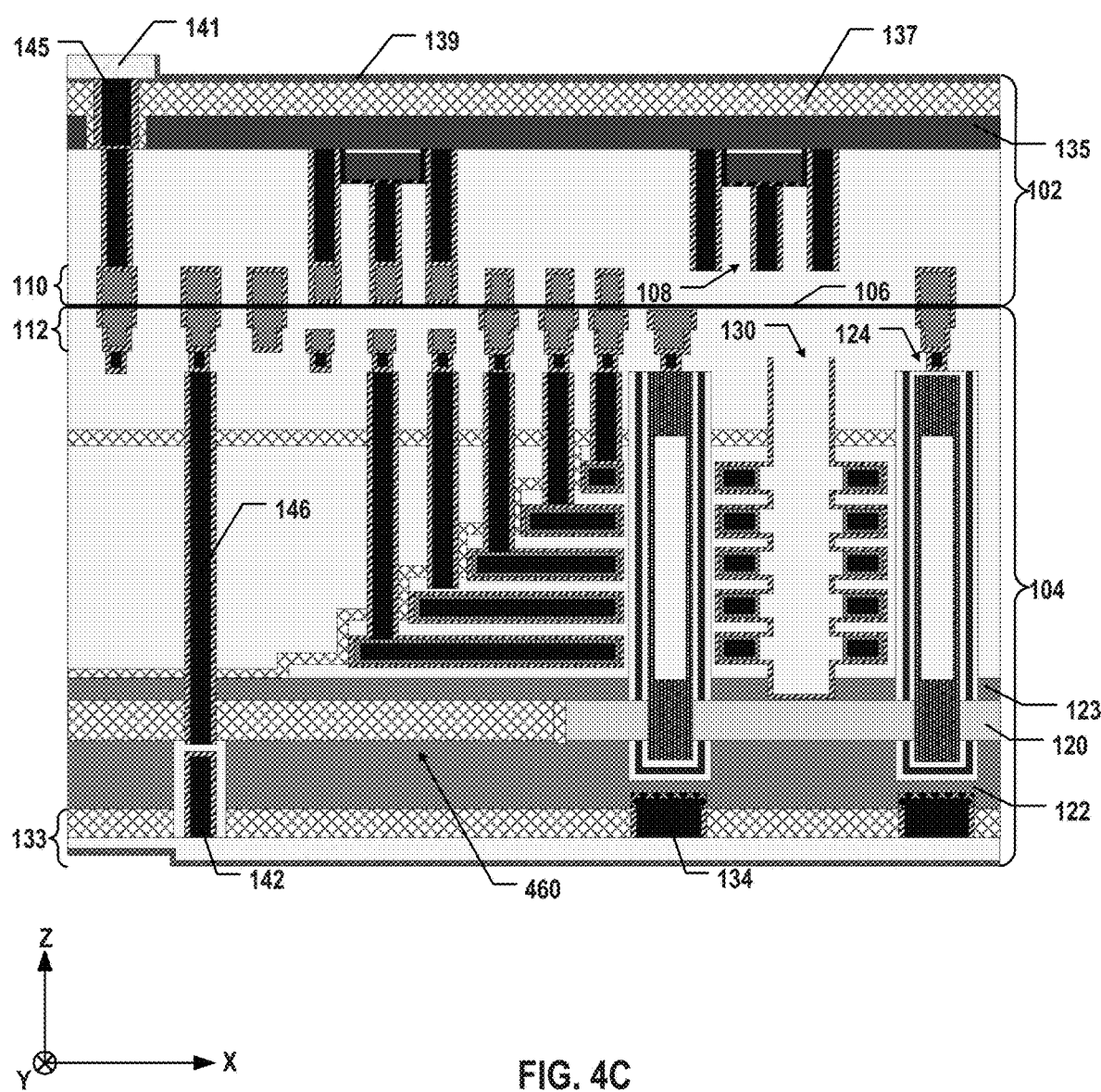
Figure 4D:
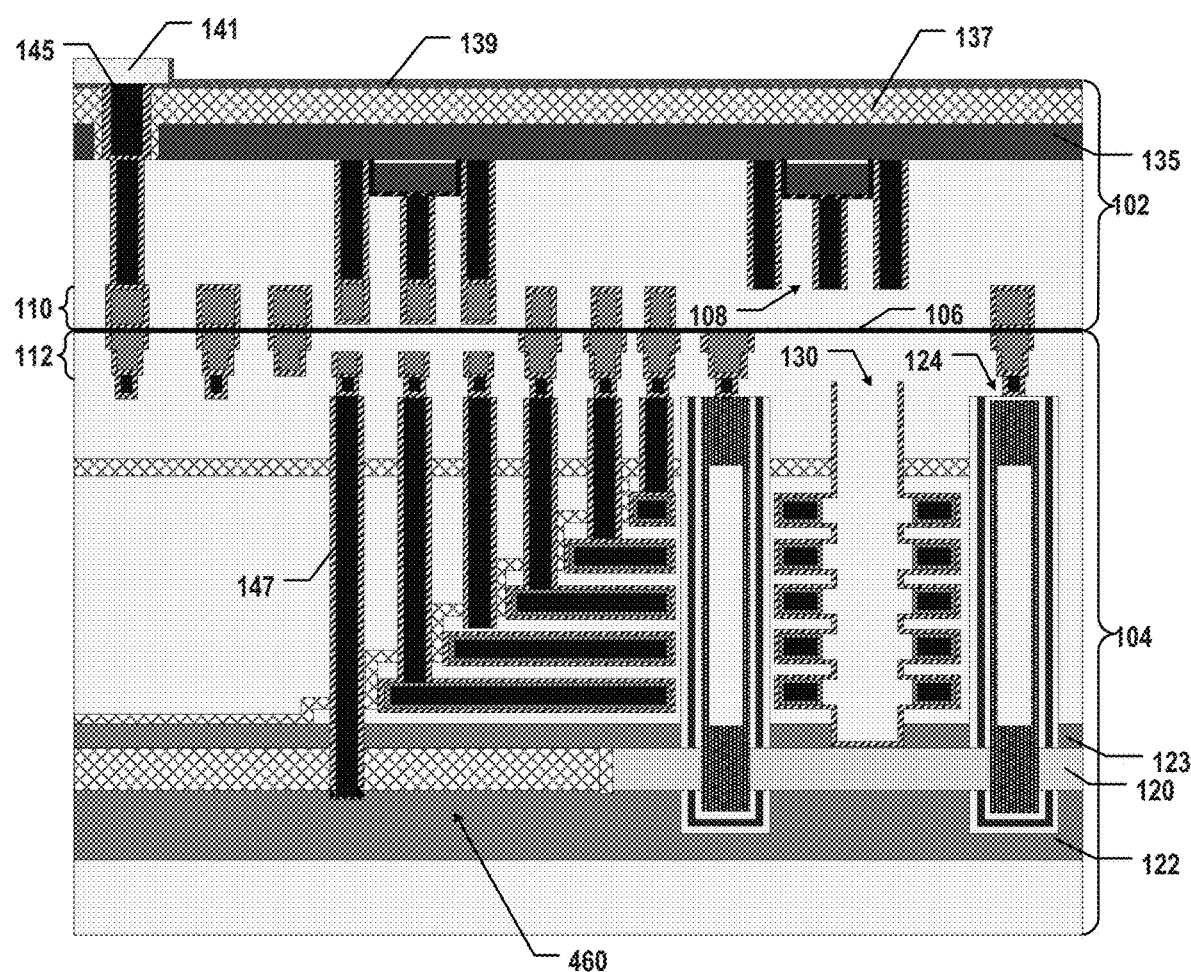

As shown in FIGS. 4A-4D, second semiconductor structure 104 includes a supporting structure 460 overlapping the staircase region of memory stack 114 and coplanar with first semiconductor layer 120, according to some embodiments. Second semiconductor layer 122 can be in contact with first semiconductor layer 120 and supporting structure 460. In some embodiments, third semiconductor layer 123 can be in contact with first semiconductor layer 120 and supporting structure 460 as well, and second and third semiconductor layers 122 and 123 are on opposite sides of first semiconductor layer 120 and supporting structure 460. As shown in FIGS. 4B and 4D, front side source contact 147 can be in contact with third semiconductor layer 123 (as shown in FIG. 4B) or extend through third semiconductor layer 123 and supporting structure 460 to be in contact with second semiconductor layer 122 (as shown in FIG. 4D).

Figure 5A:
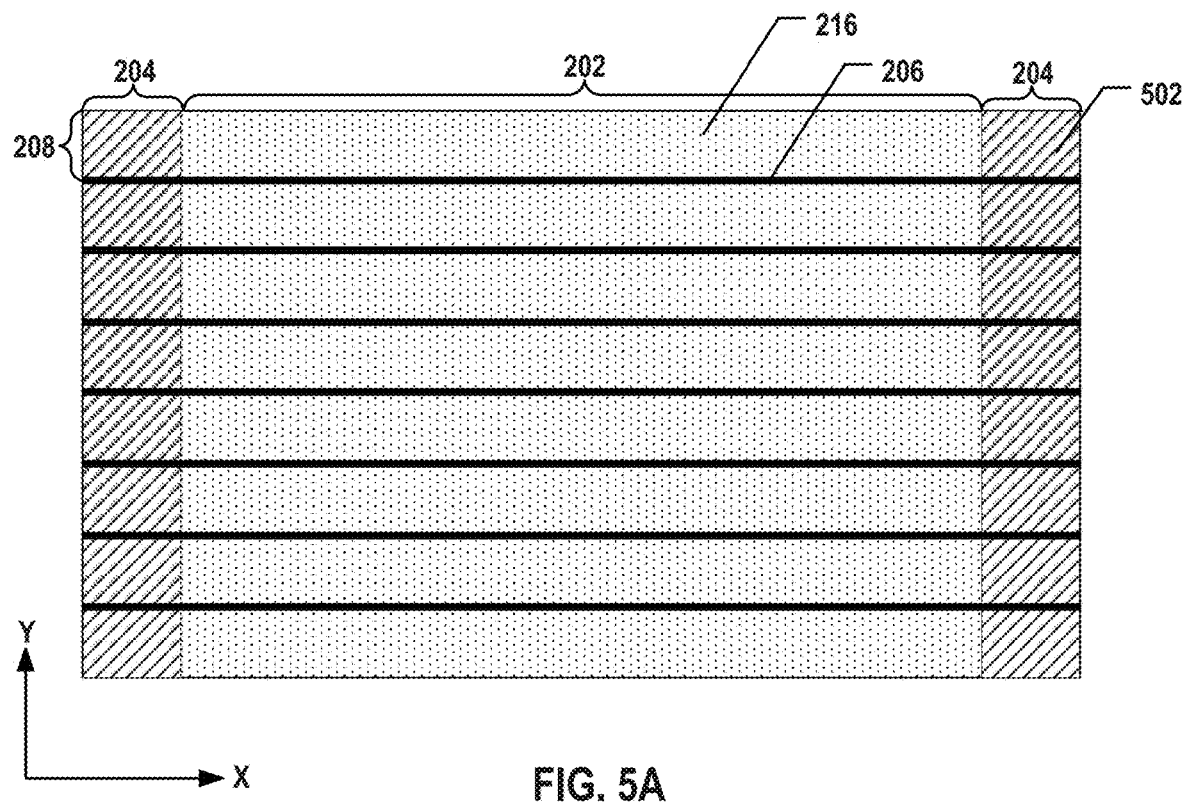
FIG. 5A illustrates a plan view of a cross-section of an exemplary 3D memory device with another supporting structure for side staircase region, according to some embodiments of the present disclosure.
Figure 5B:
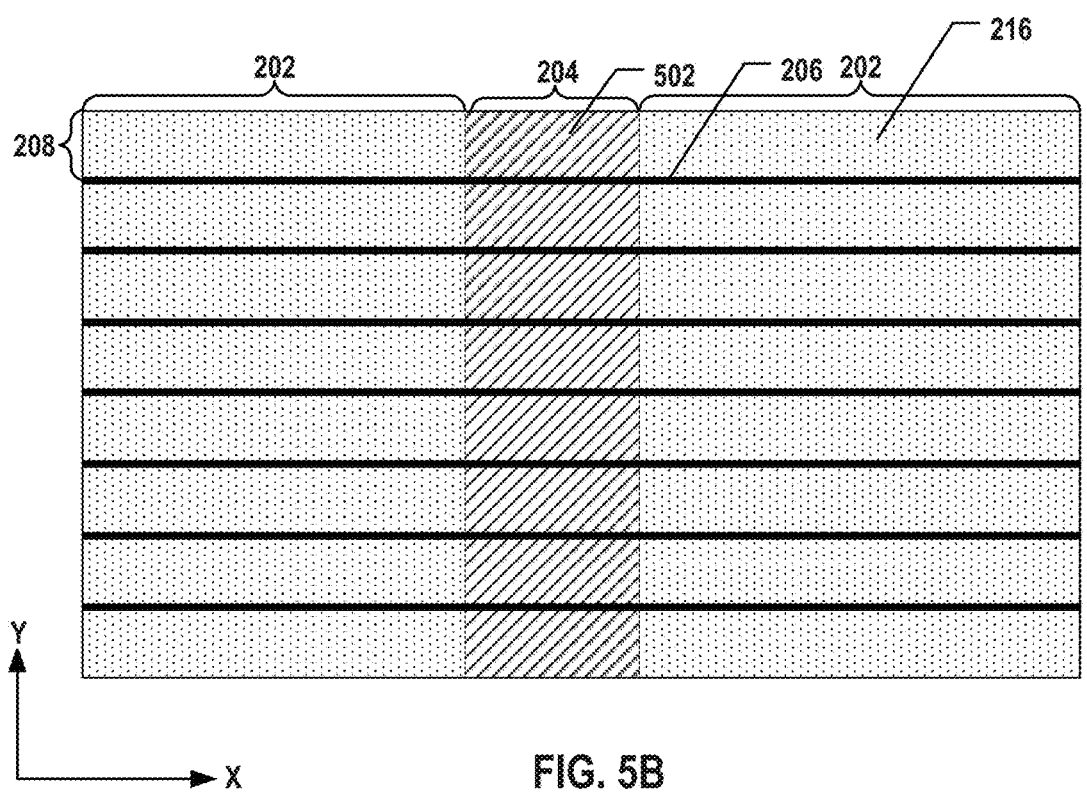
FIG. 5B illustrates a plan view of a cross-section of an exemplary 3D memory device with another supporting structure for center staircase region, according to some embodiments of the present disclosure.

As shown in FIGS. 4A-4D, the part of supporting structure 460 in contact with first semiconductor layer 120 includes the same material as the remainder of supporting structure 460, according to some embodiments. In other words, supporting structure 460 in FIGS. 4A-4D can be a homogeneous structure having the same material, such as silicon oxide, as opposed to the heterogeneous structure of supporting structure 160 in FIGS. 1A-1D. As shown in FIGS. 5A and 5B, a memory stack (e.g., memory stack 114 in FIGS. 4A-4D) can include core array region 202 and staircase region 204 in the plan view. Each of FIGS. 5A and 5B may illustrate an example of a plan view of the cross-section in the AA plane of 3D memory device 400 in FIG. 4A, according to some embodiments. In some embodiments, supporting structure 502, a homogeneous structure (corresponding to supporting structure 460 in FIGS. 4A-4D), is aligned with staircase region 204 in the x-direction (e.g., the word line direction), and semiconductor layer 216 (corresponding to first semiconductor layer 120 in FIGS. 4A-4D) is aligned with core array region 202 in the x-direction.

Figure 6:
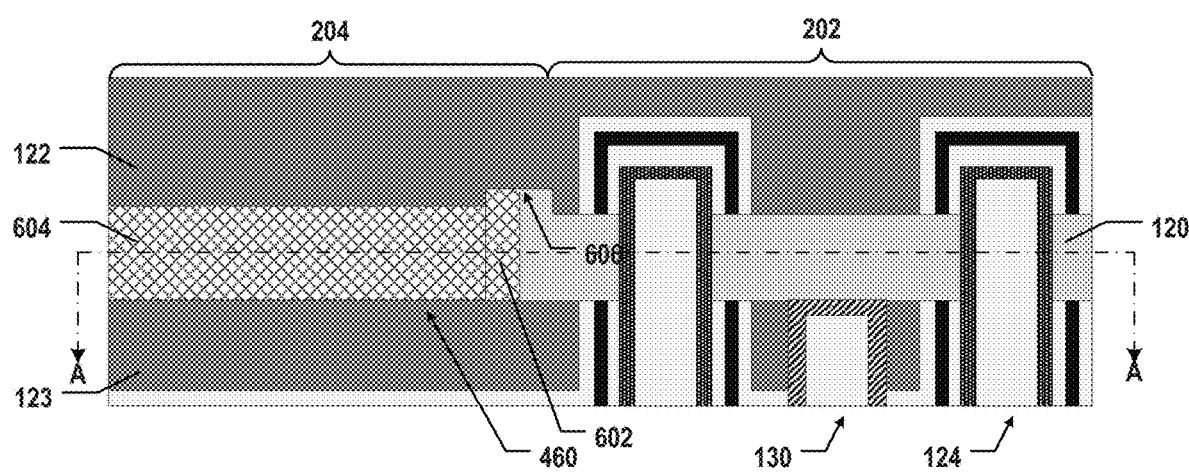
FIG. 6 illustrates an enlarged view of an exemplary supporting structure for staircase region in FIGS. 4A-4D, according to various embodiments of the present disclosure.

As shown in FIG. 6, in some embodiments, the depth of a part 602 of supporting structure 460 in contact with first semiconductor layer 120 is greater than the depth of a remainder 604 of supporting structure 460. Part 602 of supporting structure 460 can extend further into a dent 606 in second semiconductor layer 122 and thus, have the depth greater than that of remainder 604 of supporting structure 460. Nevertheless, different from supporting structure 160 shown in FIG. 3 that has ring structure 302 and core structure 303 having different materials, i.e., a heterogeneous structure, supporting structure 460 in FIG. 6 can have the same material in part 602 in contact with first semiconductor layer 120 and in remainder 604 thereof, such as silicon oxide, i.e., a homogeneous structure.

Figure 9:
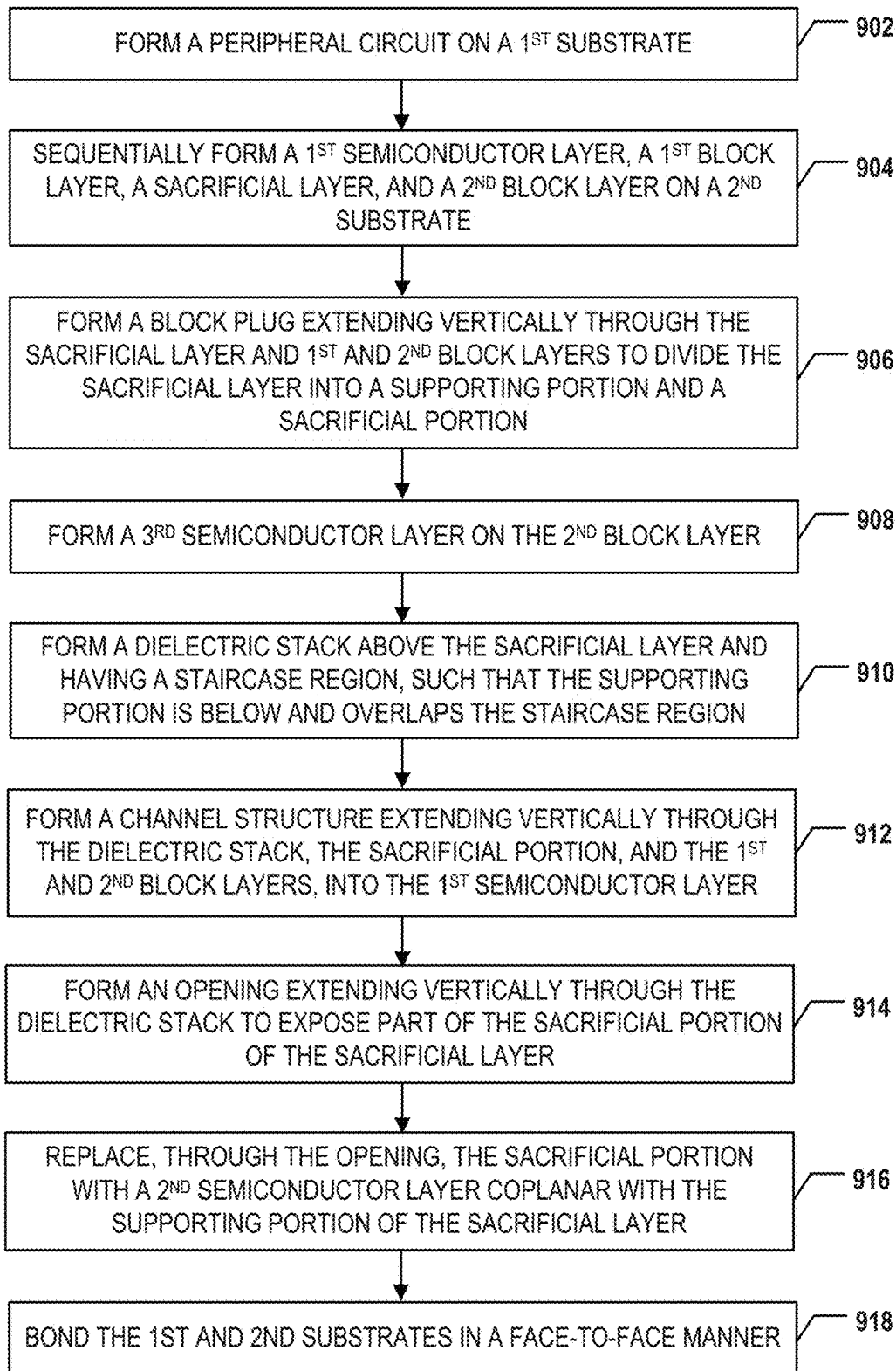
FIG. 9 illustrates a flowchart of a method for forming an exemplary 3D memory device with a supporting structure for staircase region, according to some embodiments of the present disclosure.

FIGS. 7A-7K illustrate a fabrication process for forming an exemplary 3D memory device with a supporting structure for staircase region, according to some embodiments of the present disclosure. FIG. 9 illustrates a flowchart of a method 900 for forming an exemplary 3D memory device with a supporting structure for staircase region, according to some embodiments of the present disclosure. Examples of the 3D memory device depicted in FIGS. 7A-7K and 9 include 3D memory devices 100 and 103 depicted in FIGS. 1A and 1B. FIGS. 7A-7K and 9 will be described together. It is understood that the operations shown in method 900 are not exhaustive and that other operations can be performed as well before, after, or between any of the illustrated operations. Further, some of the operations may be performed simultaneously, or in a different order than shown in FIG. 9.

Referring to FIG. 9, method 900 starts at operation 902, in which a peripheral circuit is formed on a first substrate. The first substrate can be a silicon substrate. As illustrated in FIG. 7J, a plurality of transistors are formed on a silicon substrate 750 using a plurality of processes including, but not limited to, photolithography, etching, thin film deposition, thermal growth, implantation, chemical mechanical polishing (CMP), and any other suitable processes. In some embodiments, doped regions (not shown) are formed in silicon substrate 750 by ion implantation and/or thermal diffusion, which function, for example, as source regions and/or drain regions of the transistors. In some embodiments, isolation regions (e.g., STIs) are also formed in silicon substrate 750 by wet etching and/or dry etching and thin film deposition. The transistors can form peripheral circuits 752 on silicon substrate 750.

As illustrated in FIG. 7J, a bonding layer 748 is formed above peripheral circuits 752. Bonding layer 748 includes bonding contacts electrically connected to peripheral circuits 752. To form bonding layer 748, an ILD layer is deposited using one or more thin film deposition processes, such as chemical vapor deposition (CVD), physical vapor deposition (PVD), atomic layer deposition (ALD), or any combination thereof, and the bonding contacts are formed through the ILD layer using wet etching and/or dry etching, e.g., RIE, followed by one or more thin film deposition processes, such as ALD, CVD, PVD, any other suitable processes, or any combination thereof.

Method 900 proceeds to operation 904, as illustrated in FIG. 9, in which a first semiconductor layer, a first block layer, a sacrificial layer, and a second block layer are sequentially formed on a second substrate. The second substrate can be a silicon substrate. In some embodiments, the sacrificial layer includes polysilicon or silicon nitride.

Figure 7A:
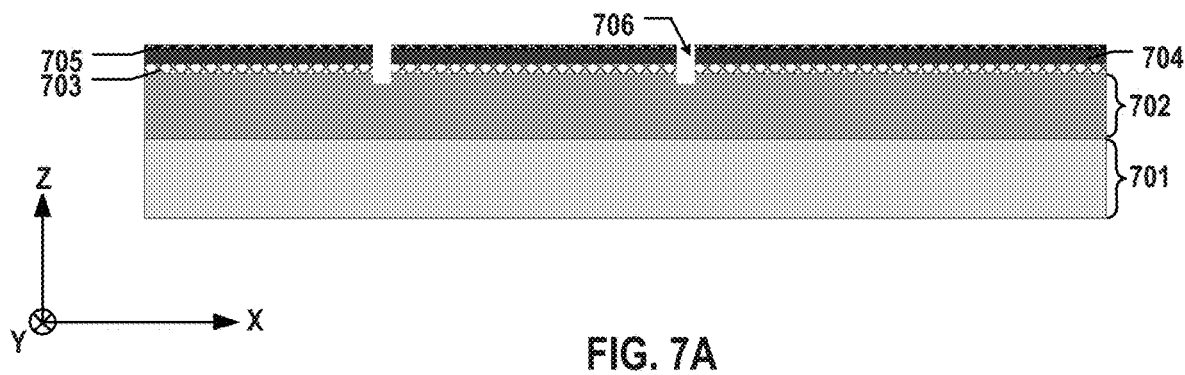
FIGS. 7A-7K illustrate a fabrication process for forming an exemplary 3D memory device with a supporting structure for staircase region, according to some embodiments of the present disclosure.

As illustrated in FIG. 7A, a semiconductor layer 702 is formed on a silicon substrate 701. In some embodiments, semiconductor layer 702 is an N-type doped silicon layer. Semiconductor layer 702 can be an N-well in a P-type silicon substrate 701 and include single crystalline silicon. The N-well can be formed by doping N-type dopant(s), such as P or As, into P-type silicon substrate 701 using ion implantation and/or thermal diffusion. Semiconductor layer 702 can also be an N-type doped polysilicon layer formed by depositing polysilicon on silicon substrate 701 (either P-type or N-type) using one or more thin film deposition processes including, but not limited to, CVD, PVD, ALD, or any combination thereof. In some embodiments, in-situ doping of N-type dopants, such as P or As, is performed when depositing polysilicon to form an N-type doped polysilicon layer.

As illustrated in FIG. 7A, a block layer 703 is formed on semiconductor layer 702. Block layer 703 can be formed by depositing silicon oxide or any other suitable materials different from the materials of semiconductor layer 702 and sacrificial layer 704 using one or more thin film deposition processes including, but not limited to, CVD, PVD, ALD, or any combination thereof. In some embodiments, block layer 703 is formed by thermal oxidation of the top portion of semiconductor layer 702.

As illustrated in FIG. 7A, a sacrificial layer 704 is formed on block layer 703. Sacrificial layer 704 can be formed by depositing polysilicon, silicon nitride, or any other suitable sacrificial material (e.g., carbon) that can be later selectively removed and that is different from the material of block layer 703 using one or more thin film deposition processes including, but not limited to, CVD, PVD, ALD, or any combination thereof. In some embodiments, a block layer 705 is formed on sacrificial layer 704. Block layer 705 can be formed by depositing silicon oxide, silicon oxynitride, or any other suitable materials different from the materials of semiconductor layer 709 and sacrificial layer 704 using one or more thin film deposition processes including, but not limited to, CVD, PVD, ALD, or any combination thereof.

Method 900 proceeds to operation 906, as illustrated in FIG. 9, in which a block plug extending vertically through the sacrificial layer and the first and second block layers to divide the sacrificial layer into a supporting portion and a sacrificial portion. In some embodiments, to form the block plug, a dent extending vertically through the sacrificial layer and the first block and second layers is formed, and silicon oxide is deposited to fill the dent and be connected to the first block layer.

As illustrated in FIG. 7A, one or mode dents 706 extending vertically through sacrificial layer 704 and block layers 703 and 705 in the side view are formed using dry etching and/or wet etching, such as reactive ion etch (ME). The etching of dent 706 can stop at semiconductor layer 702 or extend further into the top portion of semiconductor layer 702. It is understood that dents 706 may be part of a ring groove in the plan view.

Figure 7B:
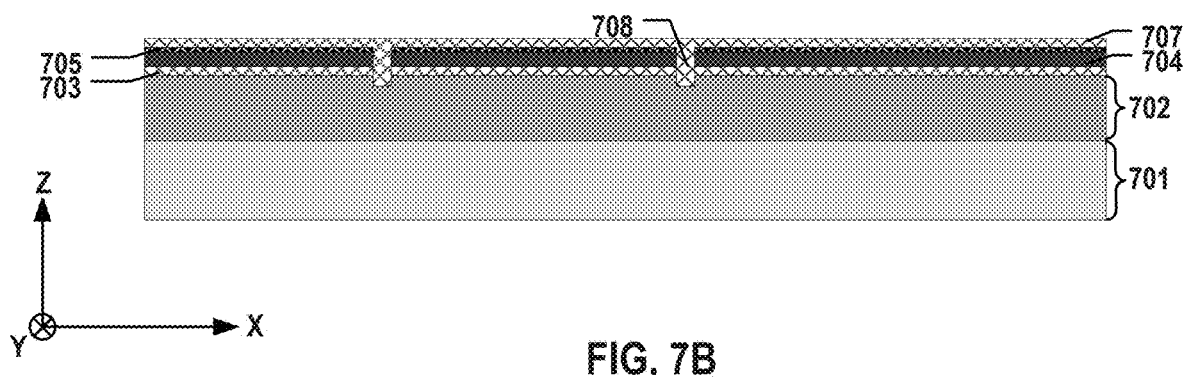
Figure 7C:
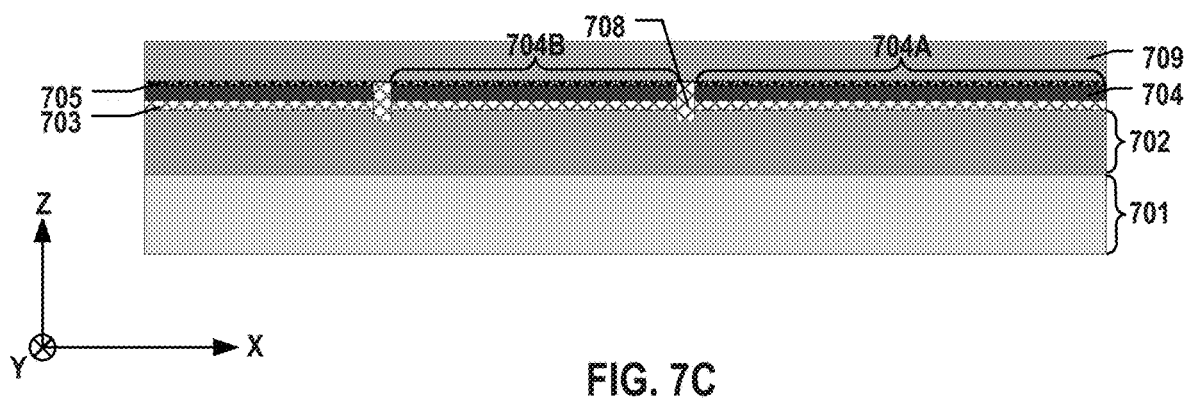

As illustrated in FIG. 7B, a silicon oxide layer 707, or any other material of block layer 703, is deposited using one or more thin film deposition processes including, but not limited to, CVD, PVD, ALD, or any combination thereof, on block layer 705 and to fill dents 706 (shown in FIG. 7A). A CMP or any other suitable planarization process can then be performed to remove excess silicon oxide layer 707 on block layer 705, leaving one or more block plugs 708 extending vertically through sacrificial layer 704 and block layers 703 and 705. Block plugs 708 are connected to block layer 703, according to some embodiments. Depending on whether dents 706 extend further into semiconductor layer 702, block plugs 708 may extend into semiconductor layer 702 as well. As a result, block plugs 708 can divide sacrificial layer 704 into a sacrificial portion 704A and a supporting portion 704B, as shown in FIG. 7C.

Method 900 proceeds to operation 908, as illustrated in FIG. 9, in which a third semiconductor layer is formed on the second block layer and the block plug. As illustrated in FIG. 7C, semiconductor layer 709 is formed on block layer 705 and block plugs 708. In some embodiments, semiconductor layer 709 is an N-type doped silicon layer. Semiconductor layer 709 can be an N-type doped polysilicon layer formed by depositing polysilicon on block layer 705 and block plugs 708 using one or more thin film deposition processes including, but not limited to, CVD, PVD, ALD, or any combination thereof. In some embodiments, in-situ doping of N-type dopants, such as P or As, is performed when depositing polysilicon to form an N-type doped polysilicon layer.

Method 900 proceeds to operation 910, as illustrated in FIG. 9, in which a dielectric stack above the sacrificial layer and having a staircase region is formed, such that the supporting portion of the sacrificial layer is below and overlaps the staircase region of the dielectric stack. The dielectric stack can include interleaved stack sacrificial layers and stack dielectric layers.

Figure 7D:
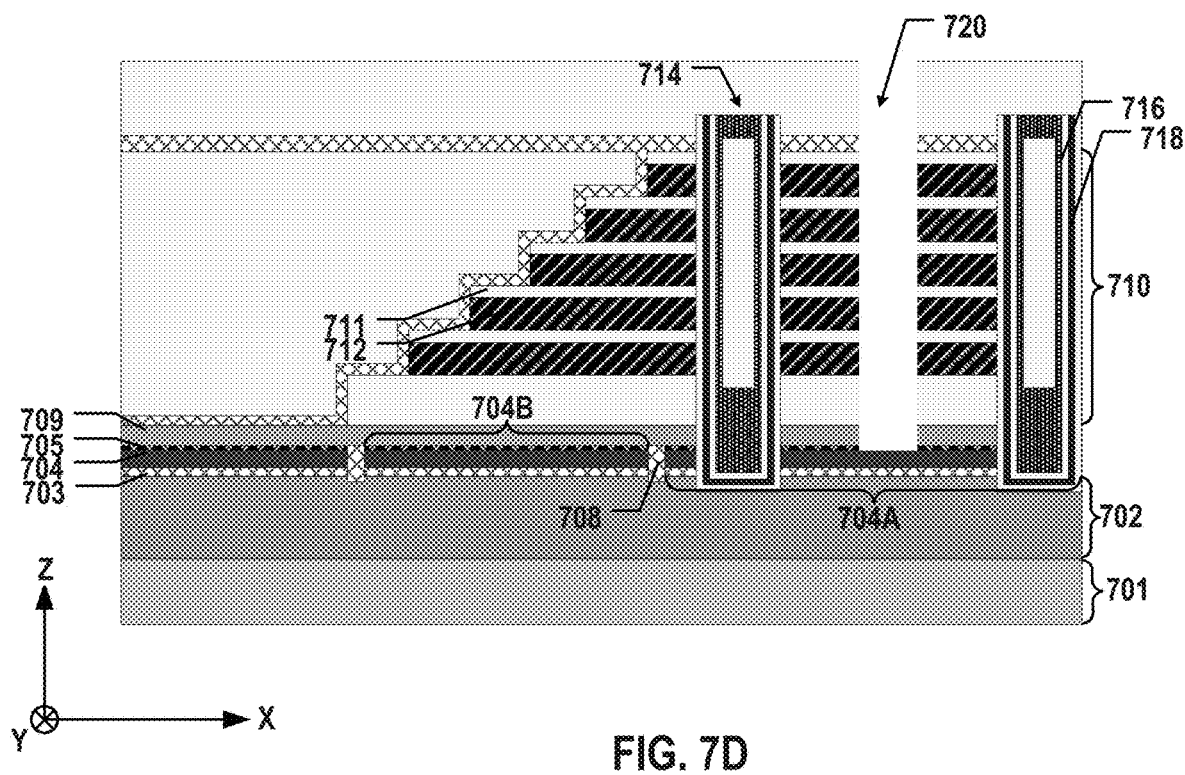

As illustrated in FIG. 7D, a dielectric stack 710 including a plurality pairs of a first dielectric layer (referred to herein as "stack sacrificial layer" 712) and a second dielectric layer (referred to herein as "stack dielectric layers" 711, together referred to herein as "dielectric layer pairs") is formed on semiconductor layer 709. Dielectric stack 710 includes interleaved stack sacrificial layers 712 and stack dielectric layers 711, according to some embodiments. Stack dielectric layers 711 and stack sacrificial layers 712 can be alternatively deposited on semiconductor layer 709 above sacrificial layer 704 to form dielectric stack 710. In some embodiments, each stack dielectric layer 711 includes a layer of silicon oxide, and each stack sacrificial layer 712 includes a layer of silicon nitride. Dielectric stack 710 can be formed by one or more thin film deposition processes including, but not limited to, CVD, PVD, ALD, or any combination thereof. As illustrated in FIG. 7D, a staircase structure can be formed on the edge of dielectric stack 710. The staircase structure can be formed by performing a plurality of so-called "trim-etch" cycles to the dielectric layer pairs of dielectric stack 710 toward silicon substrate 701. Due to the repeated trim-etch cycles applied to the dielectric layer pairs of dielectric stack 710, dielectric stack 710 can have one or more tilted edges and a top dielectric layer pair shorter than the bottom one, as shown in FIG. 7D. That is, dielectric stack 710 can include a staircase region in which the staircase structure is formed. In some embodiments, supporting portion 704B of sacrificial layer 704 is below and overlaps the staircase region of dielectric stack 710, for example, by patterning the staircase structure to be overlapped with supporting portion 704B underneath.

Method 900 proceeds to operation 912, as illustrated in FIG. 9, in which a channel structure extending vertically through the dielectric stack, the sacrificial portion of the sacrificial layer, and the first and second block layers into the first semiconductor layer is formed. In some embodiments, to form the channel structure, a channel hole extending vertically through the dielectric stack, the sacrificial portion of the sacrificial layer, and the first and second block layers into the first semiconductor layer is formed, and a memory film and a semiconductor channel are sequentially formed along a sidewall of the channel hole.

As illustrated in FIG. 7D, a channel hole is an opening extending vertically through dielectric stack 710, semiconductor layer 709, block layer 705, sacrificial portion 704A of sacrificial layer 704, and block layer 703 into semiconductor layer 702. In some embodiments, a plurality of openings are formed, such that each opening becomes the location for growing an individual channel structure 714 in the later process. In some embodiments, fabrication processes for forming the channel hole of channel structure 714 include wet etching and/or dry etching, such as deep RIE (DRIE). In some embodiments, the channel hole of channel structure 714 extends further through the top portion of semiconductor layer 702. The etching process through dielectric stack 710, semiconductor layer 709, block layer 705, sacrificial portion 704A of sacrificial layer 704, and block layer 703 may continue to etch part of semiconductor layer 702. In some embodiments, a separate etching process is used to etch part of semiconductor layer 702 after etching through dielectric stack 710, semiconductor layer 709, block layer 705, sacrificial portion 704A of sacrificial layer 704, and block layer 703.

As illustrated in FIG. 7D, a memory film 718 (including a blocking layer, a storage layer, and a tunneling layer) and a semiconductor channel 716 are sequentially formed in this order along sidewalls and the bottom surface of the channel hole. In some embodiments, memory film 718 is first deposited along the sidewalls and bottom surface of the channel hole, and semiconductor channel 716 is then deposited over memory film 718. The blocking layer, storage layer, and tunneling layer can be sequentially deposited in this order using one or more thin film deposition processes, such as ALD, CVD, PVD, any other suitable processes, or any combination thereof, to form memory film 718. Semiconductor channel 716 can then be formed by depositing a semiconductor material, such as polysilicon, over the tunneling layer of memory film 718 using one or more thin film deposition processes, such as ALD, CVD, PVD, any other suitable processes, or any combination thereof. In some embodiments, a first silicon oxide layer, a silicon nitride layer, a second silicon oxide layer, and a polysilicon layer (a "SONO" structure) are sequentially deposited to form memory film 718 and semiconductor channel 716.

As illustrated in FIG. 7D, a capping layer is formed in the channel hole and over semiconductor channel 716 to completely or partially fill the channel hole (e.g., without or with an air gap). The capping layer can be formed by depositing a dielectric material, such as silicon oxide, using one or more thin film deposition processes, such as ALD, CVD, PVD, any other suitable processes, or any combination thereof. A channel plug can then be formed in the top portion of the channel hole. In some embodiments, parts of memory film 718, semiconductor channel 716, and the capping layer that are on the top surface of dielectric stack 710 are removed and planarized by CMP, wet etching, and/or dry etching. A recess then can be formed in the top portion of the channel hole by wet etching and/or drying etching parts of semiconductor channel 716 and the capping layer in the top portion of the channel hole. The channel plug can then be formed by depositing semiconductor materials, such as polysilicon, into the recess by one or more thin film deposition processes, such as CVD, PVD, ALD, or any combination thereof. Channel structure 714 is thereby formed through dielectric stack 710, semiconductor layer 709, block layer 705, sacrificial portion 704A of sacrificial layer 704, and block layer 703 into semiconductor layer 702.

Method 900 proceeds to operation 914, as illustrated in FIG. 9, in which an opening extending vertically through the dielectric stack is formed to expose part of the sacrificial portion of the sacrificial layer. As illustrated in FIG. 7D, a slit 720 is an opening that extends vertically through dielectric stack 710 and semiconductor layer 709, stopping at block layer 705. In some embodiments, fabrication processes for forming slit 720 include wet etching and/or dry etching, such as DRIE. Block layer 705 can function as the etch stop layer in etching slit 720. Part of block layer 705 can be further removed using wet etching or dry etching to expose part of sacrificial portion 704A of sacrificial layer 704.

Method 900 proceeds to operation 916, as illustrated in FIG. 9, in which the sacrificial portion of the sacrificial layer is replaced, through the opening, with a second semiconductor layer coplanar with the supporting portion of the sacrificial layer. In some embodiments, to replace the sacrificial portion of the sacrificial layer with the second semiconductor layer, the sacrificial portion of the sacrificial layer is removed, through the opening, to form a cavity, stopping at the block plug and the first block layer, and doped polysilicon is deposited, through the opening, into the cavity to form the second semiconductor layer. In some embodiments, to replace the replacing the sacrificial portion of the sacrificial layer with the second semiconductor layer, part of the memory film is removed, through the opening, to expose part of the semiconductor channel along the sidewall of the channel hole, such that the second semiconductor layer is in contact with the exposed part of the semiconductor channel. In some embodiments, after replacing the sacrificial portion of the sacrificial layer with the second semiconductor layer, the dielectric stack is replaced with a memory stack through the opening, for example, using the so-called "gate replacement" process. In some embodiments, to replace the dielectric stack with the memory stack, the stack sacrificial layers are replaced with stack conductive layers through the opening. In some embodiments, the memory stack includes interleaved stack conductive layers and stack dielectric layers.

Figure 7E:
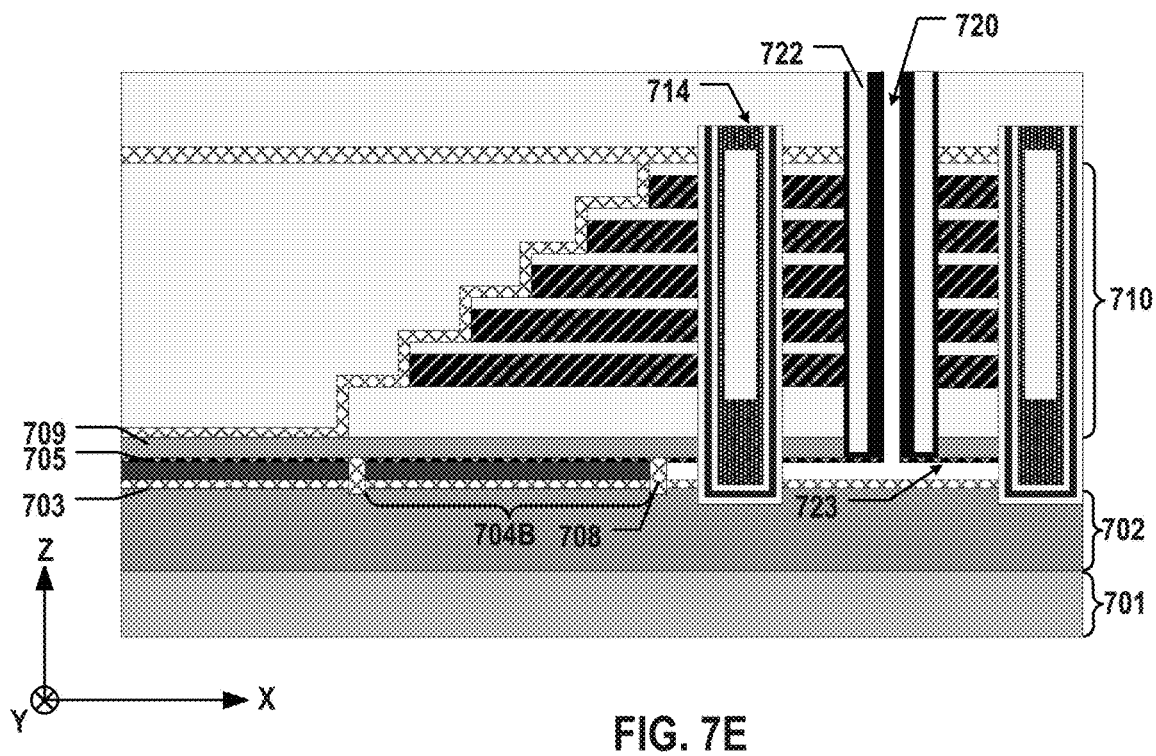

As illustrated in FIG. 7E, sacrificial portion 704A of sacrificial layer 704 (shown in FIG. 7D) is removed by wet etching and/or dry etching to form a cavity 723. In some embodiments, sacrificial layer 704 includes polysilicon or silicon nitride, which can be etched by applying tetramethylammonium hydroxide (TMAH) etchant or phosphoric acid etchant through slit 720, which can be stopped at block plug 708 laterally between supporting portion 704B and sacrificial portion 704A as well as at block layer 703 vertically between sacrificial layer 704 and semiconductor layer 702. In some embodiment, the etching of sacrificial portion 704A is also stopped at block layer 705 vertically between sacrificial layer 704 and semiconductor layer 709. That is, the removal of sacrificial portion 704A of sacrificial layer 704 does not affect supporting portion 704B and semiconductor layers 702 and 709, according to some embodiments. In some embodiments, prior to the removal of sacrificial portion 704A of sacrificial layer 704, a spacer 722 is formed along the sidewall of slit 720. Spacer 722 can be formed by depositing dielectric materials, such as silicon nitride, silicon oxide, and silicon nitride, into slit 720 using one or more thin film deposition processes, such as CVD, PVD, ALD, or any combination thereof.

Figure 7F:
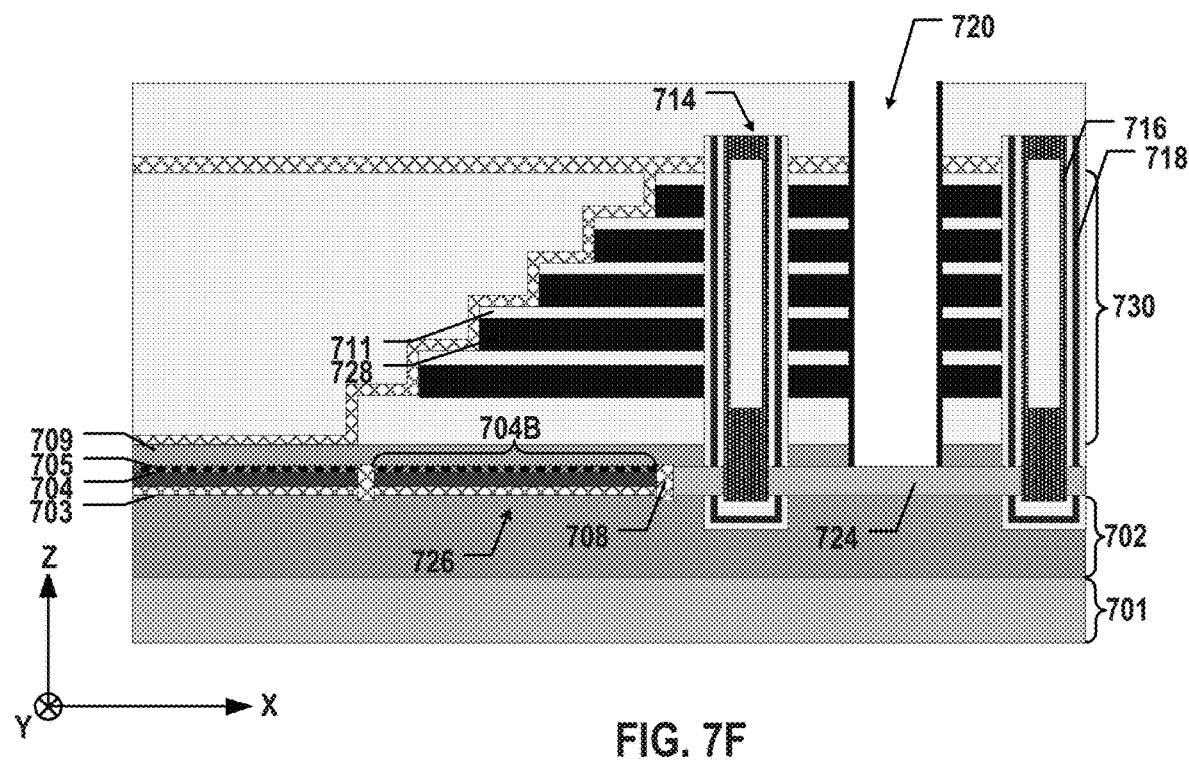

As illustrated in FIG. 7F, part of memory film 718 of channel structure 714 exposed in cavity 723 (shown in FIG. 7E) is removed to expose part of semiconductor channel 716 of channel structure 714 along the sidewall of the channel hole and abutting cavity 723. In some embodiments, parts of the blocking layer (e.g., including silicon oxide), storage layer (e.g., including silicon nitride), and tunneling layer (e.g., including silicon oxide) are etched by applying etchants through slit 720 and cavity 723, for example, phosphoric acid for etching silicon nitride and hydrofluoric acid for etching silicon oxide. The etching can be stopped by semiconductor channel 716 of channel structure 714. Spacer 722 including dielectric materials (shown in FIG. 7E) can also protect dielectric stack 710 from the etching of memory film 718 and can be removed by the etchants in the same step as removing part of memory film 718. Similarly, parts of block layers 703 and 705 exposed in cavity 723 (shown in FIG. 7E) can be removed as well by the same step as removing part of memory film 718. The etching, however, does not affect the remainders of block layers 703 and 705 overlapping supporting portion 704B of sacrificial layer 704 as the etching is stopped by block plug 708, according to some embodiments.

As illustrated in FIG. 7F, a semiconductor layer 724 is formed above and in contact with semiconductor layer 702. In some embodiments, semiconductor layer 724 is formed by depositing polysilicon into cavity 723 (shown in FIG. 7E) through slit 720 using one or more thin film deposition processes, such as CVD, PVD, ALD, or any combination thereof. In some embodiments, in-situ doping of N-type dopants, such as P or As, is performed when depositing polysilicon to form an N-type doped polysilicon layer as semiconductor layer 724. Semiconductor layer 724 can fill cavity 723 to be in contact with the exposed part of semiconductor channel 716 of channel structure 714 as well as in contact with block plug 708. As a result, sacrificial portion 704A of sacrificial layer 704 is thereby replaced with semiconductor layer 724 through slit 720, according to some embodiments.

As illustrated in FIG. 7F, a supporting structure 726 coplanar with semiconductor layer 724 is thereby formed. Supporting structure 726 can include block plug 708 laterally between semiconductor layer 724 and supporting portion 704B of sacrificial layer 704 as well as parts of block layers 703 and 705 vertically sandwiching supporting portion 704B. In some embodiments, supporting structure 726 is below and overlaps the staircase region of dielectric stack 710. When replacing sacrificial portion 704A of sacrificial layer with semiconductor layer 724, because supporting structure 726 overlapping the staircase region of dielectric stack 710 (shown in FIG. 7E) remains intact, the support is kept under the staircase region of dielectric stack 710 to avoid the collapse of dielectric stack 710. Moreover, the dummy channel structures (not shown) extending vertically through the staircase region of dielectric stack 710 and supporting structure 726 also remain intact when etching part of memory film 718 of channel structures 714, thereby further supporting the staircase region of dielectric stack 710 to avoid the collapse of dielectric stack 710.

As illustrated in FIG. 7F, stack sacrificial layers 712 (shown in FIG. 7D) are replaced with stack conductive layers 728, and a memory stack 730 including interleaved stack conductive layers 728 and stack dielectric layers 711 is thereby formed, replacing dielectric stack 710 (shown in FIG. 7E). In some embodiments, lateral recesses (not shown) are first formed by removing stack sacrificial layers 712 through slit 720. In some embodiments, stack sacrificial layers 712 are removed by applying etchants through slit 720, creating the lateral recesses interleaved between stack dielectric layers 711. The etchants can include any suitable etchants that etch stack sacrificial layers 712 selective to stack dielectric layers 711.

Figure 7G:
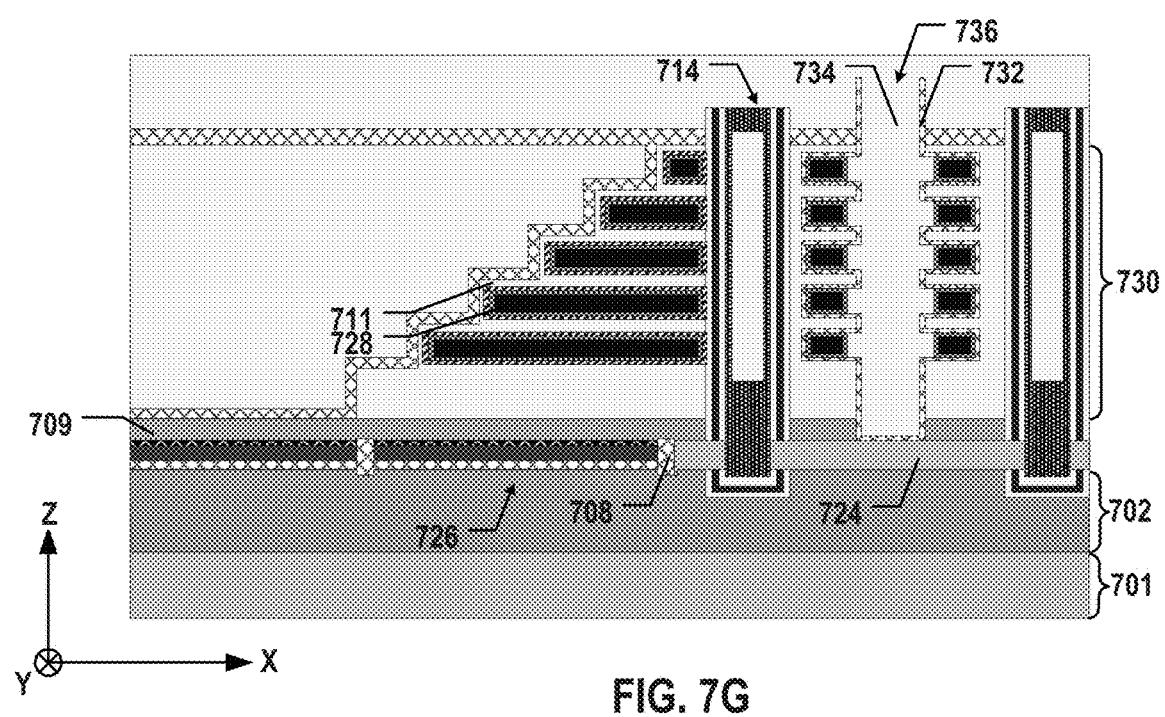

As illustrated in FIG. 7G, stack conductive layers 728 (including gate electrodes and adhesive layers) are deposited into the lateral recesses through slit 720. In some embodiments, a gate dielectric layer 732 is deposited into the lateral recesses prior to stack conductive layers 728, such that stack conductive layers 728 are deposited on the gate dielectric layer. Stack conductive layers 728, such as metal layers, can be deposited using one or more thin film deposition processes, such as ALD, CVD, PVD, any other suitable processes, or any combination thereof. In some embodiments, gate dielectric layer 732, such as a high-k dielectric layer, is formed along the sidewall and at the bottom of slit 720 as well. As a result, channel structure 714 extending vertically through memory stack 730 and semiconductor layers 709 and 724 into semiconductor layer 702 is thereby formed, according to some embodiments.

As illustrated in FIG. 7G, an insulating structure 736 extending vertically through memory stack 730 is formed, stopping on semiconductor layer 724. Insulating structure 736 can be formed by depositing one or more dielectric materials, such as silicon oxide, into slit 720 to fully or partially fill slit 720 (with or without an air gap) using one or more thin film deposition processes, such as ALD, CVD, PVD, any other suitable processes, or any combination thereof. In some embodiments, insulating structure 736 includes gate dielectric layer 732 (e.g., including high-k dielectrics) and a dielectric capping layer 734 (e.g., including silicon oxide).

Figure 7H:
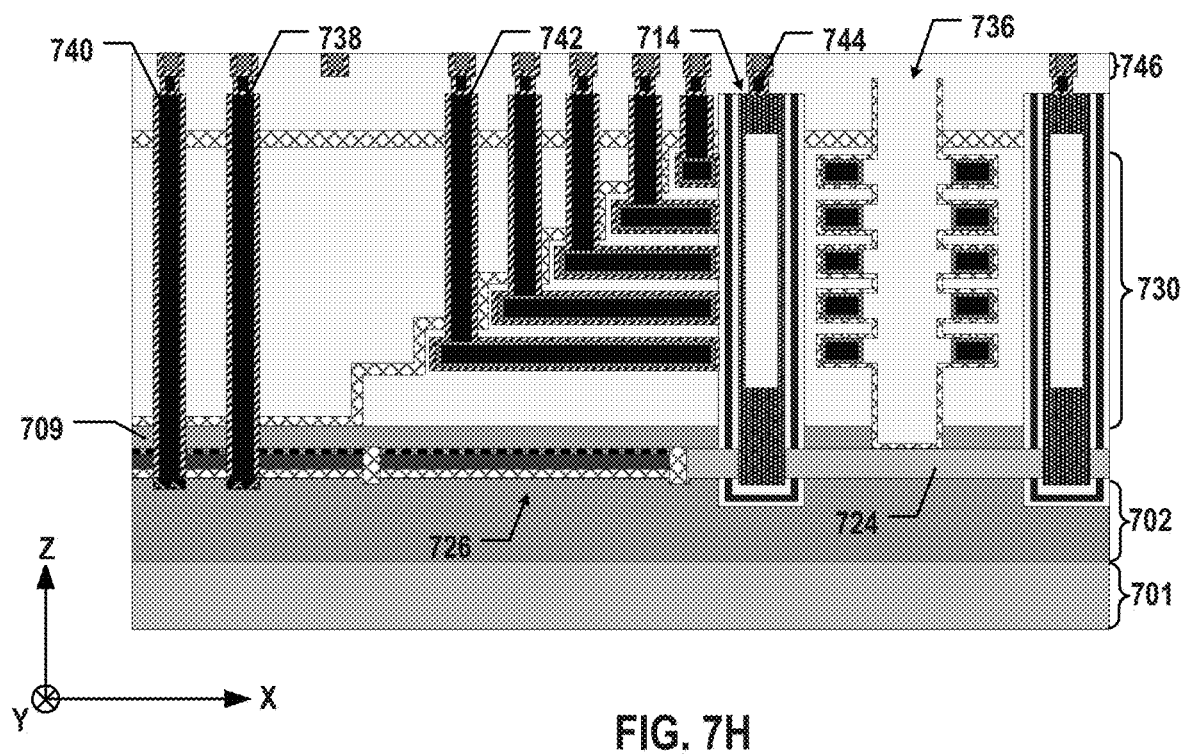

As illustrated in FIG. 7H, after the formation of insulating structure 736, local contacts, including channel local contacts 744 and word line local contacts 742, and peripheral contacts 738 and 740 are formed. A local dielectric layer can be formed on memory stack 730 by depositing dielectric materials, such as silicon oxide or silicon nitride, using one or more thin film deposition processes, such as CVD, PVD, ALD, or any combination thereof, on top of memory stack 730. Channel local contacts 744, word line local contacts 742, and peripheral contacts 738 and 740 can be formed by etching contact openings through the local dielectric layer (and any other ILD layers) using wet etching and/or dry etching, e.g., ME, followed by filling the contact openings with conductive materials using one or more thin film deposition processes, such as ALD, CVD, PVD, any other suitable processes, or any combination thereof.

Figure 7I:
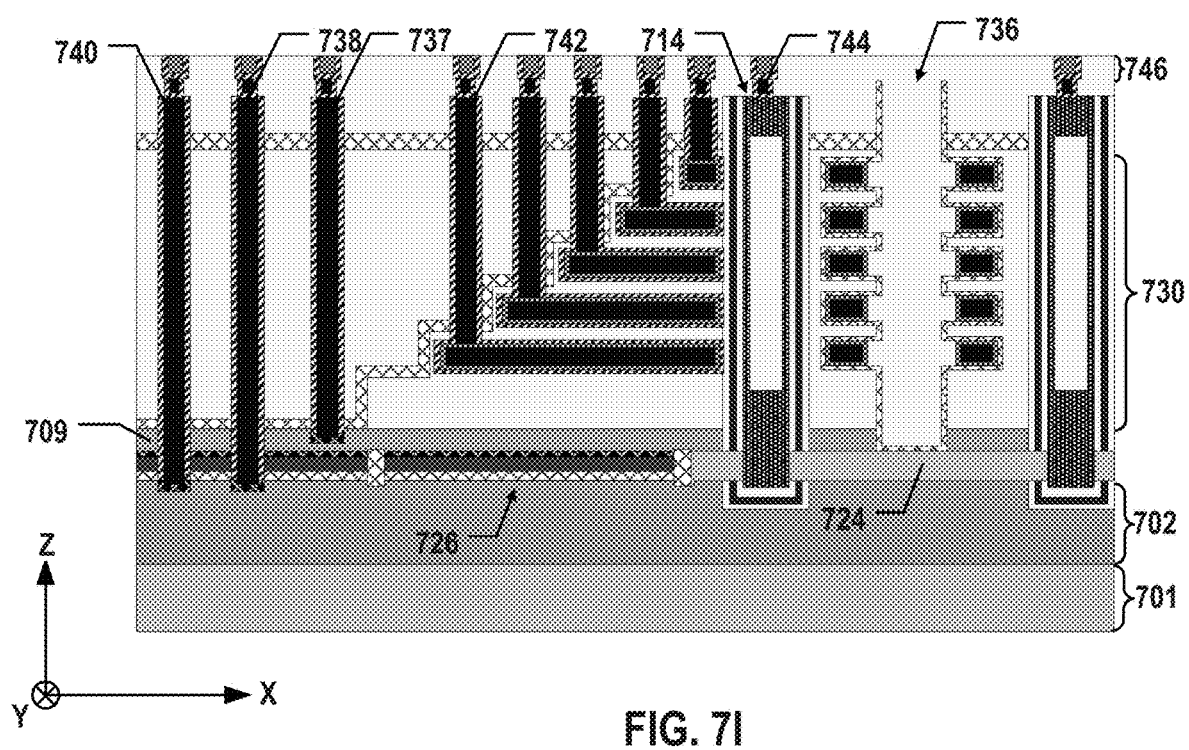
Figure 7J:
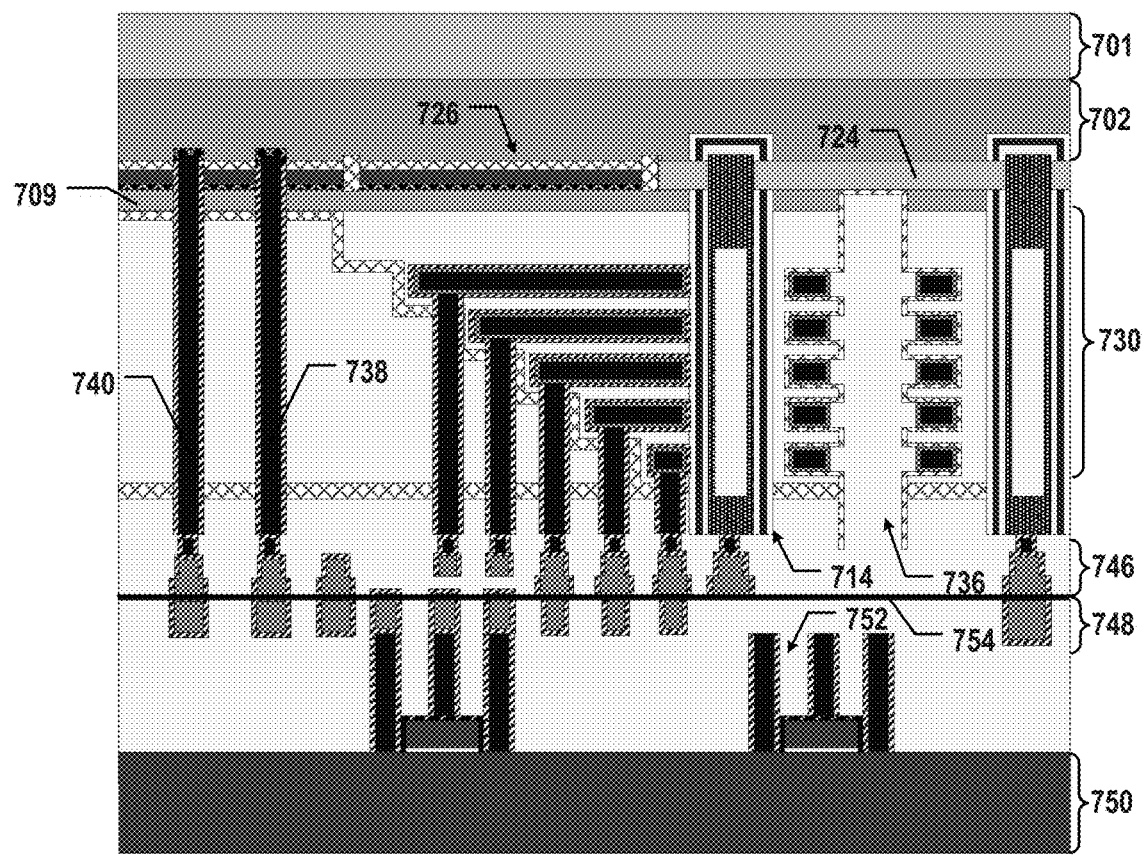
Figure 7J:
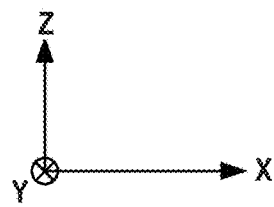

In some embodiments, a source contact above and in contact with the first semiconductor layer is formed. As illustrated in FIG. 7I, in some embodiments, a front side source contact 737 is formed in the same processes for forming word line local contacts 742. Front side source contact 737 can be in contact with semiconductor layers 709.

As illustrated in FIGS. 7H and 7I, a bonding layer 746 is formed above channel local contacts 744, word line local contacts 742, and peripheral contacts 738 and 740. Bonding layer 746 includes bonding contacts electrically connected to channel local contacts 744, word line local contacts 742, and peripheral contacts 738 and 740. To form bonding layer 746, an ILD layer is deposited using one or more thin film deposition processes, such as CVD, PVD, ALD, or any combination thereof, and the bonding contacts are formed through the ILD layer using wet etching and/or dry etching, e.g., RIE, followed by one or more thin film deposition processes, such as ALD, CVD, PVD, any other suitable processes, or any combination thereof.

Method 900 proceeds to operation 918, as illustrated in FIG. 9, in which the first substrate and the second substrate are bonded in a face-to-face manner. The bonding can be hybrid bonding. As illustrated in FIG. 7J, silicon substrate 701 and components formed thereon (e.g., memory stack 730 and channel structures 714 formed therethrough) are flipped upside down. Bonding layer 746 facing down is bonded with bonding layer 748 facing up, i.e., in a face-to-face manner, thereby forming a bonding interface 754 between silicon substrates 701 and 750, according to some embodiments. In some embodiments, a treatment process, e.g., a plasma treatment, a wet treatment, and/or a thermal treatment, is applied to the bonding surfaces prior to the bonding. After the bonding, the bonding contacts in bonding layer 746 and the bonding contacts in bonding layer 748 are aligned and in contact with one another, such that memory stack 730 and channel structures 714 formed therethrough can be electrically connected to peripheral circuits 752 and are above peripheral circuits 752.

In some embodiments, after bonding, the memory stack is above the peripheral circuit. In some embodiments, the second substrate is thinned to expose the first semiconductor layer, and a source contact above and in contact with the first semiconductor layer is formed. In some embodiments, a contact through the first semiconductor layer is formed, and a contact pad above the first semiconductor layer and in contact with the contact is formed.

Figure 7K:
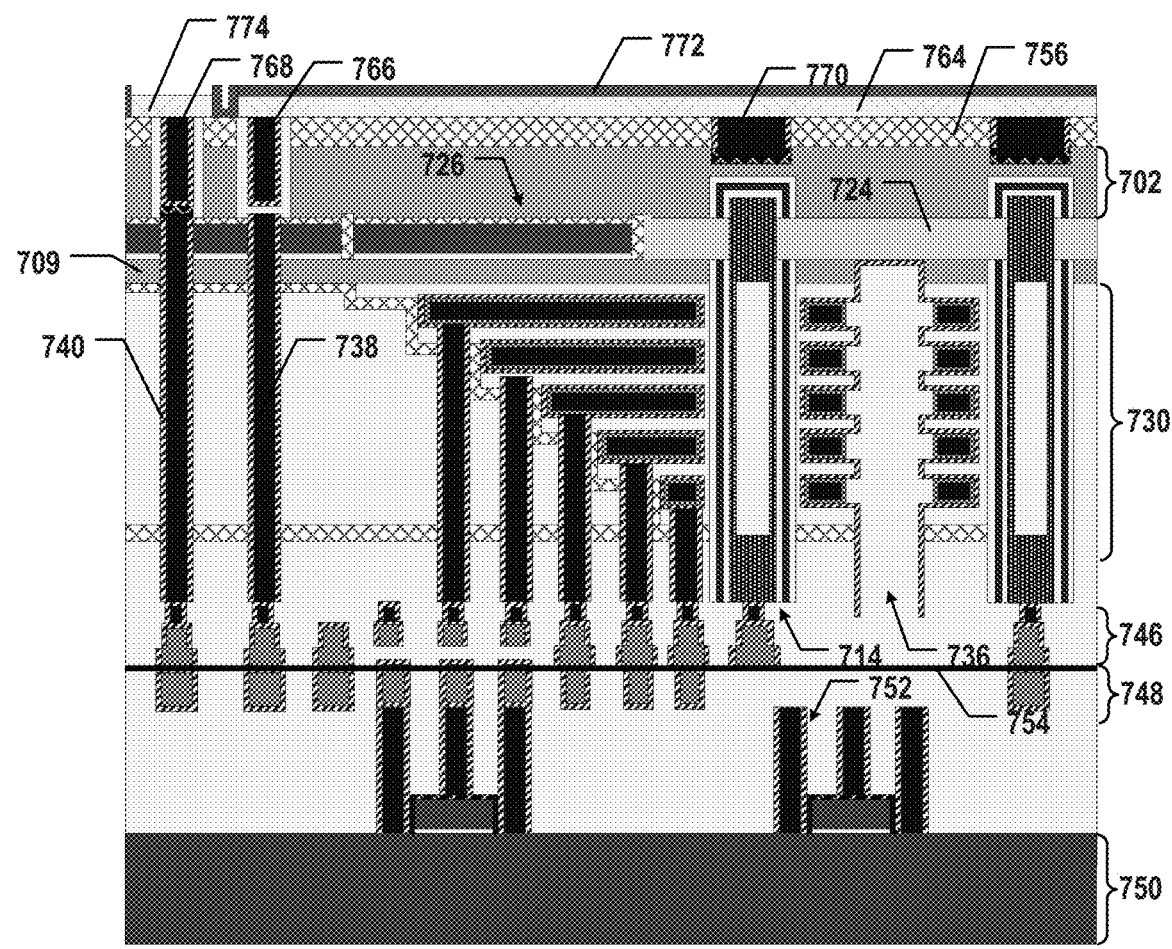
Figure 7K:
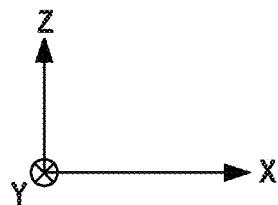

As illustrated in FIG. 7K, silicon substrate 701 (shown in FIG. 7J) is thinned from the backside to expose semiconductor layer 702 using CMP, grinding, dry etching, and/or wet etching. One or more ILD layers 756 can then be formed on semiconductor layer 702 by depositing dielectric materials on semiconductor layer 702 using one or more thin film deposition processes, such as ALD, CVD, PVD, any other suitable processes, or any combination thereof. In some embodiments, backside source contacts 770 are formed on the backside of semiconductor layer 702 and in contact with semiconductor layer 702. In some embodiments, contacts 766 and 768 (e.g., TSCs) extending vertically through ILD layers 756 and semiconductor layer 702 are formed as well. In some embodiments, contacts 766 and 768 are patterned using lithography to be aligned with peripheral contacts 738 and 740, respectively.

As illustrated in FIG. 7K, a redistribution layer 764 is formed above and in contact with source contact 770. In some embodiments, redistribution layer 764 is formed by depositing a conductive material, such as Al, on the top surfaces of semiconductor layer 702 and source contact 770 using one or more thin film deposition processes, such as ALD, CVD, PVD, any other suitable processes, or any combination thereof. As a result, semiconductor layer 724 can be electrically connected to peripheral circuits 752 through semiconductor layer 702, source contact 770, redistribution layer 764, contact 766, peripheral contact 738, and bonding layers 746 and 748. A passivation layer 772 can then be formed on redistribution layer 764. In some embodiments, passivation layer 772 is formed by depositing a dielectric material, such as silicon nitride, using one or more thin film deposition processes, such as ALD, CVD, PVD, any other suitable processes, or any combination thereof. In some embodiments, a contact pad 774 is formed above and in contact with contact 768. In some embodiments, part of passivation layer 772 covering contact 768 is removed by wet etching and dry etching to expose part of redistribution layer 764 underneath to form contact pad 774. As a result, contact pad 774 for pad-out can be electrically connected to peripheral circuits 752 through contact 768, peripheral contact 740, and bonding layers 746 and 748.

Although FIGS. 7J and 7K show that memory stack 730 and channel structures 714 are above peripheral circuits 752 after bonding, it is understood that in some examples, the relative positions of silicon substrates 750 and 701 may be reversed, such that memory stack 730 and channel structures 714 may be below peripheral circuits 752 after bonding. In some embodiments, the first substrate is thinned to form a third semiconductor layer, a contact through the third semiconductor layer is formed, and a contact pad above the third semiconductor layer and in contact with the contact is formed. As illustrated in FIGS. 1C and 1D, semiconductor layer 135 is formed by thinning the substrate on which peripheral circuits 108 are formed, contact 145 is formed through semiconductor layer 135, and contact pad 141 is formed above semiconductor layer 135 and in contact with contact 145.

Figure 10:
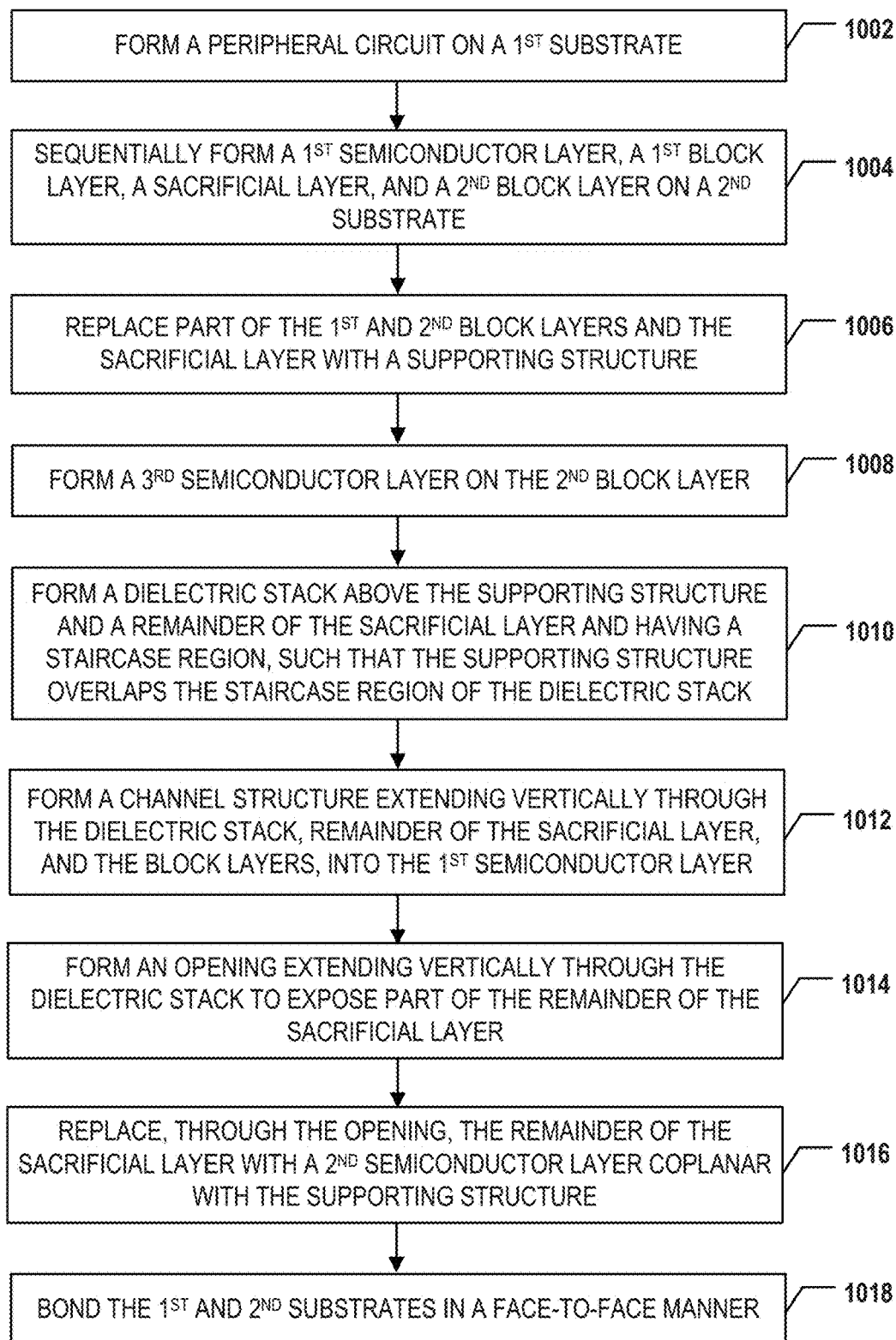
FIG. 10 illustrates a flowchart of a method for forming an exemplary 3D memory device with another supporting structure for staircase region, according to some embodiments of the present disclosure.

FIGS. 8A-8K illustrate a fabrication process for forming an exemplary 3D memory device with another supporting structure for staircase region, according to some embodiments of the present disclosure. FIG. 10 illustrates a flowchart of a method 1000 for forming an exemplary 3D memory device with another supporting structure for staircase region, according to some embodiments of the present disclosure. Examples of the 3D memory device depicted in FIGS. 8A-8K and 10 include 3D memory devices 400 and 403 depicted in FIGS. 4A and 4B. FIGS. 8A-8K and 10 will be described together. It is understood that the operations shown in method 1000 are not exhaustive and that other operations can be performed as well before, after, or between any of the illustrated operations. Further, some of the operations may be performed simultaneously, or in a different order than shown in FIG. 10.

Referring to FIG. 10, method 1000 starts at operation 1002, in which a peripheral circuit is formed on a first substrate. The first substrate can be a silicon substrate. As illustrated in FIG. 8J, a plurality of transistors are formed on a silicon substrate 850 using a plurality of processes including, but not limited to, photolithography, etching, thin film deposition, thermal growth, implantation, CMP, and any other suitable processes. In some embodiments, doped regions (not shown) are formed in silicon substrate 850 by ion implantation and/or thermal diffusion, which function, for example, as source regions and/or drain regions of the transistors. In some embodiments, isolation regions (e.g., STIs) are also formed in silicon substrate 850 by wet etching and/or dry etching and thin film deposition. The transistors can form peripheral circuits 852 on silicon substrate 850.

As illustrated in FIG. 8J, a bonding layer 848 is formed above peripheral circuits 852. Bonding layer 848 includes bonding contacts electrically connected to peripheral circuits 852. To form bonding layer 848, an ILD layer is deposited using one or more thin film deposition processes, such as CVD, PVD, ALD, or any combination thereof, and the bonding contacts are formed through the ILD layer using wet etching and/or dry etching, e.g., ME, followed by one or more thin film deposition processes, such as ALD, CVD, PVD, any other suitable processes, or any combination thereof.

Method 1000 proceeds to operation 1004, as illustrated in FIG. 10, in which a first semiconductor layer, a first block layer, a sacrificial layer, and a second block layer are sequentially formed on a second substrate. The second substrate can be a silicon substrate. In some embodiments, the sacrificial layer includes polysilicon or silicon nitride.

Figure 8A:
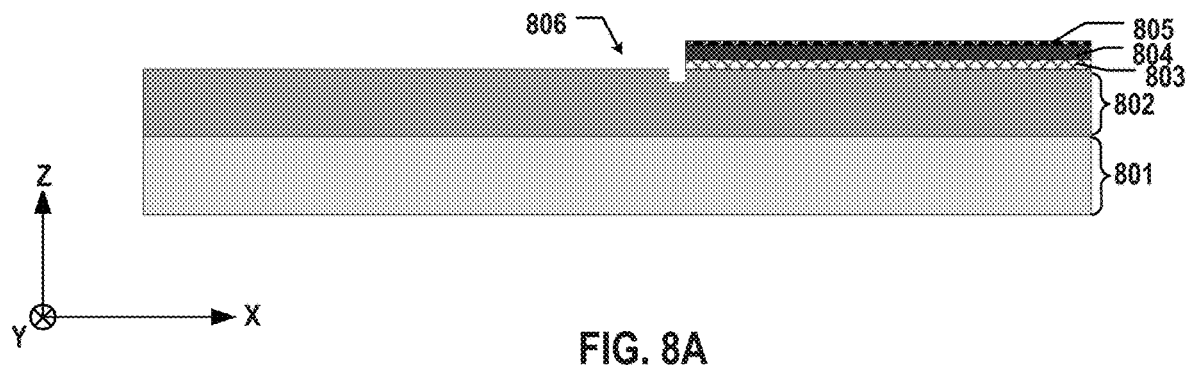
FIGS. 8A-8K illustrate a fabrication process for forming an exemplary 3D memory device with another supporting structure for staircase region, according to some embodiments of the present disclosure.

As illustrated in FIG. 8A, a semiconductor layer 802 is formed on a silicon substrate 801. In some embodiments, semiconductor layer 802 is an N-type doped silicon layer. Semiconductor layer 802 can be an N-well in a P-type silicon substrate 801 and include single crystalline silicon. The N-well can be formed by doping N-type dopant(s), such as P or As, into P-type silicon substrate 801 using ion implantation and/or thermal diffusion. Semiconductor layer 802 can also be an N-type doped polysilicon layer formed by depositing polysilicon on silicon substrate 801 (either P-type or N-type) using one or more thin film deposition processes including, but not limited to, CVD, PVD, ALD, or any combination thereof. In some embodiments, in-situ doping of N-type dopants, such as P or As, is performed when depositing polysilicon to form an N-type doped polysilicon layer.

As illustrated in FIG. 8A, a block layer 803 is formed on semiconductor layer 802. Block layer 803 can be formed by depositing silicon oxide or any other suitable materials different from the materials of semiconductor layer 802 and sacrificial layer 804 using one or more thin film deposition processes including, but not limited to, CVD, PVD, ALD, or any combination thereof. In some embodiments, block layer 803 is formed by thermal oxidation of the top portion of semiconductor layer 802.

As illustrated in FIG. 8A, a sacrificial layer 804 is formed on block layer 803. Sacrificial layer 804 can be formed by depositing polysilicon, silicon nitride, or any other suitable sacrificial material (e.g., carbon) that can be later selectively removed and that is different from the material of block layer 803 using one or more thin film deposition processes including, but not limited to, CVD, PVD, ALD, or any combination thereof. In some embodiments, a block layer 805 is formed on sacrificial layer 804. Block layer 805 can be formed by depositing silicon oxide, silicon oxynitride, or any other suitable materials different from the materials of semiconductor layer 809 and sacrificial layer 804 using one or more thin film deposition processes including, but not limited to, CVD, PVD, ALD, or any combination thereof.

Method 1000 proceeds to operation 1006, as illustrated in FIG. 10, in which part of the first and second block layers and the sacrificial layer are replaced with a supporting structure. In some embodiments, to replace the part of the first block layer and the sacrificial layer with the supporting structure, the part of the first and second block layers and the sacrificial layer is removed to form a trench, and silicon oxide is deposited to fill the trench. In some embodiments, the top surface of the second block layer is flush with the top surface of the supporting structure.

As illustrated in FIG. 8A, a trench 806 extending vertically through sacrificial layer 804 and block layers 803 and 805 are formed using dry etching and/or wet etching, such as ME. The etching of trench 806 can stop at semiconductor layer 802. In some embodiments, part of trench 806 in contact with the remainder of sacrificial layer 804 and block layers 803 and 805 extends further into the top portion of semiconductor layer 802, i.e., having a depth greater than the remainder of trench 806.

Figure 8B:
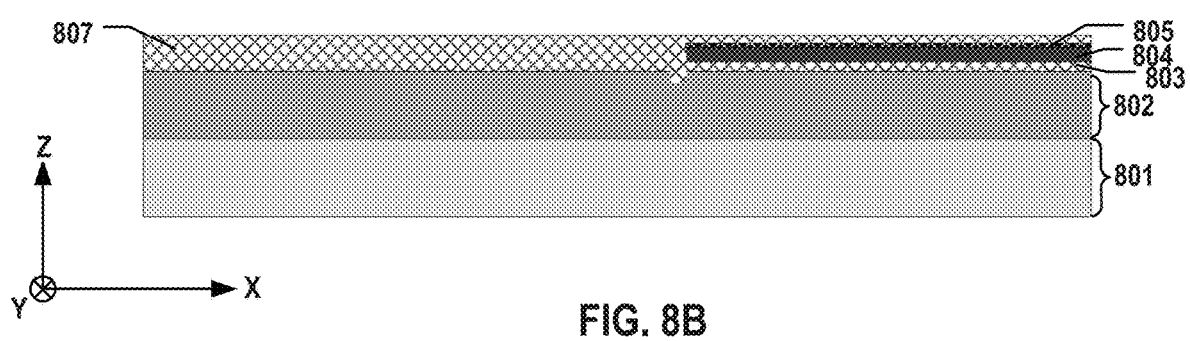

As illustrated in FIG. 8B, a silicon oxide layer 807, or any other material of block layer 803, is deposited using one or more thin film deposition processes including, but not limited to, CVD, PVD, ALD, or any combination thereof, on block layer 805 and to fill trench 806 (shown in FIG. 8A). A CMP or any other suitable planarization process can then be performed to remove excess silicon oxide layer 807 on block layer 805, leaving a supporting structure 808 extending vertically through sacrificial layer 804 and block layers 803 and 805. The top surface of supporting structure 808 can be flush with second block layer 805. Supporting structure 808 is connected to block layer 803, according to some embodiments.

Figure 8C:
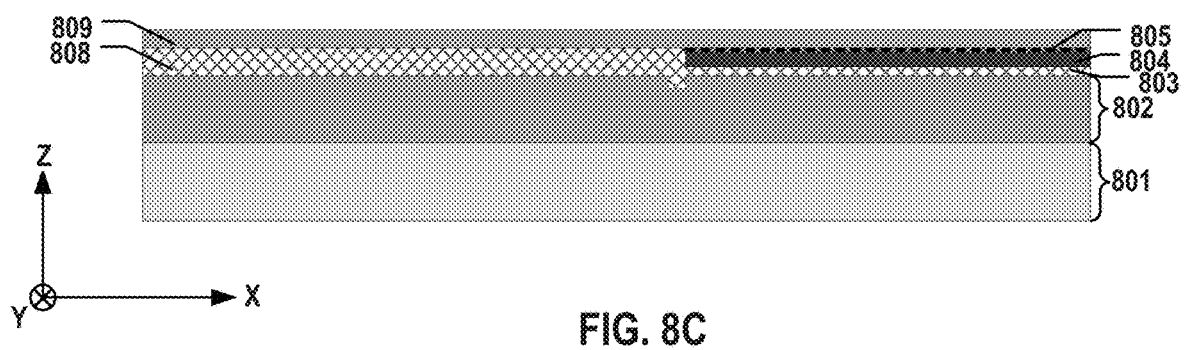

Method 1000 proceeds to operation 1008, as illustrated in FIG. 10, in which a third semiconductor layer is formed on the second block layer and the supporting structure. As illustrated in FIG. 8C, semiconductor layer 809 is formed on block layer 805 and supporting structure 808. In some embodiments, semiconductor layer 809 is an N-type doped silicon layer. Semiconductor layer 809 can be an N-type doped polysilicon layer formed by depositing polysilicon on block layer 805 and supporting structure 808 using one or more thin film deposition processes including, but not limited to, CVD, PVD, ALD, or any combination thereof. In some embodiments, in-situ doping of N-type dopants, such as P or As, is performed when depositing polysilicon to form an N-type doped polysilicon layer.

Method 1000 proceeds to operation 1010, as illustrated in FIG. 10, in which a dielectric stack above the supporting structure and a remainder of the sacrificial layer and having a staircase region is formed, such that the supporting structure overlaps the staircase region of the dielectric stack. The dielectric stack can include interleaved stack sacrificial layers and stack dielectric layers.

Figure 8D:
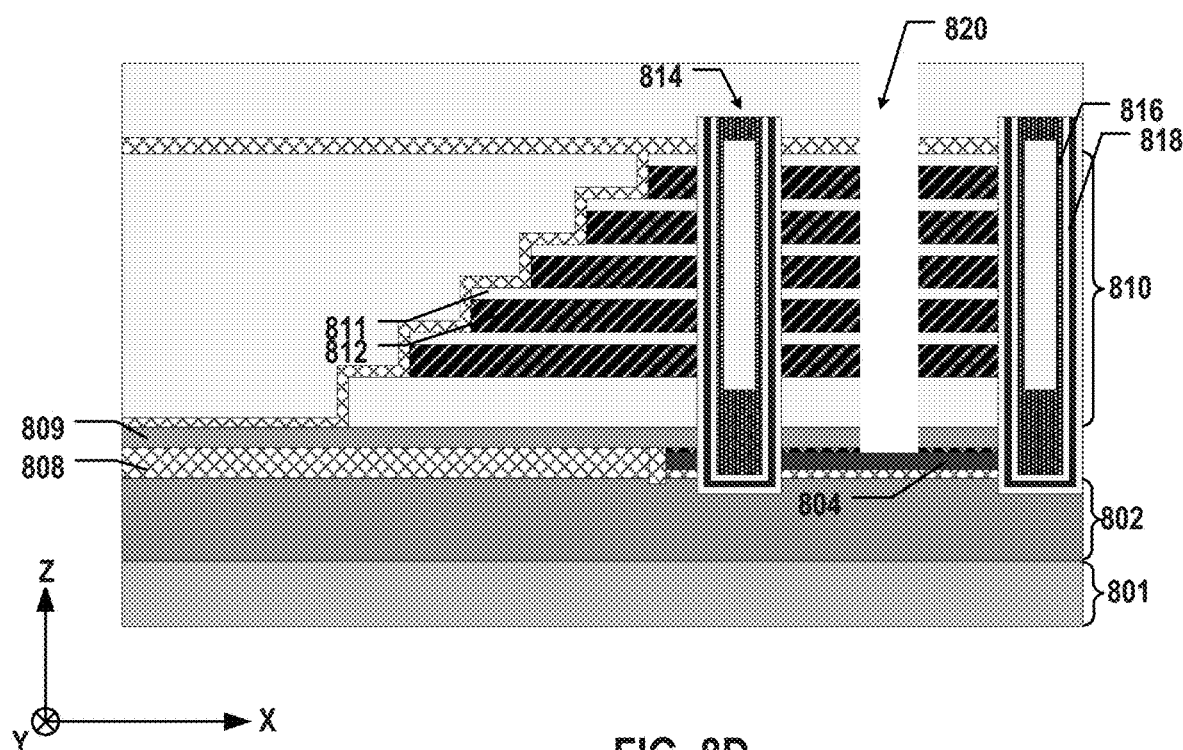

As illustrated in FIG. 8D, a dielectric stack 810 including a plurality pairs of a first dielectric layer (referred to herein as "stack sacrificial layer" 812) and a second dielectric layer (referred to herein as "stack dielectric layers" 811, together referred to herein as "dielectric layer pairs") is formed on semiconductor layer 809. Dielectric stack 810 includes interleaved stack sacrificial layers 812 and stack dielectric layers 811, according to some embodiments. Stack dielectric layers 811 and stack sacrificial layers 812 can be alternatively deposited on semiconductor layer 809 above sacrificial layer 804 to form dielectric stack 810. Dielectric stack 810 can be formed by one or more thin film deposition processes including, but not limited to, CVD, PVD, ALD, or any combination thereof. As illustrated in FIG. 8D, a staircase structure can be formed on the edge of dielectric stack 810. The staircase structure can be formed by performing a plurality of so-called "trim-etch" cycles to the dielectric layer pairs of dielectric stack 810 toward silicon substrate 801. That is, dielectric stack 810 can include a staircase region in which the staircase structure is formed. In some embodiments, supporting structure 808 is below and overlaps the staircase region of dielectric stack 810, for example, by patterning the staircase structure to be overlapped with supporting structure 808 underneath.

Method 1000 proceeds to operation 1012, as illustrated in FIG. 10, in which a channel structure extending vertically through the dielectric stack, the remainder of the sacrificial layer, and the first and second block layers into the first semiconductor layer is formed. In some embodiments, to form the channel structure, a channel hole extending vertically through the dielectric stack, the remainder of the sacrificial layer, and the first and second block layers into the first semiconductor layer is formed, and a memory film and a semiconductor channel are sequentially formed along a sidewall of the channel hole.

As illustrated in FIG. 8D, a channel hole is an opening extending vertically through dielectric stack 810, semiconductor layer 809, block layer 805, the remainder of sacrificial layer 804, and block layer 803 into semiconductor layer 802. In some embodiments, a plurality of openings are formed, such that each opening becomes the location for growing an individual channel structure 814 in the later process. In some embodiments, fabrication processes for forming the channel hole of channel structure 814 include wet etching and/or dry etching, such as DRIE. In some embodiments, the channel hole of channel structure 814 extends further through the top portion of semiconductor layer 802.

As illustrated in FIG. 8D, a memory film 818 (including a blocking layer, a storage layer, and a tunneling layer) and a semiconductor channel 816 are sequentially formed in this order along sidewalls and the bottom surface of the channel hole. In some embodiments, memory film 818 is first deposited along the sidewalls and bottom surface of the channel hole, and semiconductor channel 816 is then deposited over memory film 818. The blocking layer, storage layer, and tunneling layer can be sequentially deposited in this order using one or more thin film deposition processes, such as ALD, CVD, PVD, any other suitable processes, or any combination thereof, to form memory film 818. Semiconductor channel 816 can then be formed by depositing a semiconductor material, such as polysilicon, over the tunneling layer of memory film 818 using one or more thin film deposition processes, such as ALD, CVD, PVD, any other suitable processes, or any combination thereof. A capping layer can be formed in the channel hole and over semiconductor channel 816 to completely or partially fill the channel hole (e.g., without or with an air gap). A channel plug can then be formed in the top portion of the channel hole. Channel structure 814 is thereby formed through dielectric stack 810, semiconductor layer 809, block layer 805, the remainder of sacrificial layer 804, and block layer 803 into semiconductor layer 802.

Method 1000 proceeds to operation 1014, as illustrated in FIG. 10, in which an opening extending vertically through the dielectric stack is formed to expose part of the remainder of the sacrificial layer. As illustrated in FIG. 8D, a slit 820 is an opening that extends vertically through dielectric stack 810 and semiconductor layer 809, stopping at block layer 805. In some embodiments, fabrication processes for forming slit 820 include wet etching and/or dry etching, such as DRIE. Block layer 805 can function as the etch stop layer in etching slit 820. Part of block layer 805 can be further removed using wet etching or dry etching to expose part of the remainder of sacrificial layer 804.

Method 1000 proceeds to operation 1016, as illustrated in FIG. 10, in which the remainder of the sacrificial layer is replaced, through the opening, with a second semiconductor layer coplanar with the supporting structure. In some embodiments, to replace the remainder of the sacrificial layer with the second semiconductor layer, the remainder of the sacrificial layer is removed, through the opening, to form a cavity, and doped polysilicon is deposited, through the opening, into the cavity to form the second semiconductor layer. In some embodiments, to replace the replacing the remainder of the sacrificial layer with the second semiconductor layer, part of the memory film is removed, through the opening, to expose part of the semiconductor channel along the sidewall of the channel hole, such that the second semiconductor layer is in contact with the exposed part of the semiconductor channel. In some embodiments, after replacing the remainder of the sacrificial layer with the second semiconductor layer, the dielectric stack is replaced with a memory stack through the opening, for example, using the so-called "gate replacement" process. In some embodiments, to replace the dielectric stack with the memory stack, the stack sacrificial layers are replaced with stack conductive layers through the opening. In some embodiments, the memory stack includes interleaved stack conductive layers and stack dielectric layers.

Figure 8E:
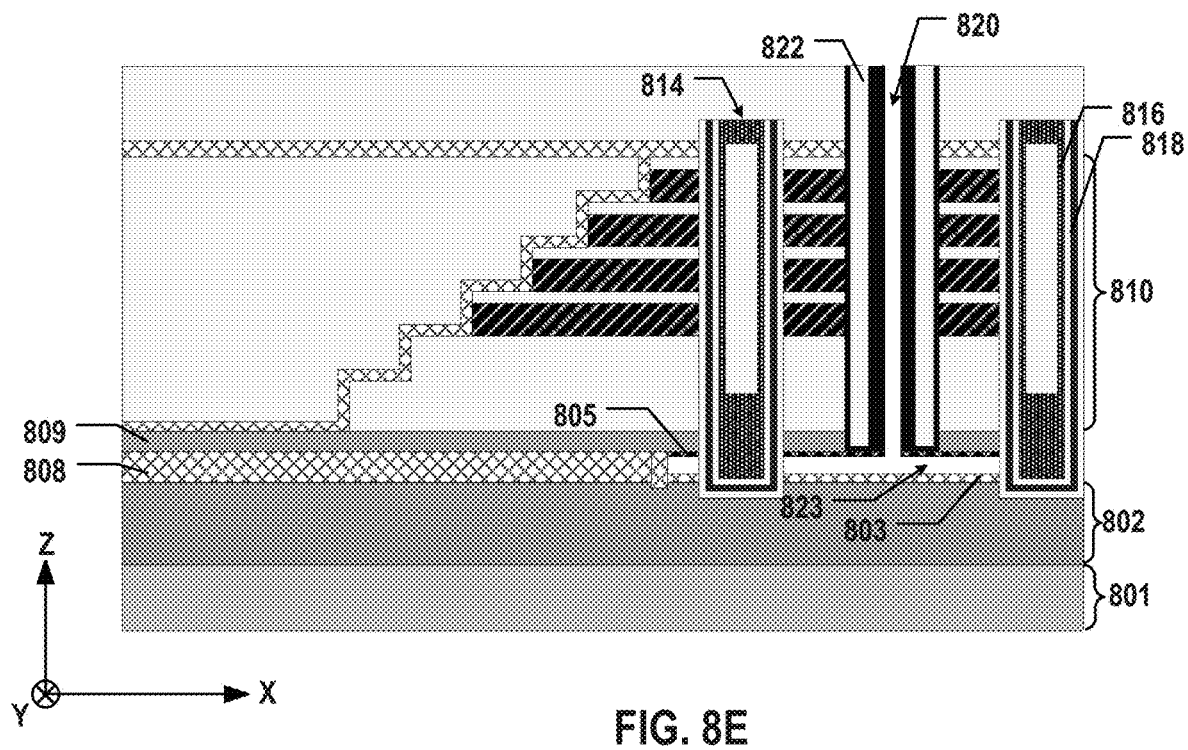

As illustrated in FIG. 8E, the remainder of sacrificial layer 804 (shown in FIG. 8D) is removed by wet etching and/or dry etching to form a cavity 823. In some embodiments, sacrificial layer 804 includes polysilicon or silicon nitride, which can be etched by applying TMAH etchant or phosphoric acid etchant through slit 820, which can be stopped at supporting structure 807 as well as at block layer 803 vertically between sacrificial layer 804 and semiconductor layer 802. In some embodiment, the etching of sacrificial layer 804 is also stopped at block layer 805 vertically between sacrificial layer 804 and semiconductor layer 809. That is, the removal of the remainder of sacrificial layer 804 does not affect supporting structure 808 and semiconductor layers 802 and 809, according to some embodiments. In some embodiments, prior to the removal of the remainder of sacrificial layer 804, a spacer 822 is formed along the sidewall of slit 820.

Figure 8F:
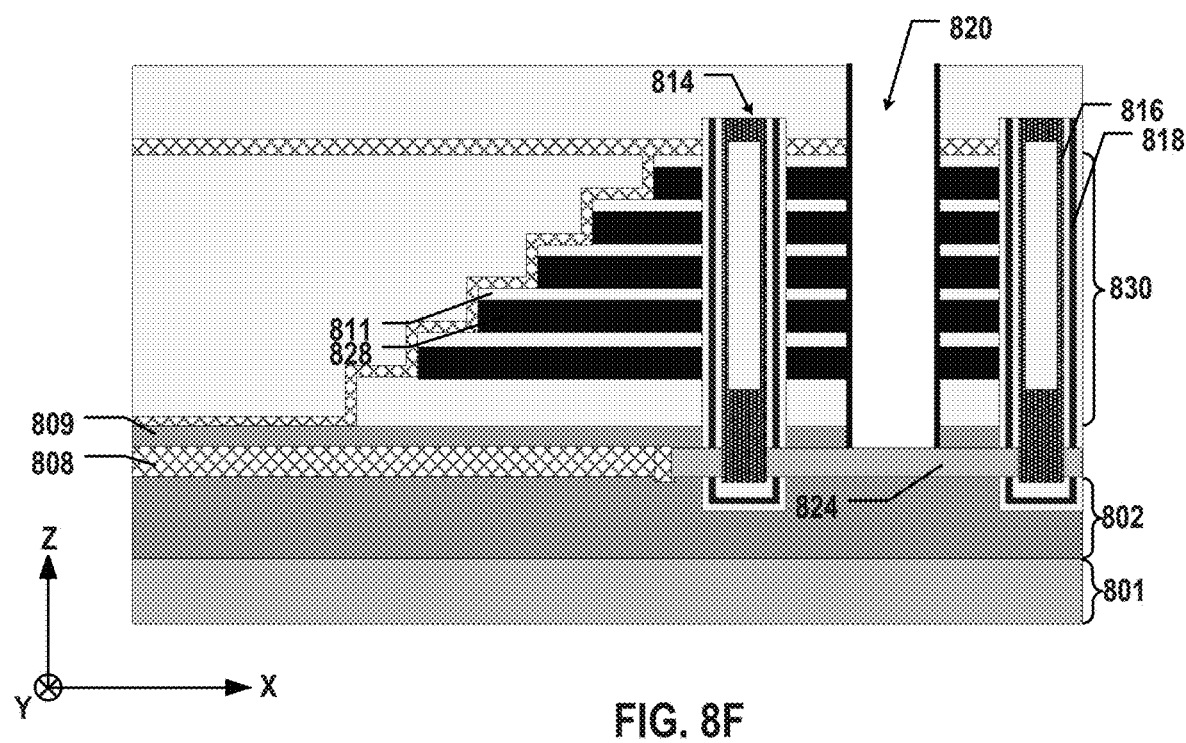

As illustrated in FIG. 8F, part of memory film 818 of channel structure 814 exposed in cavity 823 (shown in FIG. 8E) is removed to expose part of semiconductor channel 816 of channel structure 814 along the sidewall of the channel hole and abutting cavity 823. In some embodiments, parts of the blocking layer (e.g., including silicon oxide), storage layer (e.g., including silicon nitride), and tunneling layer (e.g., including silicon oxide) are etched by applying etchants through slit 820 and cavity 823, for example, phosphoric acid for etching silicon nitride and hydrofluoric acid for etching silicon oxide. The etching can be stopped by semiconductor channel 816 of channel structure 814. Spacer 822 including dielectric materials (shown in FIG. 8E) can also protect dielectric stack 810 from the etching of memory film 818 and can be removed by the etchants in the same step as removing part of memory film 818. Similarly, block layers 803 and 805 exposed in cavity 823 (shown in FIG. 8E) can be removed as well by the same step as removing part of memory film 818.

As illustrated in FIG. 8F, a semiconductor layer 824 is formed above and in contact with semiconductor layer 802. In some embodiments, semiconductor layer 824 is formed by depositing polysilicon into cavity 823 (shown in FIG. 8E) through slit 820 using one or more thin film deposition processes, such as CVD, PVD, ALD, or any combination thereof. In some embodiments, in-situ doping of N-type dopants, such as P or As, is performed when depositing polysilicon to form an N-type doped polysilicon layer as semiconductor layer 824. Semiconductor layer 824 can fill cavity 823 to be in contact with the exposed part of semiconductor channel 816 of channel structure 814 as well as in contact with supporting structure 808. As a result, the remainder of sacrificial layer 804 is thereby replaced with semiconductor layer 824 through slit 820, according to some embodiments.

As illustrated in FIG. 8F, supporting structure 808 coplanar with semiconductor layer 824 remains intact when replacing the remainder of sacrificial layer 804 with semiconductor layer 824. As a result, the support can be kept under the staircase region of dielectric stack 810 to avoid the collapse of dielectric stack 810. Moreover, the dummy channel structures (not shown) extending vertically through the staircase region of dielectric stack 810 and supporting structure 808 also remain intact when etching part of memory film 818 of channel structures 814, thereby further supporting the staircase region of dielectric stack 810 to avoid the collapse of dielectric stack 810.

As illustrated in FIG. 8F, stack sacrificial layers 812 (shown in FIG. 8D) are replaced with stack conductive layers 828, and a memory stack 830 including interleaved stack conductive layers 828 and stack dielectric layers 811 is thereby formed, replacing dielectric stack 810 (shown in FIG. 8E). In some embodiments, lateral recesses (not shown) are first formed by removing stack sacrificial layers 812 through slit 820. In some embodiments, stack sacrificial layers 812 are removed by applying etchants through slit 820, creating the lateral recesses interleaved between stack dielectric layers 811.

Figure 8G:
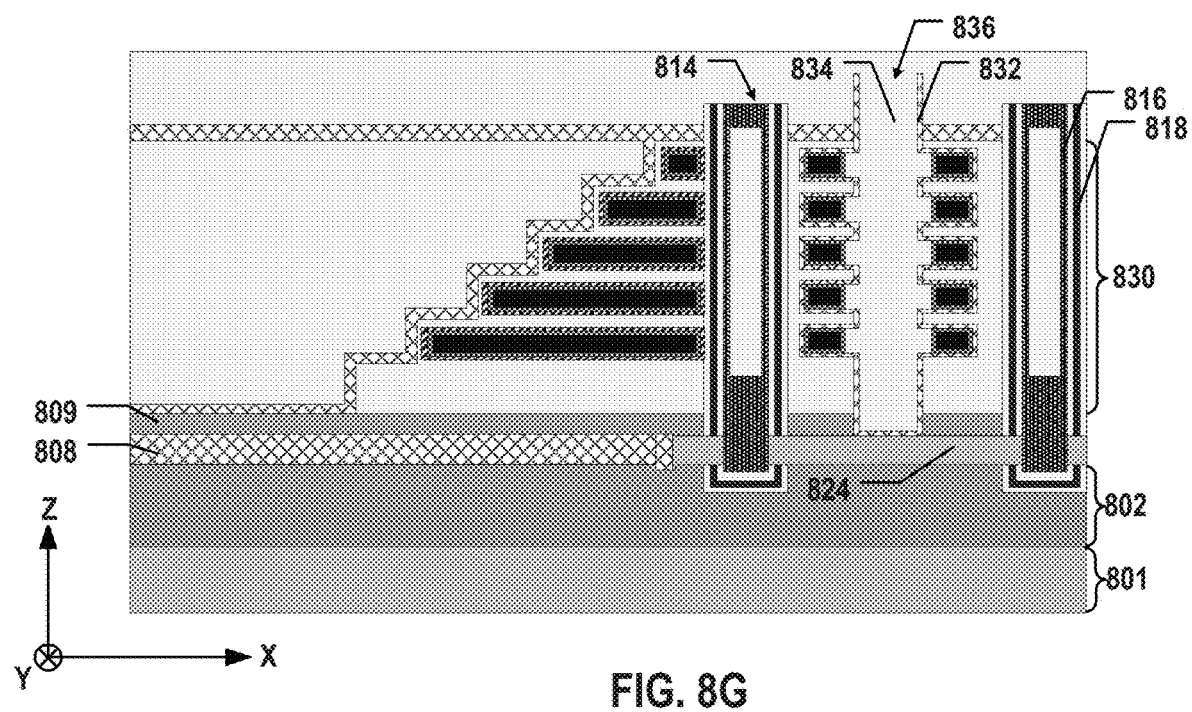

As illustrated in FIG. 8G, stack conductive layers 828 (including gate electrodes and adhesive layers) are deposited into the lateral recesses through slit 820. In some embodiments, a gate dielectric layer 832 is deposited into the lateral recesses prior to stack conductive layers 828, such that stack conductive layers 828 are deposited on the gate dielectric layer. Stack conductive layers 828, such as metal layers, can be deposited using one or more thin film deposition processes, such as ALD, CVD, PVD, any other suitable processes, or any combination thereof. In some embodiments, gate dielectric layer 832, such as a high-k dielectric layer, is formed along the sidewall and at the bottom of slit 820 as well. As a result, channel structure 814 extending vertically through memory stack 830 and semiconductor layers 809 and 824 into semiconductor layer 802 is thereby formed, according to some embodiments.

As illustrated in FIG. 8G, an insulating structure 836 extending vertically through memory stack 830 is formed, stopping on semiconductor layer 824. Insulating structure 836 can be formed by depositing one or more dielectric materials, such as silicon oxide, into slit 820 to fully or partially fill slit 820 (with or without an air gap) using one or more thin film deposition processes, such as ALD, CVD, PVD, any other suitable processes, or any combination thereof. In some embodiments, insulating structure 836 includes gate dielectric layer 832 (e.g., including high-k dielectrics) and a dielectric capping layer 834 (e.g., including silicon oxide).

Figure 8H:
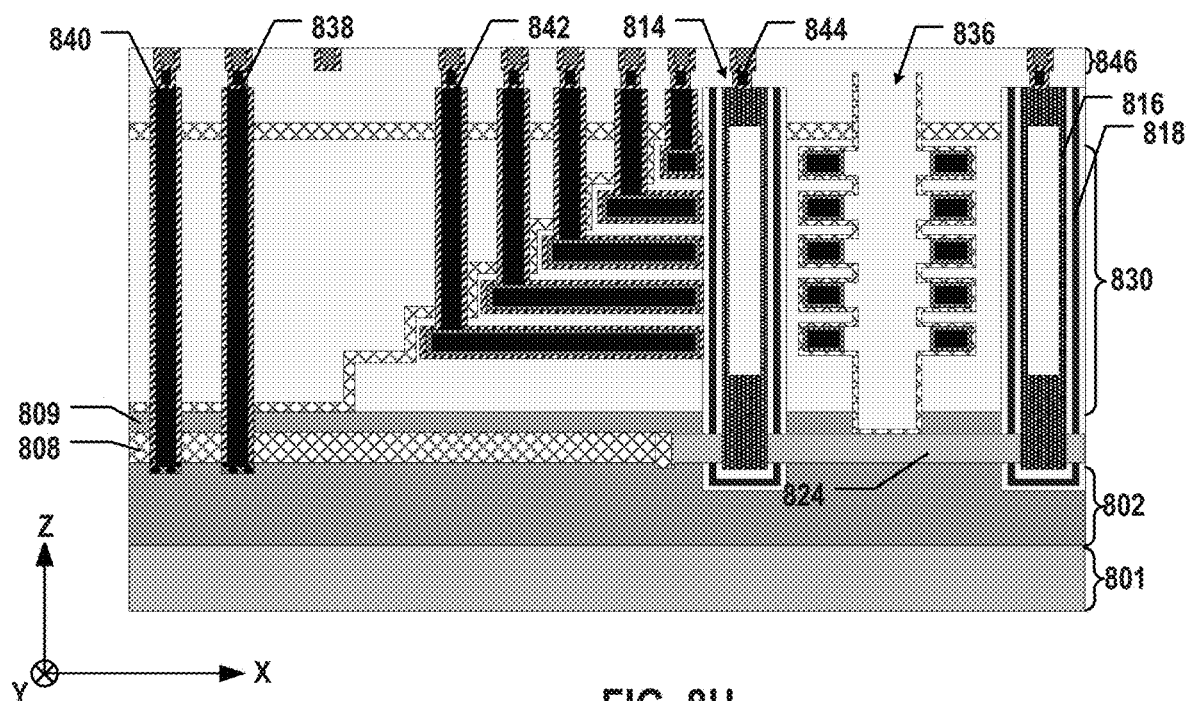

As illustrated in FIG. 8H, after the formation of insulating structure 836, local contacts, including channel local contacts 844 and word line local contacts 842, and peripheral contacts 838 and 840 are formed. A local dielectric layer can be formed on memory stack 830 by depositing dielectric materials, such as silicon oxide or silicon nitride, using one or more thin film deposition processes, such as CVD, PVD, ALD, or any combination thereof, on top of memory stack 830.

Figure 8I:
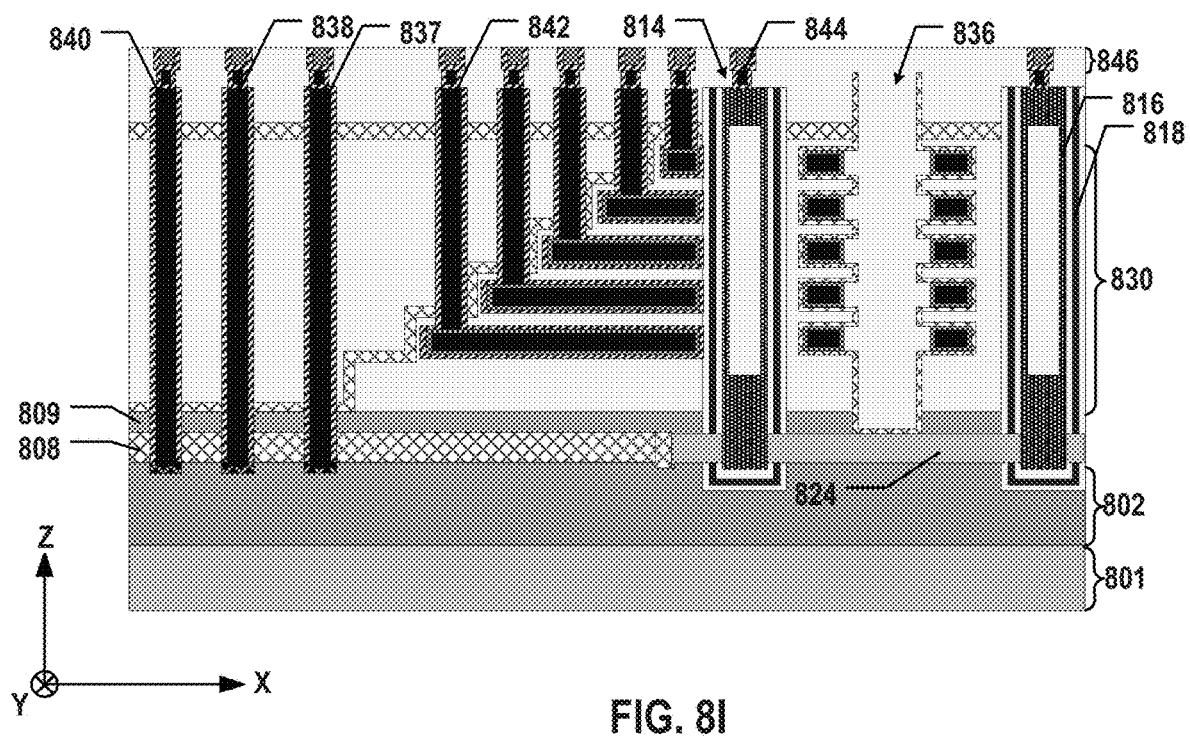
Figure 8J:
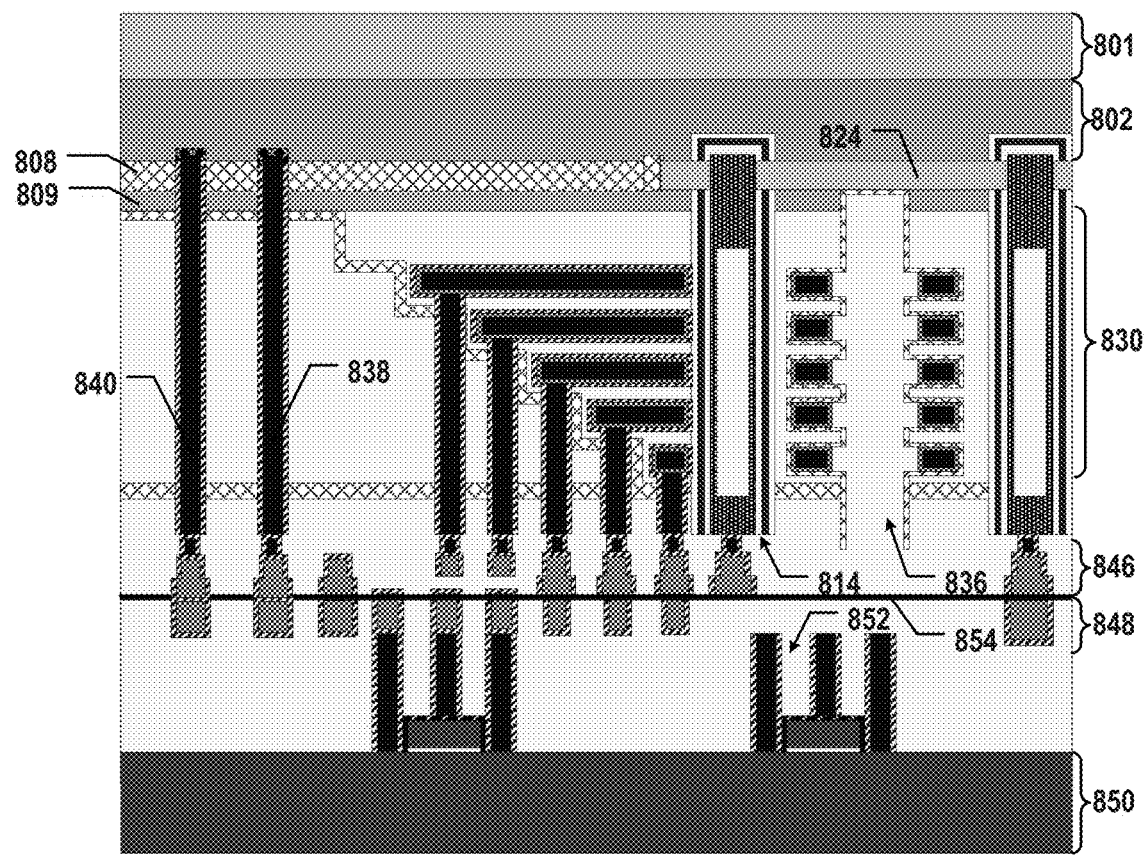

In some embodiments, a source contact above and in contact with the first semiconductor layer is formed. As illustrated in FIG. 8I, in some embodiments, a front side source contact 837 is formed in the same processes for forming word line local contacts 842. Front side source contact 837 can be in contact with semiconductor layer 802 or 809.

As illustrated in FIGS. 8H and 8I, a bonding layer 846 is formed above channel local contacts 844, word line local contacts 842, and peripheral contacts 838 and 840. Bonding layer 846 includes bonding contacts electrically connected to channel local contacts 844, word line local contacts 842, and peripheral contacts 838 and 840. To form bonding layer 846, an ILD layer is deposited using one or more thin film deposition processes, such as CVD, PVD, ALD, or any combination thereof, and the bonding contacts are formed through the ILD layer using wet etching and/or dry etching, e.g., RIE, followed by one or more thin film deposition processes, such as ALD, CVD, PVD, any other suitable processes, or any combination thereof.

Method 1000 proceeds to operation 1018, as illustrated in FIG. 10, in which the first substrate and the second substrate are bonded in a face-to-face manner. The bonding can be hybrid bonding. As illustrated in FIG. 8J, silicon substrate 801 and components formed thereon (e.g., memory stack 830 and channel structures 814 formed therethrough) are flipped upside down. Bonding layer 846 facing down is bonded with bonding layer 848 facing up, i.e., in a face-to-face manner, thereby forming a bonding interface 854 between silicon substrates 801 and 850, according to some embodiments. After the bonding, the bonding contacts in bonding layer 846 and the bonding contacts in bonding layer 848 are aligned and in contact with one another, such that memory stack 830 and channel structures 814 formed therethrough can be electrically connected to peripheral circuits 852 and are above peripheral circuits 852.

In some embodiments, after bonding, the memory stack is above the peripheral circuit. In some embodiments, the second substrate is thinned to expose the first semiconductor layer, and a source contact above and in contact with the first semiconductor layer is formed. In some embodiments, a contact through the first semiconductor layer is formed, and a contact pad above the first semiconductor layer and in contact with the contact is formed.

Figure 8K:
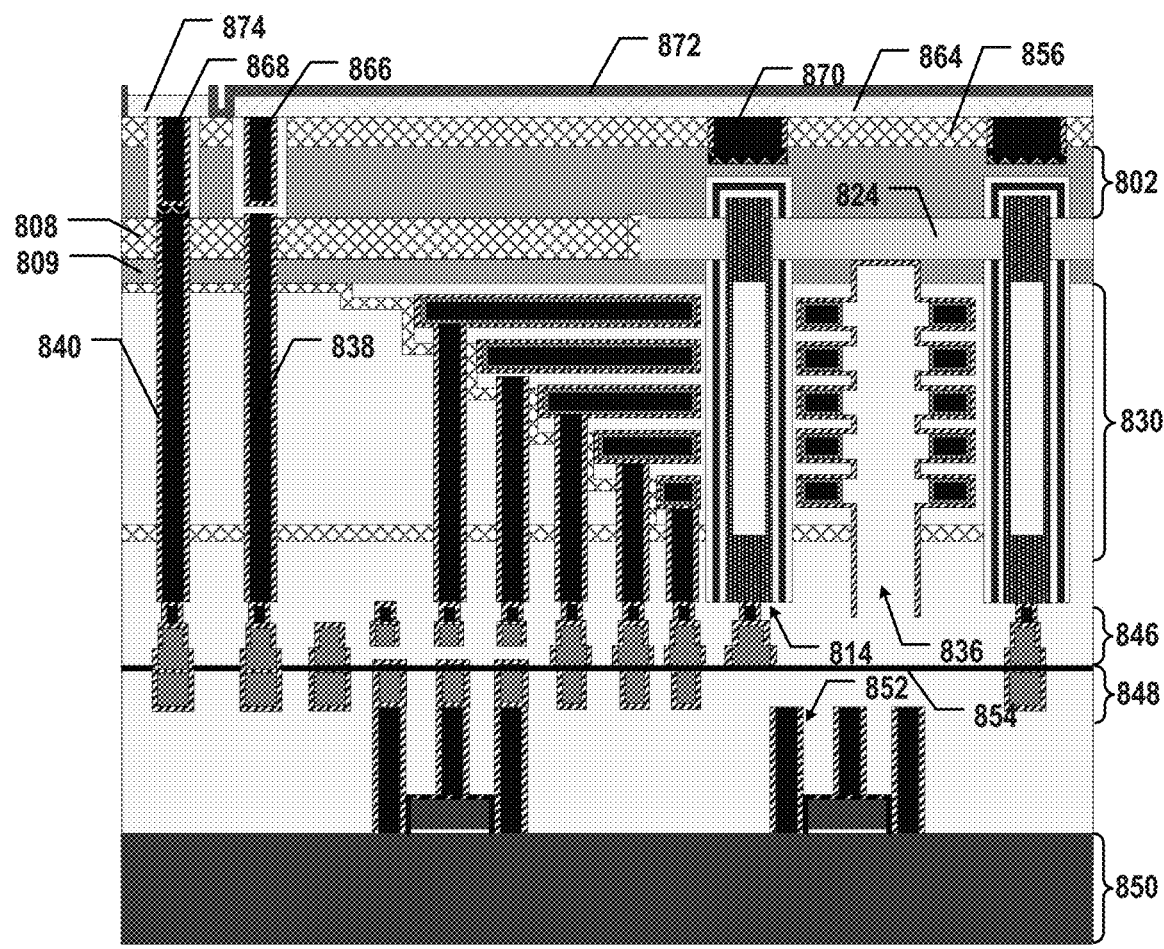

As illustrated in FIG. 8K, silicon substrate 801 (shown in FIG. 8J) is thinned from the backside to expose semiconductor layer 802 using CMP, grinding, dry etching, and/or wet etching. One or more ILD layers 856 can then be formed on semiconductor layer 802 by depositing dielectric materials on semiconductor layer 802 using one or more thin film deposition processes, such as ALD, CVD, PVD, any other suitable processes, or any combination thereof. In some embodiments, backside source contacts 870 are formed on the backside of semiconductor layer 802 and in contact with semiconductor layer 802. In some embodiments, contacts 866 and 868 (e.g., TSCs) extending vertically through ILD layers 856 and semiconductor layer 802 are formed as well. In some embodiments, contacts 866 and 868 are patterned using lithography to be aligned with peripheral contacts 838 and 840, respectively.

As illustrated in FIG. 8K, a redistribution layer 864 is formed above and in contact with source contact 870. In some embodiments, redistribution layer 864 is formed by depositing a conductive material, such as Al, on the top surfaces of semiconductor layer 802 and source contact 870 using one or more thin film deposition processes, such as ALD, CVD, PVD, any other suitable processes, or any combination thereof. As a result, semiconductor layer 824 can be electrically connected to peripheral circuits 852 through semiconductor layer 802, source contact 870, redistribution layer 864, contact 866, peripheral contact 838, and bonding layers 846 and 848. A passivation layer 872 can then be formed on redistribution layer 864. In some embodiments, passivation layer 872 is formed by depositing a dielectric material, such as silicon nitride, using one or more thin film deposition processes, such as ALD, CVD, PVD, any other suitable processes, or any combination thereof. In some embodiments, a contact pad 874 is formed above and in contact with contact 868. In some embodiments, part of passivation layer 872 covering contact 868 is removed by wet etching and dry etching to expose part of redistribution layer 864 underneath to form contact pad 874. As a result, contact pad 874 for pad-out can be electrically connected to peripheral circuits 852 through contact 868, peripheral contact 840, and bonding layers 846 and 848.

Although FIGS. 8J and 8K show that memory stack 830 and channel structures 814 are above peripheral circuits 852 after bonding, it is understood that in some examples, the relative positions of silicon substrates 850 and 801 may be reversed, such that memory stack 830 and channel structures 814 may be below peripheral circuits 852 after bonding. In some embodiments, the first substrate is thinned to form a third semiconductor layer, a contact through the third semiconductor layer is formed, and a contact pad above the third semiconductor layer and in contact with the contact is formed. As illustrated in FIGS. 4C and 4D, semiconductor layer 135 is formed by thinning the substrate on which peripheral circuits 108 are formed, contact 145 is formed through semiconductor layer 135, and contact pad 141 is formed above semiconductor layer 135 and in contact with contact 145.

According to one aspect of the present disclosure, a method for forming a 3D memory device is disclosed. A first semiconductor layer, a first block layer, and a sacrificial layer are sequentially formed on a substrate. A block plug extending vertically through the sacrificial layer and the first block layer is formed to divide the sacrificial layer into a supporting portion and a sacrificial portion. A dielectric stack is formed above the sacrificial layer and has a staircase region, such that the supporting portion of the sacrificial layer is below and overlaps the staircase region of the dielectric stack. A channel structure extending vertically through the dielectric stack, the sacrificial portion of the sacrificial layer, and the first block layer, into the first semiconductor layer is formed. An opening extending vertically through the dielectric stack is formed to expose part of the sacrificial portion of the sacrificial layer. The sacrificial portion of the sacrificial layer is replaced with a second semiconductor layer coplanar with the supporting portion of the sacrificial layer through the opening.

In some embodiments, to replace the sacrificial portion of the sacrificial layer with the second semiconductor layer, the sacrificial portion of the sacrificial layer is removed through the opening to form a cavity, stopping at the block plug and the first block layer, and doped polysilicon is deposited through the opening into the cavity to form the second semiconductor layer.

In some embodiments, to form the channel structure, a channel hole extending vertically through the dielectric stack, the sacrificial portion of the sacrificial layer, and the first block layer, into the first semiconductor layer is formed, and a memory film and a semiconductor channel are sequentially formed along a sidewall of the channel hole.

In some embodiments, to replace the sacrificial portion of the sacrificial layer with the second semiconductor layer, part of the memory film is removed through the opening to expose part of the semiconductor channel along the sidewall of the channel hole, such that the second semiconductor layer is in contact with the exposed part of the semiconductor channel.

In some embodiments, to form the block plug, a dent extending vertically through the sacrificial layer and the first block layer is formed, and silicon oxide is deposited to fill the dent and be connected to the first block layer.

In some embodiments, after forming the sacrificial layer, a second block layer is formed on the sacrificial layer, such that the block plug extends vertically through the second block layer as well, and a third semiconductor layer is formed on the second block layer and the block plug.

In some embodiments, the sacrificial layer includes polysilicon or silicon nitride.

In some embodiments, after replacing the sacrificial portion of the sacrificial layer with the second semiconductor layer, the dielectric stack is replaced with a memory stack through the opening.

According to another aspect of the present disclosure, a method for forming a 3D memory device is disclosed. A first semiconductor layer, a first block layer, and a sacrificial layer are sequentially formed on a substrate. Part of the first block layer and the sacrificial layer is replaced with a supporting structure. A dielectric stack is formed above the supporting structure and a remainder of the sacrificial layer and has a staircase region, such that the supporting structure overlaps the staircase region of the dielectric stack. A channel structure extending vertically through the dielectric stack, the remainder of the sacrificial layer, and the first block layer, into the first semiconductor layer is formed. An opening extending vertically through the dielectric stack is formed to expose part of the remainder of the sacrificial layer. The remainder of the sacrificial layer is replaced with a second semiconductor layer coplanar with the supporting structure through the opening.

In some embodiments, to replace the remainder of the sacrificial layer with the second semiconductor layer, the remainder of the sacrificial layer is removed through the opening to form a cavity, and doped polysilicon is deposited through the opening into the cavity to form the second semiconductor layer.

In some embodiments, to form the channel structure, a channel hole extending vertically through the dielectric stack, the remainder of the sacrificial layer, and the first block layer, into the first semiconductor layer is formed, and a memory film and a semiconductor channel are sequentially formed along a sidewall of the channel hole.

In some embodiments, to replace the remainder of the sacrificial layer with the second semiconductor layer, part of the memory film is removed through the opening to expose part of the semiconductor channel along the sidewall of the channel hole, such that the second semiconductor layer is in contact with the exposed part of the semiconductor channel.

In some embodiments, to replace the part of the first block layer and the sacrificial layer with the supporting structure, the part of the first block layer and the sacrificial layer is removed to form a trench, and silicon oxide is deposited to fill the trench.

In some embodiments, after forming the sacrificial layer, a second block layer is formed on the sacrificial layer, such that a top surface of the second block layer is flush with a top surface of the supporting structure, and a third semiconductor layer is formed on the second block layer and the supporting structure.

In some embodiments, the sacrificial layer includes polysilicon or silicon nitride.

In some embodiments, after replacing the part of the first block layer and the sacrificial layer with the supporting structure, the dielectric stack is replaced with a memory stack through the opening.

According to still another aspect of the present disclosure, a method for forming a 3D memory device is disclosed. A peripheral circuit is formed on a first substrate. A first semiconductor layer is formed on a second substrate. A supporting structure and a second semiconductor layer coplanar with the supporting structure are formed on the first semiconductor layer. A memory stack is formed above the supporting structure and the second semiconductor layer. The memory stack has a staircase region overlapping the supporting structure. A channel structure extending vertically through the memory stack and the second semiconductor layer into the first semiconductor layer is formed. The first substrate and the second substrate are bonded in a face-to-face manner.

In some embodiments, to form the supporting structure and the second semiconductor layer, a block layer is formed on the first semiconductor layer, and a sacrificial layer is formed on the block layer, a block plug extending vertically through the sacrificial layer and the block layer is formed to divide the sacrificial layer into a supporting portion and a sacrificial portion, and the sacrificial portion of the sacrificial layer is replaced with the second semiconductor layer.

In some embodiments, to form the block plug, a dent extending vertically through the sacrificial layer and the block layer is formed, and silicon oxide is deposited to fill the dent and be connected to the block layer.

In some embodiments, to form the supporting structure and the second semiconductor layer, a block layer is formed on the first semiconductor layer, and a sacrificial layer is formed on the block layer, part of the block layer and the sacrificial layer is replaced with the supporting structure, and a remainder of the sacrificial layer is replaced with the second semiconductor layer.

In some embodiments, to replace the part of the block layer and the sacrificial layer with the supporting structure, the part of the block layer and the sacrificial layer is removed to form a trench, and silicon oxide is deposited to fill the trench.

In some embodiments, after the bonding, the second substrate is thinned to expose the first semiconductor layer, and a source contact is formed above and in contact with the first semiconductor layer.

In some embodiments, prior to bonding, a source contact is formed above and in contact with the first semiconductor layer.

In some embodiments, after bonding, the memory stack is above the peripheral circuit, the second substrate is thinned to expose the first semiconductor layer, a contact is formed through the first semiconductor layer, and a contact pad is formed above the first semiconductor layer and in contact with the contact.

In some embodiments, after bonding, the memory stack is below the peripheral circuit, the first substrate is thinned to form a third semiconductor layer, a contact is formed through the third semiconductor layer, and a contact pad is formed above the third semiconductor layer and in contact with the contact.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:
1. A method for forming a three-dimensional (3D) memory device, comprising:
   sequentially forming a first semiconductor layer, a first block layer, and a sacrificial layer on a substrate;

forming a block plug extending vertically through the sacrificial layer and the first block layer to divide the sacrificial layer into a supporting portion and a sacrificial portion;

forming a dielectric stack above the sacrificial layer and having a staircase region, such that the supporting portion of the sacrificial layer is below and overlaps the staircase region of the dielectric stack;

forming a channel structure extending vertically through the dielectric stack, the sacrificial portion of the sacrificial layer, and the first block layer, into the first semiconductor layer;

forming an opening extending vertically through the dielectric stack to expose part of the sacrificial portion of the sacrificial layer; and replacing, through the opening, the sacrificial portion of the sacrificial layer with a second semiconductor layer coplanar with the supporting portion of the sacrificial layer.

2. The method of claim 1, wherein replacing the sacrificial portion of the sacrificial layer with the second semiconductor layer comprises:

removing, through the opening, the sacrificial portion of the sacrificial layer to form a cavity, stopping at the block plug and the first block layer; and depositing, through the opening, doped polysilicon into the cavity to form the second semiconductor layer.

3. The method of claim 2, wherein forming the channel structure comprises:

forming a channel hole extending vertically through the dielectric stack, the sacrificial portion of the sacrificial layer, and the first block layer, into the first semiconductor layer; and sequentially forming a memory film and a semiconductor channel along a sidewall of the channel hole.

4. The method of claim 3, wherein replacing the sacrificial portion of the sacrificial layer with the second semiconductor layer further comprises removing, through the opening, part of the memory film to expose part of the semiconductor channel along the sidewall of the channel hole, such that the second semiconductor layer is in contact with the exposed part of the semiconductor channel.

5. The method of claim 1, wherein forming the block plug comprises:

forming a dent extending vertically through the sacrificial layer and the first block layer; and depositing silicon oxide to fill the dent and be connected to the first block layer.

6. The method of claim 1, further comprising:

after forming the sacrificial layer, forming a second block layer on the sacrificial layer, such that the block plug extends vertically through the second block layer as well; and forming a third semiconductor layer on the second block layer and the block plug.

7. The method of claim 1, wherein the sacrificial layer comprises polysilicon or silicon nitride.

8. The method of claim 1, further comprising, after replacing the sacrificial portion of the sacrificial layer with the second semiconductor layer, replacing, through the opening, the dielectric stack with a memory stack.

9. A method for forming a three-dimensional (3D) memory device, comprising:

sequentially forming a first semiconductor layer, a first block layer, and a sacrificial layer on a substrate;

replacing part of the first block layer and the sacrificial layer with a supporting structure;

forming a dielectric stack above the supporting structure and a remainder of the sacrificial layer and having a staircase region, such that the supporting structure overlaps the staircase region of the dielectric stack;

forming a channel structure extending vertically through the dielectric stack, the remainder of the sacrificial layer, and the first block layer, into the first semiconductor layer;

forming an opening extending vertically through the dielectric stack to expose part of the remainder of the sacrificial layer; and replacing, through the opening, the remainder of the sacrificial layer with a second semiconductor layer coplanar with the supporting structure.

10. The method of claim 9, wherein replacing the remainder of the sacrificial layer with the second semiconductor layer comprises:

removing, through the opening, the remainder of the sacrificial layer to form a cavity; and depositing, through the opening, doped polysilicon into the cavity to form the second semiconductor layer.

11. The method of claim 9, wherein replacing the part of the first block layer and the sacrificial layer with the supporting structure comprises:

removing the part of the first block layer and the sacrificial layer to form a trench; and depositing silicon oxide to fill the trench.

12. The method of claim 9, further comprising:

after forming the sacrificial layer, forming a second block layer on the sacrificial layer, such that a top surface of the second block layer is flush with a top surface of the supporting structure; and forming a third semiconductor layer on the second block layer and the supporting structure.

13. The method of claim 9, further comprising after replacing the part of the first block layer and the sacrificial layer with the supporting structure, replacing, through the opening, the dielectric stack with a memory stack.

14. A method for forming a three-dimensional (3D) memory device, comprising:

forming a peripheral circuit on a first substrate;

forming a first semiconductor layer on a second substrate;

forming a supporting structure and a second semiconductor layer coplanar with the supporting structure on the first semiconductor layer;

forming a memory stack above the supporting structure and the second semiconductor layer, the memory stack having a staircase region overlapping the supporting structure;

forming a channel structure extending vertically through the memory stack and the second semiconductor layer into the first semiconductor layer; and bonding the first substrate and the second substrate in a face-to-face manner.

15. The method of claim 14, wherein forming the supporting structure and the second semiconductor layer comprises:

forming a block layer on the first semiconductor layer and a sacrificial layer on the block layer;

forming a block plug extending vertically through the sacrificial layer and the block layer to divide the sacrificial layer into a supporting portion and a sacrificial portion; and replacing the sacrificial portion of the sacrificial layer with the second semiconductor layer.

16. The method of claim 14, wherein forming the supporting structure and the second semiconductor layer comprises:
- forming a block layer on the first semiconductor layer and a sacrificial layer on the block layer;
- replacing part of the block layer and the sacrificial layer with the supporting structure; and
- replacing a remainder of the sacrificial layer with the second semiconductor layer.

17. The method of claim 14, further comprising, after bonding:
- thinning the second substrate to expose the first semiconductor layer; and
- forming a source contact above and in contact with the first semiconductor layer.

18. The method of claim 14, further comprising, prior to bonding, forming a source contact above and in contact with the first semiconductor layer.

19. The method of claim 14, wherein, after bonding, the memory stack is above the peripheral circuit, the method further comprising:
- thinning the second substrate to expose the first semiconductor layer; and
- forming a contact through the first semiconductor layer, and a contact pad above the first semiconductor layer and in contact with the contact.

20. The method of claim 14, wherein after bonding, the memory stack is below the peripheral circuit, the method further comprising:
- thinning the first substrate to form a third semiconductor layer; and
- forming a contact through the third semiconductor layer, and a contact pad above the third semiconductor layer and in contact with the contact.

* * * * *